(12) United States Patent
Hirairi

(10) Patent No.: US 6,374,393 B1
(45) Date of Patent: Apr. 16, 2002

(54) LOGIC CIRCUIT EVALUATION USING SENSING LATCH LOGIC

(75) Inventor: Koji Hirairi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/514,256

(22) Filed: Feb. 28, 2000

(30) Foreign Application Priority Data

Dec. 22, 1999 (JP) .......................................... 11-365664

(51) Int. Cl.[7] .............................................. G06F 17/50
(52) U.S. Cl. ........................................................ 716/8
(58) Field of Search ................................ 716/2, 4, 6, 8, 716/10, 18

(56) References Cited

PUBLICATIONS

Somasekhar D. et al.: "Differential Current Switch Logic: A Low Power DCVS Logic Family" IEEE Journal of Solid–State Circuits, US, IEEE Inc., New York, vol. 31, No. 7, Jul. 1, 1996, pp. 981–991, XP000632385 ISSN: 0018–9200.

*Primary Examiner*—Matthew Smith
*Assistant Examiner*—Thuan Do
(74) *Attorney, Agent, or Firm*—Ronald p. Kananen; Rader, Fishman & Grauer, PLLC

(57) ABSTRACT

A logic circuit including a logic circuit portion comprised of a dual-rail type logic tree, a synchronization type sensing latch means comprised of a sense amplifier for differentially amplifying results of evaluation of the logic circuit portion in synchronization with a clock, a logic tree disconnection controlling circuit, and a group of switches for disconnection of the logic tree, and a set and reset latch means for holding a logic for one cycle of the synchronization signal, wherein, in an idle stage, the sense amplifier is deactivated, the dual-rail type logic tree unit and sensing latch are connected, and the output terminals of the dual-rail type logic tree are short-circuited, wherein, in the drive stage, the sense amplifier is activated and the output terminals of the dual-rail logic tree are opened, and wherein, in the final determination stage, the sense amplifier is activated and the logic tree and sensing latch unit are disconnected so as to eliminate the glitches to reduce the power consumption and increase the speed.

24 Claims, 29 Drawing Sheets

DEFINITION STAGE

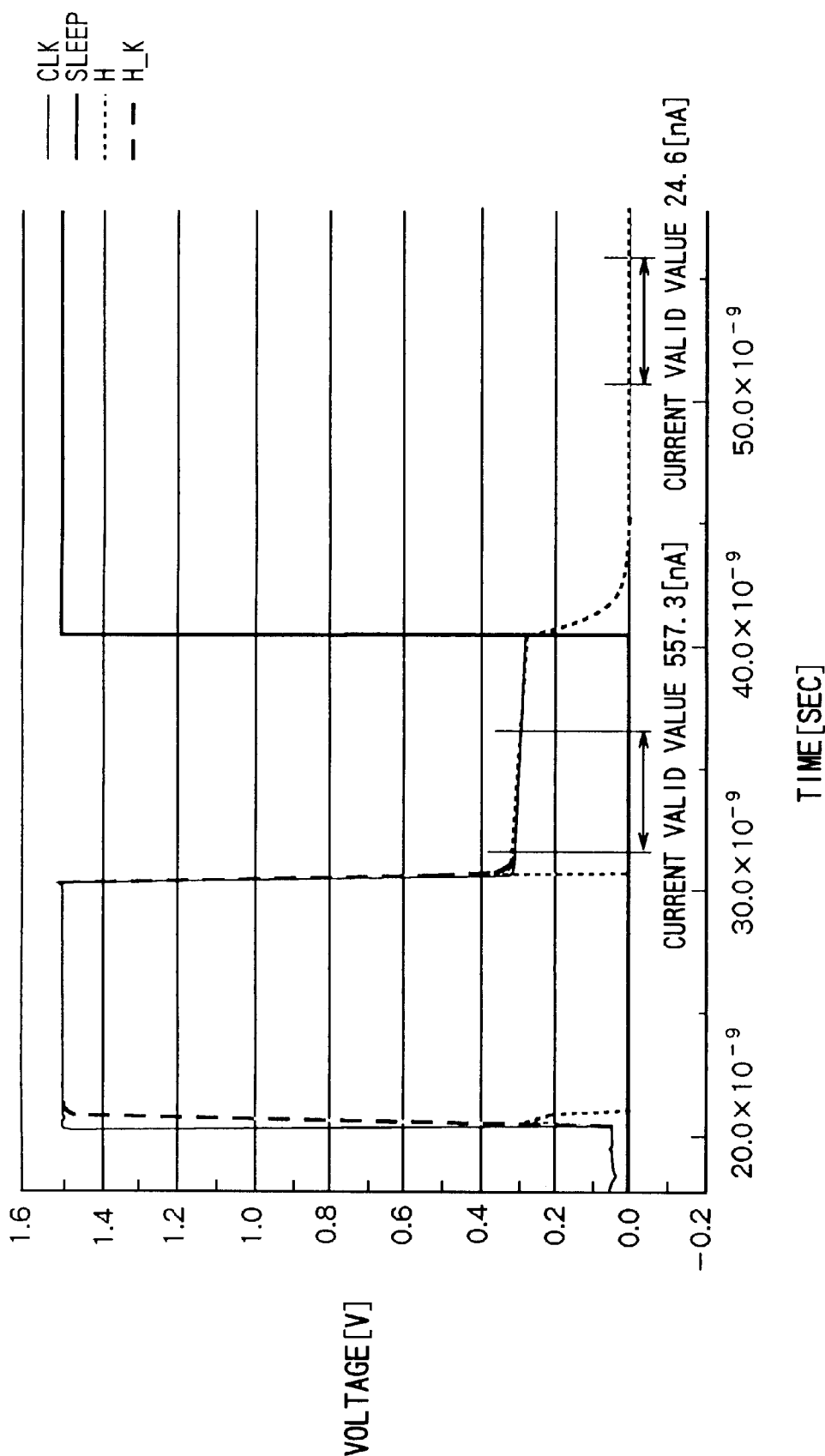

LOGIC CIRCUIT EVALUATION USING SENSING LATCH LOGIC

BACKGROUND OF THE INVENTION

1. Field of the Invention

The present invention relates to a logic circuit in a CMOS semiconductor integrated circuit etc., more particularly relates to a logic circuit serving as a flip-flop with an embedded logic function combining the functions of a 1-bit storage element operating in synchronization with a synchronization signal, that is, a flip-flop, and several logic gates located at its data input packaged into one unit.

2. Description of the Related Art

An integrated circuit generally performs a logical operation by a combination of logic gates and stores the results thereof in a flip-flop for use for the operation of the next cycle.

For example, structures very common in integrated circuits such as sequential circuits and pipelines are also configured by flip-flops and one or more logic gates arranged at the data input thereof.

Below, an explanation will be made of first to fourth conventional examples of a circuit comprised of a flip-flop and one or more logic gates arranged at the data input thereof.

First Conventional Example

FIG. 1 is a view of a first conventional example realizing a general structure of a flip-flop and logic gates arranged at the data input thereof by a static CMOS logic circuit 10.

As shown in FIG. 1, the desired logical function is realized by a combinational logic circuit LC11. A logical function output F11 thereof is supplied to a data input D of a flip-flop FF11.

In the flip-flop FF11, a value of the input D is fetched in synchronization with a synchronization signal CLK and output from a data output Q.

FIG. 2 is a circuit diagram of a transistor level of the flip-flop FF11.

The flip-flop FF11 shown in FIG. 2 is based on a master-slave type flip-flop using a CMOS transmission gate disclosed in John P. Uyemura, *CMOS LOGIC Circuit Design*, Kluwer Academic Publishers, pp. 278–281, 1999 and is being generally used at the present.

Specifically, the flip-flop FF11 of FIG. 2 has inverters INV11 to INV18 and CMOS transmission gates TMG11 and TMG12.

Further, FIG. 3 is a circuit diagram of an example of the configuration of the combinational logic circuit LC11.

This logic circuit LC11 has a 2-input exclusive OR gate (EXOR) ER11, a 2-input exclusive negative OR gate (EXNOR) ENR11, and a 2-input NAND gate NA11.

A logic circuit LC1 of FIG. 3 shows a case where the logical function F=A(+){(B(+)C)·D} is realized.

Second Conventional Example

Further, the idea itself of combining the functions of a flip-flop and several logic gates located at its data input into one package has been already disclosed.

As a first example thereof, there is a PDN (pull down network) mounted type flip-flop of the AMD Co. (below, simply referred to as a "PDN-F/F") (refer to Steven Hesley et al., "A 7th-Generation x86 Microprocessor", *ISSCC DIgest of Technical Papers*, pp. 92–93, February 1999, or Alisa Scherer et al., "An Out-of-Order Three-Way Super-scalar Multimedia Floating-Point", *ISSCC Digest of Technical Papers*, pp. 282–283, February 1999).

FIG. 4 is a circuit diagram of the general configuration of a PDN-F/F, and FIG. 5 is a circuit diagram of a concrete example of the configuration of a PDN-F/F logic circuit mounting a logical function of one multiplexer.

The PDN-F/F logic circuit 20 is configured by a dynamic circuit unit 21 comprising p-channel MOS (PMOS) transistors PT21 and PT22 and n-channel MOS (NMOS) transistors NT11 to NN13 and by a static circuit unit 22 comprising inverters INV21 and INV22 with inputs and outputs connected with each other and configuring a latch and an output use inverter INV23.

PDN is an abbreviation of a "pull down network" as mentioned above and is what is generally referred to as an NMOS single-rail type logic tree 23.

In this system, the dynamic circuit unit 21 evaluates the logic, and the value thereof is held by the latch of the static circuit unit 22.

The characterizing feature of the PDN-F/F logic circuit 20 resides in that a pulsed clock PCLK to be input to the PMOS transistor PT21 and an NMOS transistor NT21 must be a short width pulse which is generated in synchronization with the rising of the global synchronization signal CLK.

The pulsed clock PCLK is generated by a pulse generator 24 as shown in FIG. 5.

This pulse generator 24 is configured by an inverter INV24 to which a clock inverted signal CLK_X is input, a PMOS transistor PT23 and NMOS transistors NT24 and NT25 connected in series between a supply line of a power source voltage $V_{DD}$ and a ground and having gates to which the output of the inverter INV24 is supplied, a 2-input NAND gate NA21 to which a potential of a connection point of drains of the PMOS transistor PT23 and the NMOS transistor NT24 and an enable signal ENB are input, and a 2-input NOR gate NR21 to which the output of the NAND gate NA21 and the clock inverted signal CLK_X are input.

When the pulsed clock PCLK has a logic "0", an internal node F is initialized to a logic "1".

When the pulsed clock PCLK becomes the logic "1", the logic is evaluated in the logic tree (PDN) 23, and the node F changes. This change is transferred to the latch 22a comprising the inverters INV21 and INV22 through a dynamic inverter configured by the PMOS transistor PT22 and NMOS transistors NT23 and NT24. During this period, the input signal must not change.

The important thing in the PDN-F/F logic circuit 20 is that the time during which the pulsed clock PCLK becomes the logic "0" is precisely controlled.

This time must be the minimum time long enough for a change of the potential of the node F from the logic "1" to the logic "0".

If it is too short, the potential ends up returning to logic "1" again while F does not sufficiently change to the logic "0", so the logic cannot be correctly evaluated. If it is too long, however, the time during which the input signal cannot change becomes long.

As the times during which the input must not change at a time of operation, even in a general flip-flop, there are a set-up time and a hold time. It generally is regarded that a shorter time means better performance.

The time during which the pulsed clock PCLK becomes the logic "1" is directly related to the set-up time and the hold time in the PDN-F/F logic circuit 20, so a shorter width of the pulsed clock PCLK is preferred.

The characterizing feature of the pulse generator 24 shown in FIG. 5 generating the pulsed clock PCLK resides in that an adequate width of the pulsed clock PCLK is obtained by the NMOS transistors NT24 and NT25.

When the PDN, that is, the logic tree 23, becomes three NMOS's in size, that is, if another NMOS transistor is added in series in addition to the NMOS transistors NT24 and NT25, it becomes possible to generate three NMOS's worth of delay in the pulse generator 24.

It is considered that the main object of the PDN-F/F logic circuit 20 resides in the realization of a high speed logic circuit.

In general, a circuit realized by a dynamic logic circuit is higher in speed than one realized by a static logic circuit.

Further, in the PDN-F/F logic circuit 20, the master latch and the logic tree are combined with the aim of shortening the set-up time and the hold time relating to the input terminal of the logical functions.

Third Conventional Example

As a second example of the idea of combining the functions of a flip-flop and several logic gates located at its data input into one package, a sense amplifier-based flip-flop (hereinafter simply referred to as an "SA-F/F") may be mentioned (see Borivoje Nikolic et al., "Sense Amplifier-Based Flip-Flop", *ISSCC Digest of Technical Papers*, pp. 282–283, February 1999 or R. Stephany et al., "A 200 MHZ 32 b 0.5 W CMOS RISC Microprocessor", *ISSCC Digest of Technical Papers*, pp. 238–239, February 1998).

FIG. 6 is a circuit diagram of the general configuration of an SA-F/F logic circuit, while FIG. 7 is a circuit diagram of a concrete example of the configuration of a SA-F/F logic circuit mounting the logical function of one multiplexer.

An SA-F/F logic circuit 30 is configured by an NMOS dual-rail type logic tree 31 including NMOS transistors NT301 to NT316, an NMOS transistor NT31 for controlling the connection of the NMOS dual-rail type logic tree 31 to the ground in synchronization with the clock signal CLK, a sense amplifier 32 configured by PMOS transistors PT31 to PT34, and NMOS transistors NT32 to NT34, and a NAND type SR latch 33 configured by NAND gates NA31 and NA32.

Note that the gate terminal of the NMOS transistor NT34 in the sense amplifier 32 is connected to the supply line of the power source voltage $V_{DD}$ and is always in the ON state.

In the SA-F/F logic circuit 30, when the synchronization signal CLK has the logic "0", the precharging by the PMOS transistors PT31 and PT32 of the sense amplifier 32 is carried out. By this, both of the logic output nodes TH and TH_X with respect to the SR latch 33 become the logic "1" and the outputs thereof are held.

The logic inputs F and F_X by the logic tree 31 are precharged to a voltage lower than the potential of the logic "1" by the amount of the threshold value of the NMOS transistor through the NMOS transistors NT32 and NT33.

At this time, since the NMOS transistor NT31 is out off, a passing-through current does not flow.

When the clock signal CLK becomes the logic "1", the PMOS transistors PT31 and PT32 become OFF, the NMOS transistor NT31 becomes ON, and the logic evaluation is commenced.

According to the input signal, a path through which one of the logic input node TF and TF_X with respect to the sense amplifier 32 reaches the ground is formed in the logic tree 31. Here, it is assumed that this is the logic input node TF side.

In this case, the potential of the logic input node TF quickly drops to the logic "0".

Here, the NMOS transistor NT34 of the sense amplifier 32 is always ON and behaves like a real resistor, therefore the charge at the logic input node TF_X flows to the logic input node TF side through the NMOS transistor NT34.

Accordingly, the potential of the logic input F_X also drops to "0" with a slight delay after the logic input F.

Finally, both of the potentials of the logic inputs F and F_X drop to the potential of the logic "0", but the logic outputs H and H_X do not. Here, it is assumed that H=0 and H_X=1.

When the logic input F first drops to the logic "0", the logic output H also becomes the logic "0" through the NMOS transistor NT32.

However, the logic output node TH_X recovers to the logic "1" after the potential falls a little. This is because since the logic input F drops to the logic "0" slightly earlier, the PMOS transistor PT34 becomes ON and a charge is supplied to the logic output node TH_X. Due to this, the PMOS transistor PT33 and NMOS transistor NT33 cut off, the PMOS transistor PT34 and NMOS transistor NT32 become ON, and a stable paired logic potential state is maintained at the logic output nodes TH and TH_X.

These two logic outputs H and H_X are also the inputs of the SR latch 33, therefore, here, the evaluation result of the logical function is inserted and output to the SR latch 33.

Even if a change occurs in the input signal after this and the path reaching the ground in the logic tree 31 changes from the logic input F to F_X, there is no effect upon the operation.

This is because the NMOS transistor NT33 has already become cut off and the charge of the node TH_X will not flow to the logic input node TF_X side. The path of the ground reaching the logic input node TF_X still only fixes the potential of the node TH at the logic "0" through the NMOS transistors NT34 and NT32.

It is considered that the main object of the SA-F/F logic circuit 30 also resides in the realization of a high speed logic circuit in the same way as the PDN-F/F logic circuit 20.

The SA-F/F logic circuit 30 evaluates a logical function by the dynamic logic circuit in the same way as the PDN-F/F logic circuit and combines a sense amplifier and master latch with the aim of shortening the set-up time and the hold time relating to the input terminal of the logical functions.

Fourth Conventional Example

As a third example of the idea of combining the functions of a flip-flop and several logic gates located at its data input into one package, the differential current switch logic (hereinafter simply referred to as a "DCSL") circuit may be mentioned (see Dinesh Somasekhar et al., "Differential Current Switch Logic: A Low Power DCVS Logic Family", *IEEE JSSC*, vol. 31, no. 7, pp. 981–991, July 1996).

FIG. 8 is a circuit diagram of the general configuration of a DCSL circuit.

A DCSL circuit 40 is configured by, in the same way as the SA-F/F logic circuit 30, an NMOS dual-rail type logic tree portion 41, a sense amplifier unit 42 configured by PMOS transistors PT41 to PT43 and NMOS transistors NT41 to NT45, and a NOR type SR latch 43 configured by NOR gates NR41 and NR42.

In the same document, three types of sense amplifiers (DCSL1, DCSL2, and DCSL3) are proposed (pp. 983, FIGS. 4 to 6). Here, the DCSL3 will be taken up. Further, as in the document, the DCSL itself is a proposal relating to method of configuration of a new dynamic logic circuit, particularly the sense amplifier system, and is not aimed at the realization of a flip-flop with an embedded logical function. However, the same document, pp. 986, FIG. 12 introduces "a Latched DCSL output state" and suggests the realization of a flip-flop with an embedded logical function.

Unlike the SA-F/F logic circuit, in the DCSL (DCSL3) circuit 40, as the initial state of the flip-flop operation, the potentials of the logic outputs H and H_X of the sense amplifier 41 are set in the vicinity of the threshold voltage of the NMOS transistor. The potentials are treated as the logic "0" for the later logic gates referring to them.

In the initial state of the flip-flop operation, the clock inverted signal CLK_X is supplied with the logic "1", the PMOS transistor PT41 cuts off, and the NMOS transistor NT45 becomes ON.

Since the NMOS transistor NT45 becomes ON, the internal nodes TH and TH_X are short-circuited. This means that all of the gate terminals and drain terminals of the NMOS transistors NT41, NT42, NT43, and NT44 are short-circuited.

A MOS transistor in which the gate terminal and the drain terminal are short-circuited behaves equivalently to a diode.

Here, a case where the logic potentials of the nodes TH and TH_X immediately before the clock inverted signal CLK_X becomes the logic "1" are [0,1] will be considered. In this case, a positive charge is stored at the node TH_X.

When the clock inverted signal CLK_X becomes the logic "1" and the short-circuiting by the NMOS transistor NT45 occurs, the charge at the node TH_X starts to flow to the node TH resulting in balanced distribution.

At this time, if the charge does not flow elsewhere, the potentials of the two nodes TH and TH_X become half of the power source voltage $V_{DD}$.

However, as mentioned above, the NMOS transistors NT41, NT42, NT43, and NT44 at this time behave as diodes, therefore the current flows until the potential difference between the two ends of the diode becomes substantially equal to the threshold value of the NMOS transistor.

Specifically, the NMOS transistors NT41 and NT42 pass current to the ground, while the NMOS transistors NT43 and NT44 pass current to the logic output nodes TF and TF_X of the logic tree 41.

In this way, the potentials of the nodes TH and TH_X become substantially equal to the threshold value of the NMOS transistor.

At this time, even if one of the nodes TF and TF_X of the logic tree 41 has a path reaching the ground, there is no outflow of potential from the nodes TH and TH_X.

This is because the voltages added to the gate terminals of the NMOS transistors NT43 and NT44 are in the vicinity of the threshold value of the NMOS transistor and the transistors have cut off.

Accordingly, the potentials at the nodes TF and TF_X become unstable. In most cases, however, they become values near the potential of the logic "0".

The potentials of the nodes TH and TH_X are in the vicinity of the threshold voltage of the NMOS transistor. They are treated as the logic "0", so the NOR type SR latch 443 holds the output thereof.

The clock inverted signal CLK_X becomes the logic "0" (this is equivalent to the rising of the clock signal CLK), and the logic evaluation is commenced.

In this case, the NMOS transistor NT45 cuts off, the short-circuited state heretofore disappears, the PMOS transistor PT41 becomes ON, and the current starts to flow.

Since a voltage in the vicinity of the threshold value of the NMOS transistor has been added to the gate terminals of the PMOS transistors PT42 and PT43, the PMOS transistors PT42 and PT43 start from the ON state.

Accordingly, a charge is supplied to the nodes TH and TH_X through these PMOS transistors PT41, PT42, and PT43.

The NMOS transistors NT43 and NT44 start from the cut-off state since a voltage in the vicinity of the threshold value of the NMOS transistor has been added to the gate terminals (that is, the nodes TH and TH_X).

The charge is supplied to the nodes TH and TH_X, these node potentials rise, and the NMOS transistors NT43 and NT44 weakly start to become ON.

In the same way as the SA-F/F logic circuit, a path reaching the ground is always formed in one of the logic output nodes TF and TF_X of the logic tree by the combination of the input signals. This is assumed to be TF here.

Current flows from the node TH toward the node TF through the NMOS transistor NT43 which weakly starts to become ON. The potential of the node TH which has been starting to rise is dropped to the potential of the complete logic "0".

Since the node TH becomes the potential of the complete logic "0", the PMOS transistor PT43 becomes completely ON, and the NMOS transistors NT42 and NT45 become completely cut off.

For this reason, the node TH_X quickly reaches the potential of the complete logic "1". Further, simultaneously, the PMOS transistor PT42 becomes completely cut off, and the NMOS transistors NT41 and NT43 become completely ON.

By this, the stable paired logic potential state is maintained at the nodes TH and TH_X. The logic outputs H and H_X corresponding to the potentials of these two nodes are also the inputs of the SR latch 43, so the evaluation result of the logical function is inserted and output to the SR latch 43 here.

Even if a change occurs in the input signal thereafter and the path reaching the ground in the logic tree 41 changes from the node TF to TF_X, there is no effect on the operation.

The NMOS transistor NT44 has already become cut off and current will not flow from the node TH_X to the node TF_X. Further, even if the node TF no longer has a path reaching the ground, the NMOS transistor NT41 has become ON and maintains the node TH at the complete logic "0".

One of the objects of the DCSL circuit 40 resides in the realization of a high speed logic circuit in the same way as the SA-F/F logic circuit. Further, simultaneously realizing a reduction in the power consumption has also become one of the major objects.

In the DCSL circuit 40, the current flowing into the logic tree 41 is controlled by the NMOS transistors NT43 and NT44.

As mentioned above, the NMOS transistor at the side which becomes the logic "1" in the process of the logic evaluation becomes cut off.

For this reason, the potentials of the logic output nodes TF and TF_X of the logic tree 41 only slightly rise from the potential of the logic "0". A slight potential amplitude of the logic output nodes TF and TF_X of the logic tree 41 means that the potential amplitude at the node inside the logic tree is further smaller than this.

The power consumption is proportional to a square of the logic amplitude, therefore the power consumption of the logic tree portion is extremely small in comparison with the SA-F/F logic circuit using the same NMOS dual-rail type logic tree.

Further, in the SA-F/F logic circuit, the higher the logic tree, the larger the time up to the final determination of the logic.

In the DCSL circuit, however, the dependency of the logic determination time with respect to the height of the logic tree is small (above document, pp. 989, FIG. 18). This is also because of the fact that the NMOS transistors NT42 and NT44 become cut off before too much current flows into the logic tree 41.

The logic is determined at the sense amplifier 42 side before the logic output nodes TF and TF_X of the logic tree 41 fluctuate that much, therefore the DCSL circuit by nature is resistant to the effect of the height of the logic tree in comparison with the SA-F/F logic circuit in which the nodes of the logic tree largely fluctuate.

However, the circuits of the first to fourth conventional examples mentioned above have the following problems.

Problems of First Conventional Example

One of the problems of the static CMOS logic circuit explained as the first conventional example is the large power consumption due to glitches.

A "glitch" means an incorrect signal transition occurring transitorily at an output node or an intermediate node of the combinational logic circuit.

In the CMOS logic circuit, a power consumption P thereof is given by the following equation where a signal frequency is f, a gate capacity, an interconnection capacity, etc. are C, and a signal amplitude potential is V.

$$P = f \cdot C \cdot V^2 \quad (1)$$

When a glitch occurs, the signal frequency seemingly becomes large, and the power consumption is increased from the relationship of the above (1).

Below, an explanation will be made of factors behind the occurrence of glitches in relation to FIGS. 9A and 9B.

In FIGS. 9A and 9B, it is assumed that initial logic potentials of the input signals A, B, C, and D are "0", "0", "1", and "1", and the logic potential of the logical function output F has been fixed to "1". Further, it is assumed that the transition of the input signal does not occur simultaneously at A, B, C, and D, but occurs in an order of A, B, C, and D as illustrated.

When the input signal A becomes the logic "1", the logical function output F11 of the logic circuit LC11 shifts to the logic "0". Next, when the input signal B becomes the logic "1", the logical function output F11 shifts to the logic "1". Further, when the input signal C becomes the logic "0", the logical function output F11 shifts to the logic "0". Finally, when the input signal D becomes the logic "0", the logical function output F11 shifts to the logic "1".

The signal transition of the logical function output F11 carried out here is the correct evaluation result output according to the change of the input signal at that instant. There is no error contained in individual signal transitions per se.

However, the initial value of the logical function output F11 is "1" and also finally becomes "1", therefore signal transition during this time is not required, so it still should be called an incorrect signal.

Further, a glitch may occur even if the transitions of the input signals simultaneously occur. It is assumed that the logic potentials at the nodes at a time t are represented as A(t)=1. Further, it is assumed that the outputs of the logic gates are determined by the one past input, for example, as follows:

$$R(t) = B(t-1)(+)C(t-1) \quad (2)$$

In equation (2), in the initial state where t=0,
Input signal: A(0)=0, B(0)=0, C(0)=1, D(0)=1,
Intermediate node: R(0)=1, S(0)=0,
Output node: F(0)=1.
When t=1, the input signals shift all together,
Input signal: A(1)=1, B(1)=1, C(1)=0, D(1)=0,
Intermediate node: R(1)=1, S(1)=0,
Output node: F(1)=1.
When t=2,
Input signal: A(2)=1, B(2)=1, C(2)=0, D(2)=0,
Intermediate node: R(2)=1, S(2)=^R(1)·D(1))=1,
Output node: F(2)=^(A(1)(+)S(1))=0.
When t=3,
Input signal: A(3)=1, B(3)=1, C(3)=0, D(3)=0,
Intermediate node: R(3)=1, S(3)=^(R(2)·D(2))=1,
Output node: F(3)=^(A(2)(+)S(2))=0.
After this, it becomes constant. Note that indicates inversion.

As described above, the logical function output F shifts in the manner of 1→0→1. Even if the input signals are simultaneously given, glitches occur.

This is caused due to the difference of the number of the logic gates of the internal portion. The inputs of the circuit as a whole are A, B, C, and D, but the inputs of the logic gate ENR11 itself in FIG. 3 are the input signal A and the output signal S of the logic gate NA11. The change of the signal S occurs after the logic gate ER11 changes due to the change of the input signals B and C, therefore the phases of the changes of the signal A and the signal S do not become equal.

Accordingly, when viewing the inputs of the gates, there are still differences in the signal transitions thereof and as a result glitches may occur.

In examples heretofore, there were no glitches in the input signals. The glitches occurred due to the time difference of the changes of the input signals and the intermediate signals. Such a glitch will be particularly referred to as a "generation glitch".

On the other hand, there is something called a "propagation glitch" produced by a glitch contained in the input signal.

In FIGS. 9A and 9B, when the input signal D=1, the logical function to be realized becomes F11=A(+)B(+)C. Even if two among the three input signals are fixed to certain logic values, if there is a glitch in the remaining one input, a glitch also occurs at the output F11.

For example, when a glitch is generated at A and there is a change of 0→1→0, irrespective of the case where originally A=B=C=0, the output F11 also changes as 0→1→0.

As described above, the factors behind the generation of a glitch are, first, the variation of the transition time of the input signals, second, the variation of the input transitions of individual logic gates due to the delay difference produced inside the combinational logic circuit, and, third, the glitch contained in the input signals.

In all cases where a glitch occurs due to these three factors, the logic circuit outputs the correct logic value according to the input signal at that instant. The logic circuit itself cannot determine that it is outputting an incorrect value at that instant.

To eliminate the first and second factors, the method of inserting a very precise delay element onto the internal signal line for adjustment so that the signal changes with respect to all logic gate inputs of the internal portion become aligned and, to eliminate the third factor, the method of using two signal lines for expressing a 1-bit logic value for determining the logic while judging the validity/invalidity of the signal are being considered.

However, these methods are not practical for the reasons that realization is difficult, the hardware cost is increased, and power ends up being consumed more than the reduction of the glitches.

Therefore, it is in principle difficult to completely eliminate glitches in a general static CMOS logic circuit, which makes this impractical.

Problems of Second Conventional Example

The biggest feature among the characteristic features of the PDN-F/F logic circuit 20 explained as the second conventional example is the mechanism for generating the pulsed clock PCLK (pulse generator 24 in FIG. 3).

In principle, if the number of the serially connected NMOS transistors (height) of the pulse generator 24 is adjusted to match with the height of the PDN, that is, the logic tree 23, the optimum width of the pulsed clock PCLK is obtained.

In actuality, however, even if the heights are the same, the sizes in the lateral direction differ, therefore correct reproduction of the speed of change of the node TF in the PDN inside the pulse generator 24 is impossible. Enlargement of the size in the lateral direction means the enlargement of the junction capacity and the interconnection capacity of the MOS.

Further, when the pulse generator 24 is separated from the body of the PDN-F/F logic circuit 20 as a separate cell, there will also be a metal interconnection passing through the interconnection layer between the pulsed clock output terminal of the pulse generator 24 and the pulsed clock input terminal of the PDN-F/F logic circuit body.

In LSI design, generally the placement and routing of the cells are automatically performed by CAD. At this time, the lengths of the interconnections between cells made by the CAD are not constant. It is also difficult to predict them in advance.

When such a design technique is applied to a PDN-F/F logic circuit, the interconnection length of the pulsed clock PCLK extending from the pulse generator 24 changes for every design. A metal interconnection has a parasitic capacitance and the size thereof is generally proportional to the interconnection length, therefore the load connected to the pulsed clock output terminal of the pulse generator 24 changes for every design.

Whenever the interconnection load changes, the width of the pulsed clock PCLK will always also change. The amplitude of the pulsed clock PCLK is the element directly determining the set-up time and the hold time of the PDN-F/F logic circuit.

Therefore, a PDN-F/F logic circuit will not have a constant set-up time and hold time when the placement and routing are performed by CAD. The set-up time and the hold time are values important in LSI design utilized for timing analysis etc. If the correct values cannot be found before the actual placement and routing, the circuit will never be practical.

On the other hand, when the pulse generator 24 is combined with the PDN-F/F logic circuit to form a single cell, the large size of the circuit of the pulse generator 24 becomes a problem.

An SA-F/F logic circuit does not have anything corresponding to the pulse generator 24, but the logic tree is not a single-rail type, but a double-rail type paired logic tree.

The circuit of the logic tree becomes about twice the size in the case of an SA-F/F logic circuit, but if considering the circuit size of the pulse generator 24, the SA-F/F logic circuit often ends up becoming more compact.

Problems of Third Conventional Example

The problem of the SA-F/F logic circuit 30 explained as the third conventional example is that the time until the final determination of the logic closely depends upon the charge discharging speed of the NMOS logic tree.

The nodes TF and TF_X in FIG. 6 are precharged to potentials lower than the potential of the logic "1" by exactly the amount of the threshold value of the NMOS transistor before the commencement of the logic evaluation.

Together with the commencement of the logic evaluation, the charges are discharged through the NMOS logic tree 31. Both of the potentials of the two nodes TF and TF_X finally become the potential of the logic "0", but one of them always reaches the logic "0" earlier than the other. The node. which becomes the logic "0" earlier is the one related to the final determination of the logic.

The time by which the node reaches the potential of the logic "0" is generally determined by a resistance R of the NMOS transistor on the path reaching the ground and the capacity component C inside the logic tree 31 when simply considering the NMOS transistor which has become ON as a resistor.

Simply speaking, the time for reaching the logic "0" potential is proportional to (total R·total C). When the gate width of the NMOS transistor is Wn and the gate length is Ln, the ON resistance R thereof is proportional to (Ln/Wn).

When the number of transistors on the path from the end point of the logic tree to the ground, that is, the height of the logic tree, is h, it can be considered that the total R is proportional to (h/Wn). Here, in general, Ln is a fixed value determined by the manufacturing process, so is omitted.

The total C includes a diffusion capacitance of the NMOS inside the logic tree 31 etc. and is in a relationship of a monotonic increase with respect to the height h of the logic tree.

Accordingly, the time for final determination of the logic of the SA-F/F logic circuit 30 is generally proportional to the height h of the NMOS logic tree and generally inversely proportional to the gate width Wn.

The height of the logic tree is substantially equal to the number of the input signals of the logical function to be realized. For example, if it is a 5-input EXOR, the height of the logic tree becomes 5.

Therefore, the more complex the logical function (the larger the number of input signals), the longer the time for final determination of the logic of the SA-F/F logic circuit.

When it is intended to reduce the prolongation of the time for final determination of the logic in this way, the gate width Wn of the NMOS transistor inside the logic tree 31 is made larger so as to make the ON resistance R smaller. The NMOS transistor has a capacity component proportional to (Wn·Ln) when seen from the side driving the gate terminal thereof. As mentioned above, the power consumption is proportional to the capacity component of the system.

Therefore, in an SA-F/F logic circuit 30, an increase of speed and a reduction of the power consumption cannot be achieved simultaneously.

Problems of Fourth Conventional Example The DCSL circuit 40 explained as the fourth conventional example is remarkably susceptible to fluctuations in the circuit constants, noise, etc. as pointed out by itself in the above reference.

In the initial state of the operation of the flip-flop, the nodes TH and TH_X inside the sense amplifier 32 are short-circuited and initialized to the voltage near the NMOS threshold value.

When the clock inverted signal CLK_X becomes the logic "0" (when the CLK rises), both nodes are cut off, a difference occurs in the potentials of the nodes TH and TH_X according to the magnitudes of the currents flowing into the nodes TF and TF_X of the logic tree and is expanded by the inverter pair comprising the PMOS transistors PT42 and PT43 and the NMOS transistors NT41 and NT42, and the logic value is thus finally determined.

If an incorrect potential fluctuation due to the coupling noise or the like occurs at either of the nodes H and H_X in this process, an erroneous logic value is liable to be finally determined. Even if that incorrect potential fluctuation is very weak (about $\frac{1}{10}$ to $\frac{1}{20}$ of the logic amplitude), the potential fluctuations of the nodes TH and TH_X at the commencement of the operation are also small, therefore nodes are susceptible to their influence.

For example, consider the case where the correct logic value determination becomes H=0 and H_X=1 and noise lifting the potential of the node TH is added to it.

The logic tree node TF has a path reaching the ground. The charge on the node TH is drawn out through the NMOS transistor NT43.

However, the voltage applied to the gate terminal of this NMOS transistor NT43 is nothing other than the potential of the node TH_X and is a voltage of an extent that is a little larger than the vicinity of the threshold value of the NMOS transistor.

For this reason, the NMOS transistor NT43 does not become sufficiently ON, and a conduction resistance thereof is considerably large. Accordingly, the incorrect potential fluctuation rising due to the noise cannot be immediately reduced. Where the potential of the node TH at that time is larger than the potential of the node TH_X, the logic value is defined to H=0 and H_X=1 by the function of the sense amplifier 42.

Even when there is no coupling noise, an erroneous logic value is sometimes finally determined due to the variation of the circuit constant.

For example, consider a case where a parasitic capacitance connects to the node TH is smaller than that of the node TH_X even in the case where the correct logic value determination becomes H=0 and H_X=1.

At the commencement of the operation of the flip-flop, the potentials of both nodes slightly rise due to the charges supplied through the PMOS transistors PT41 to PT43.

Since the logic tree node TF has a path reaching the ground, when the correct logic is finally determined, the method of the rise of the node TH becomes slower than that of the node TH_X.

The potential difference produced in this way is enlarged at the sense amplifier 42 and finally determined to the correct logic value.

However, when there is a remarkable difference in the parasitic capacitances connected to the nodes TH and TH_X and the node TH_X is larger, the node TH_X rises slower than the node TH.

Originally, the charge supplied to the node TH is drawn out to the logic tree 41 through the NMOS transistor NT43, so must be held at a potential lower than the node TH_X.

As mentioned above, however, the NMOS transistor NT43 has not sufficiently become ON, the conduction resistance thereof is considerably large, and the difference of the parasitic capacitances cannot be sufficiently absorbed.

In this way, there is a phenomenon of the node at which the potential originally should quickly rise ending up erroneously rising slowly and being finally determined to an erroneous logic value.

Even in the case of either variation of the circuit constant or coupling noise, the essential problem thereof resides in the NMOS transistors NT43 and NT44 having the function of separating the sense amplifier 42 and the logic tree 41.

In the process of the logic determination operation, the voltages applied to the gate terminals of these NMOS transistors NT43 and NT44 are of an extent a little larger than the threshold voltage of the NMOS transistor, therefore the conduction resistances of these NMOS transistors are considerably larger than that of the NMOS transistor which is usually ON.

The magnitude of the conduction resistance is a cause of the inability to absorb the incorrect potential fluctuation produced due to the coupling noise.

SUMMARY OF THE INVENTION

A first object of the present invention is to provide a logic circuit attempting to eliminate the glitches which had occurred in a static CMOS logic circuit to lower the power consumption or to enable realization of a high speed operation by making good use of the characteristics of a dynamic logic circuit by a combination of a logic tree, sense amplifier, and SR latch.

Further, a second object of the present invention is to provide a logic circuit providing a dual-rail type logic tree so as to discard the mechanism for generating a pulse having a short width such as a PDN-F/F logic circuit and capable of facilitating design by automatic placement and routing by CAD.

Further, a third object of the present invention is to provide a logic circuit making the dependency of the operation speed with respect to the height of the logic tree and the gate width of the MOS inside the logic tree smaller than that of the SA-F/F logic circuit and thus capable of realizing high speed operation even if a complex logical function having many input signals is realized.

Further, a fourth object of the present invention is to provide a logic circuit resistant to variations in the circuit constant and coupling noise and capable of realizing stabler operation than that by a DCSL circuit.

According to a first aspect of the present invention, there is provided a logic circuit for outputting logical function evaluation results in synchronization with a synchronization signal, comprising a dual-rail type logic tree forming a path through which only one rail reaches a reference potential according to an input signal and realizing an intended logical function; a sensing latch unit having a first logic input node and a second logic input node receiving a first logic output and a second logic output of the dual-rail type logic tree, a first logic output node, a second logic output node, a sense amplifier which operates upon receipt of the synchronization signal indicating drive and finally sets the logic potentials of the first logic output and the second logic output at different first level and second level according to a difference of conduction resistances possessed by the first logic input and the second logic input which are input to the first logic input node and the second logic input node, a first switching means for short-circuiting the first logic output node and the second logic output node when receiving a synchronization signal indicating an idle stage, a second switching means for electrically connecting or disconnecting the first logic input node and the first logic output node according to the potential of a control terminal, a third switching means for electrically connecting or disconnecting the second logic input node and the second logic output node according to the potential of the control terminal, and a logic tree disconnection controlling means which has a first setting means for setting the potential of the control node connected to the control terminals of the second switching means and the third switching means to a potential that at least enables the connection between two terminals to which the second and third switching means are connected at a stage including the idle stage where the logic has not been finally determined in the sense amplifier, and a second setting means for setting the potential of the control node at a potential that at least enables the disconnection between the two terminals to which the second and third switching means are connected according to the first logic output node or the second logic output node at a stage where the logic is finally determined in the sense amplifier; and a set and reset latch unit for receiving the first logic output of the sensing latch unit at its set terminal, receiving the second logic output of the sensing latch unit at its reset terminal, and holding the logic output of the sensing latch unit for a period of one cycle of the synchronization signal.

Further, in the present invention, the first setting means of the logic tree disconnection controlling means includes a fourth switching means which is connected between a first power source potential capable of placing the second switching means and the third switching means into a connection state and the control node and becomes conductive upon receipt of the synchronization signal indicating the idle stage at its control terminal, and the second setting means of the logic tree disconnection controlling means includes a fifth switching means which is connected between a second power source potential capable of placing the second switching means and the third switching means into a disconnection state and the control node, has a control terminal connected to the first logic output node, and becomes conductive when the first logic output potential is at a first level and a sixth switching means which is connected between the second power source potential and the control node, has a control terminal connected to the second logic output node, and becomes conductive when the second logic output potential is at the first level.

Alternatively, in the present invention, the first setting means of the logic tree disconnection controlling means includes a fourth switching means which is connected between the first power source potential capable of placing the second switching means and the third switching means into a connection state and the control node and becomes conductive upon receipt of a synchronization signal indicating an idle stage at its control terminal, and the second setting means of the logic tree disconnection controlling means includes a fifth switching means which is connected between an intermediate node and the control node, has a control terminal connected to the first logic output node, and becomes conductive when the first logic output potential is at the first level, a sixth switching means which is connected between the intermediate node and the control node, has a control terminal connected to the second logic output node, and becomes conductive when the second logic output potential is at the first level, and a seventh switching means which is connected between the second power source potential capable of placing the second switching means and the third switching means into the disconnection state and the intermediate node, is held in a non-conductive state when the fourth switching means is conductive, and becomes conductive when the fourth switching means is held in the non-conductive state.

Alternatively, in the present invention, the first setting means of the logic tree disconnection controlling means includes a fourth switching means and a fifth switching means which are connected in series between a first power source potential capable of placing the second switching means and the third switching means into the connection state and a control node and becomes conductive upon receipt of the potential of the first logic output node and the potential of the second logic output node at their control terminals in the idle stage, and the second setting means of the logic tree disconnection controlling means includes a sixth switching means which is connected between a second power source potential capable of placing the second switching means and the third switching means into the disconnection state and the control node, has a control terminal connected to the first logic output node, and becomes conductive when the first logic output potential is at the first level, and a seventh switching means which is connected between the second power source potential and the control node, has a control terminal connected to the second logic output node, and becomes conductive when the second logic output potential is at the first level.

According to a second aspect of the present invention, there is provided a logic circuit for outputting logical function evaluation results in synchronization with a synchronization signal, comprising a dual-rail type logic tree for forming a path through which only one rail reaches the reference potential according to the input signal and realizing the intended logical function; a sensing latch unit having a first logic input node and a second logic input node receiving a first logic output and a second logic output of the dual-rail type logic tree, a first logic output node, a second logic output node, a sense amplifier which operates upon receipt of a synchronization signal indicating drive and finally sets logic potentials of the first logic output and the second logic output at a different first level and second level according to the difference of conduction resistances possessed by the first logic input and the second logic input which are input to the first logic input node and the second logic input node, a first switching means for short-circuiting the first logic output node and the second logic output node when receiving a synchronization signal indicating an idle stage, a second switching means for electrically connecting or disconnecting the first logic input node and the first logic output node according to the potential of the control terminal, a third switching means for electrically connecting or disconnecting the second logic input node and the second logic output node according to the potential of the control terminal, and a logic tree disconnection controlling means which has a first setting means for setting the potential of the control node connected to the control terminals of the second switching means and the third switching means to a potential that at least enables the connection between two terminals to which the second and third switching means are connected at a stage including the idle stage where the logic has not been finally determined in the sense amplifier, and a second setting means for setting the potential of the control node to a potential that at least enables the disconnection between the two terminals to which the second and third switching means are connected according to the first logic output node or the second logic output node at a stage where the logic is finally determined in the sense amplifier; a set and reset latch unit for receiving a first logic output of the sensing latch unit at its set terminal, receiving a second logic output of the sensing latch unit at its reset terminal, and holding the logic output of the sensing latch unit for a period of one cycle of the synchronization signal; and a fourth switching means which electrically disconnects the path reaching the reference potential of the dual-rail type logic tree and the reference potential in the idle stage and connects them at times other than the idle stage.

Further, in the present invention, the first setting means of the logic tree disconnection controlling means includes a fifth switching means which is connected between the first power source potential capable of placing the second switching means and the third switching means into the connection state and the control node and becomes conductive upon receipt of a synchronization signal indicating the idle stage at its control terminal, and the second setting means of the logic tree disconnection controlling means includes a sixth switching means which is connected between a second power source potential capable of placing the second switching means and the third switching means into a disconnection state and the control node, has a control terminal connected to the first logic output node, and becomes conductive when the first logic output potential is at the first level, and a seventh switching means which is connected between the second power source potential and the control node, has a control terminal connected to the second logic output node, and becomes conductive when the second logic output potential is at the first level.

Alternatively, in the present invention, the first setting means of the logic tree disconnection controlling means includes a fifth switching means which is connected between a first power source potential capable of placing the second switching means and the third switching means into the connection state and the control node and becomes conductive upon receipt of a synchronization signal indicating the idle stage at its control terminal, and the second setting means of the logic tree disconnection controlling means includes a sixth switching means which is connected between an intermediate node and the control node, has a control terminal connected to the first logic output node, and becomes conductive when the first logic output potential is at the first level, a seventh switching means which is connected between the intermediate node and the control node, has a control terminal connected to the second logic output node, and becomes conductive when the second logic output potential is at the first level, and an eighth switching means which is connected between a second power source potential capable of placing the second switching means and the third switching means into a disconnection state and the intermediate node, is held in the non-conductive state when the fifth switching means Is conductive, and becomes conductive when the fifth switching means is held in the non-conductive state.

Alternatively, in the present invention, the first setting means of the logic tree disconnection controlling means includes a fifth switching means and a sixth switching means which are connected in series between a first power source potential capable of placing the second switching means and the third switching means into the connection state and the control node and become conductive upon receipt of the potential of the first logic output node and the potential of the second logic output node at their control terminals in the idle stage, and the second setting means of the logic tree disconnection controlling means includes a seventh switching means which is connected between a second power source potential capable of placing the second switching means and the third switching means into the disconnection state and the control node, has a control terminal connected to the first logic output node, and becomes conductive when the first logic output potential is at the first level, and an eighth switching means which is connected between the second power source potential and the control node, has a control terminal connected to the second logic output node, and becomes conductive when the second logic output potential is at the first level.

According to a third aspect of the present invention, there is provided a logic circuit for outputting logical function evaluation results in synchronization with a synchronization signal, comprising a dual-rail type logic tree forming a path through which only one rail reaches the reference potential according to an input signal and realizing the intended logical function; a sensing latch unit having a first logic input node and a second logic input node receiving a first logic output and a second logic output of the dual-rail type logic tree, a first logic output node, a second logic output node, a sense amplifier which operates upon receipt of a synchronization signal indicating drive and finally determines the logic potentials of the first logic output and the second logic output at a different first level and second level according to the difference of conduction resistances possessed by the first logic input and the second logic input which are input to the first logic input node and the second logic input node, a first switching means for short-circuiting the first logic output node and the second logic output node when receiving a synchronization signal indicating an idle stage, a second switching means for electrically connecting or disconnecting the first logic input node and the first logic output node according to the potential of the control terminal, a third switching means for electrically connecting or disconnecting the second logic input node and the second logic output node according to the potential of the control terminal, and a logic tree disconnection controlling means which has a first setting means for setting the potential of the control node connected to the control terminals of the second switching means and the third switching means to a potential that at least enables the connection between two terminals to which the second and third switching means are connected at a stage including the idle stage where the logic has not been finally determined in the sense amplifier, and a second setting means for setting the potential of the control node to a potential that at least enables the disconnection between two terminals to which the second and third switching means are connected according to the potential of the first logic output node or the second logic output node at a stage where the logic is finally determined in the sense amplifier; a set and reset latch unit for receiving a first logic output of the sensing latch unit at its set terminal, receiving a second logic output of the sensing latch unit at its reset terminal, and holding the logic output of the sensing latch unit for a period of one cycle of the synchronization signal; a fourth switching means which electrically disconnects the path reaching the reference potential of the dual-rail type logic tree and the reference potential in the idle stage and connects them at times other than the idle stage; and a fifth switching means which forcibly connects the path reaching the reference potential of the dual-rail type logic tree and the reference potential for a period during which the path reaching the reference potential of the dual-rail type logic tree and the reference potential are disconnected by the fourth switching means in the idle stage and when the synchronization signal is stopped while indicating the idle stage as it is.

Further, in the present invention, the first setting means of the logic tree disconnection controlling means includes a sixth switching means which is connected between a first power source potential capable of placing the second switching means and the third switching means into the connection state and the control node and becomes conductive upon receipt of a synchronization signal indicating the idle stage at its control terminal, and the second setting means of the logic disconnection controlling means includes a seventh switching means which is connected between a second power source potential capable of placing the second switching means and the third switching means into the disconnection state and the control node, has a control terminal connected to the first logic output node, and becomes conductive when the first logic output potential is at the first level, and an eighth switching means which is connected between the second power source potential and the control node, has a control terminal connected to the second logic output node, and becomes conductive when the second logic output potential is at the first level.

Alternatively, in the present invention, the first setting means of the logic tree disconnection controlling means includes a sixth switching means which is connected between a first power source potential capable of placing the second switching means and the third switching means into the connection state and the control node and becomes conductive upon receipt of a synchronization signal indicating the idle stage at its control terminal, and the second setting means of the logic tree disconnection controlling means includes a seventh switching means which is connected between an intermediate node and the control node, has a control terminal connected to the first logic output node, and becomes conductive when the first logic output potential is at the first level, an eighth switching means which is connected between the intermediate node and the control node, has a control terminal connected to the second logic output node, and becomes conductive when the second logic output potential is at the first level, and a ninth switching means which is connected between a second power source potential capable of placing the second switching means and the third switching means into the disconnection state and the intermediate node, is held in the non-conductive state when the sixth switching means is conductive, and becomes conductive when the sixth switching means is held in the non-conductive state.

Alternatively, in the present invention, the first setting means of the logic tree disconnection controlling means includes a sixth switching means and a seventh switching means which are connected in series between a first power source potential capable of placing the second switching means and the third switching means into the connection state and the control node and become conductive upon receipt of the potential of the first logic output node and the potential of the second logic output node at their control terminals in the idle stage, and the second setting means of the logic tree disconnection controlling means includes an eighth switching means which is connected between a second power source potential capable of placing the second switching means and the third switching means into the disconnection state and the control node, has a control terminal connected to the first logic output node, and becomes conductive when the first logic output potential is at the first level, and a ninth switching means which is connected between the second power source potential and the control node, has a control terminal connected to the second logic output node, and becomes conductive when the second logic output potential is at the first level.

Further, in each logic circuit according to the present invention, the sense amplifier of the sensing latch unit has a first inverter and a second inverter, the output of the first inverter and the input of the second inverter are connected, the connection point thereof is connected to the first logic output node, the input of the first inverter and the output of the second inverter are connected, the connection point thereof is connected to the second logic output node, and the first switching means is connected between the input of the first inverter and the input of the second inverter.

According to the present invention, in the sensing latch unit, where for example the synchronization signal has the logic "0" indicating the idle stage, the sense amplifier does not have a driving capability, and the first switching means, the second switching means and the third switching means become the conductive state.

As a result, in the sensing latch unit, a state where all of the first logic input node to which the first logic output of the logic tree is input, the second logic input node to which the second logic output of the logic tree is input, the first logic output node for outputting the first logic output to the set and reset latch unit, and the second logic output node for outputting the second logic output to the set and reset latch unit are short-circuited is exhibited.

In a drive stage immediately after the synchronization signal changes from the logic "0" to the logic "1" from this idle stage, the sense amplifier has a driving capability, the first switching means becomes the non-conductive state, and the second and third switching means are held in the conductive state as they are.

Accordingly, in this drive stage, the first logic output node and first logic input node and the second logic output node and second logic input node are short-circuited. Further, a state where the first logic output node and first logic input node and the second logic output node and second logic input node in the short-circuited state are released is exhibited.

During the period where the synchronization signal after the final determination of the logic value has the logic "1" (final determination stage), the sense amplifier has a driving capability, and a state where the first logic output node and first logic input node and the second logic output node and second logic input node are all cut off is exhibited.

Further, according to the present invention, it is possible to prevent the logic tree and the reference potential from being electrically cut off by the fourth switching means during the period where the synchronization signal becomes the logic "0" (idle stage) and the charges in the sensing latch unit and the dual-rail type logic tree from escaping to the reference potential, that is, the ground.

Due to this, a reduction of the power consumption can be achieved.

Further, according to the present invention, where for example the synchronization signal stops at the logic "0" and the fourth switching means continuously becomes the non-conductive state, the fifth switching means is held in the conductive state.

Due to this, the internal nodes in the sensing latch unit and the dual-rail type logic tree can be fixed to the potential of the complete logic "0". As a result, a reduction of the leakage current at the set and reset latch unit can be achieved.

BRIEF DESCRIPTION OF THE DRAWINGS

These and other objects and features of the present invention will become clearer from the following description of the preferred embodiments given with reference to the accompanying drawings, in which:

FIG. 29 is a view showing potential waveforms of internal nodes TH and TH_X at the time of a SLEEP mode operation and simulation results of a leakage current value.

DESCRIPTION OF THE PREFERRED EMBODIMENTS

Below, preferred embodiments will be described with reference to the accompanying drawings.

First Embodiment

Figure 10:
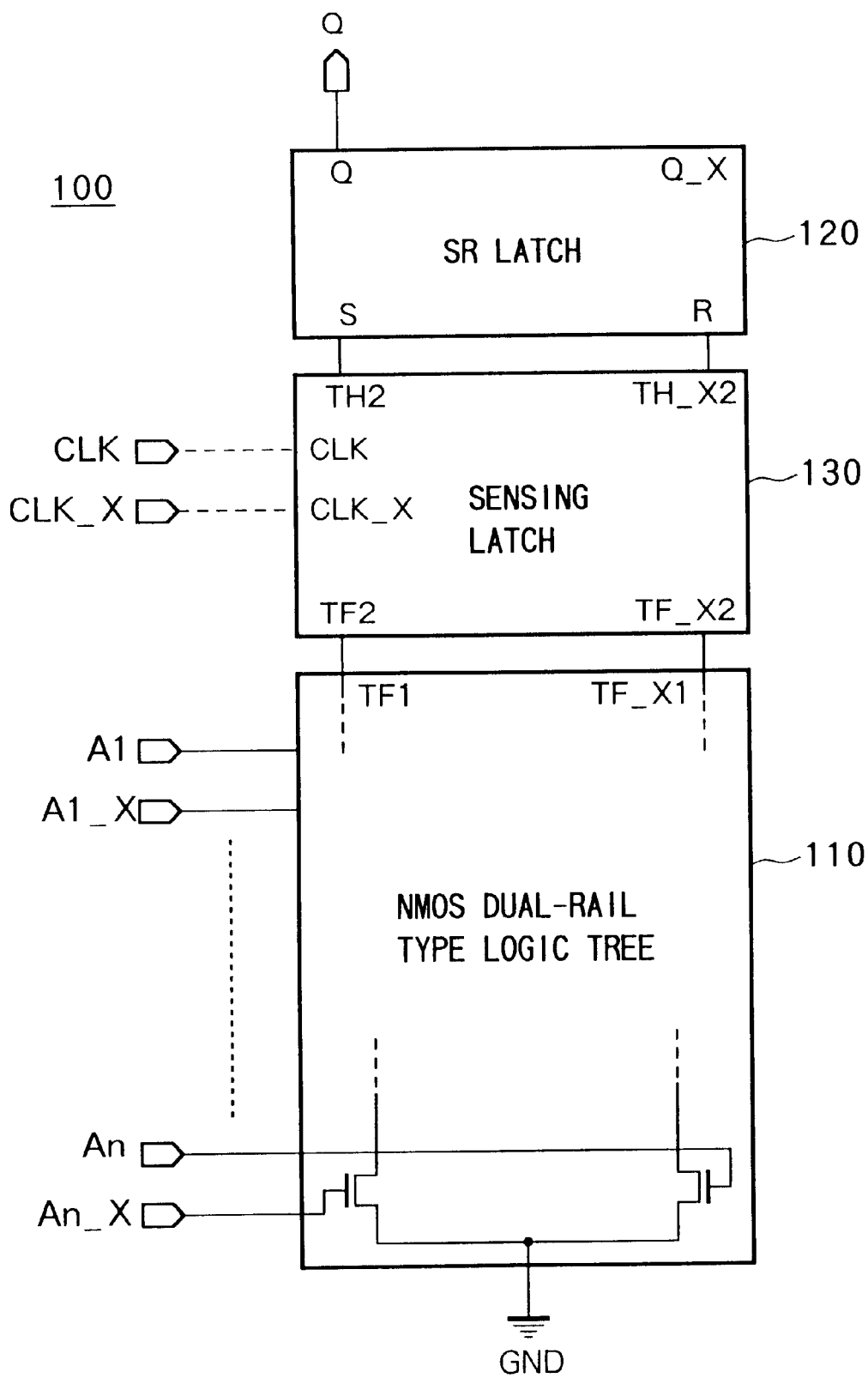
FIG. 10 is a block diagram of a first embodiment of a logic circuit according to the present invention.

FIG. 10 is a block diagram of a first embodiment of a logic circuit according to the present invention.

A logic circuit 100 according to the present first embodiment has as main configuration elements, as shown in FIG. 10, an NMOS dual-rail type logic tree portion 110, an SR latch unit 120, and a sensing latch unit 130 including a sense amplifier.

In the NMOS dual-rail type logic tree portion 110, when assuming that. the input signals of the logical function are A1, A2, . . . , An and are given together with their inverted signals A1_X, A2_X, . . . , An_X, one of the logic tree ends TF and TF_X always has a path reaching the ground, and the other always becomes the high impedance state.

Figure 11:
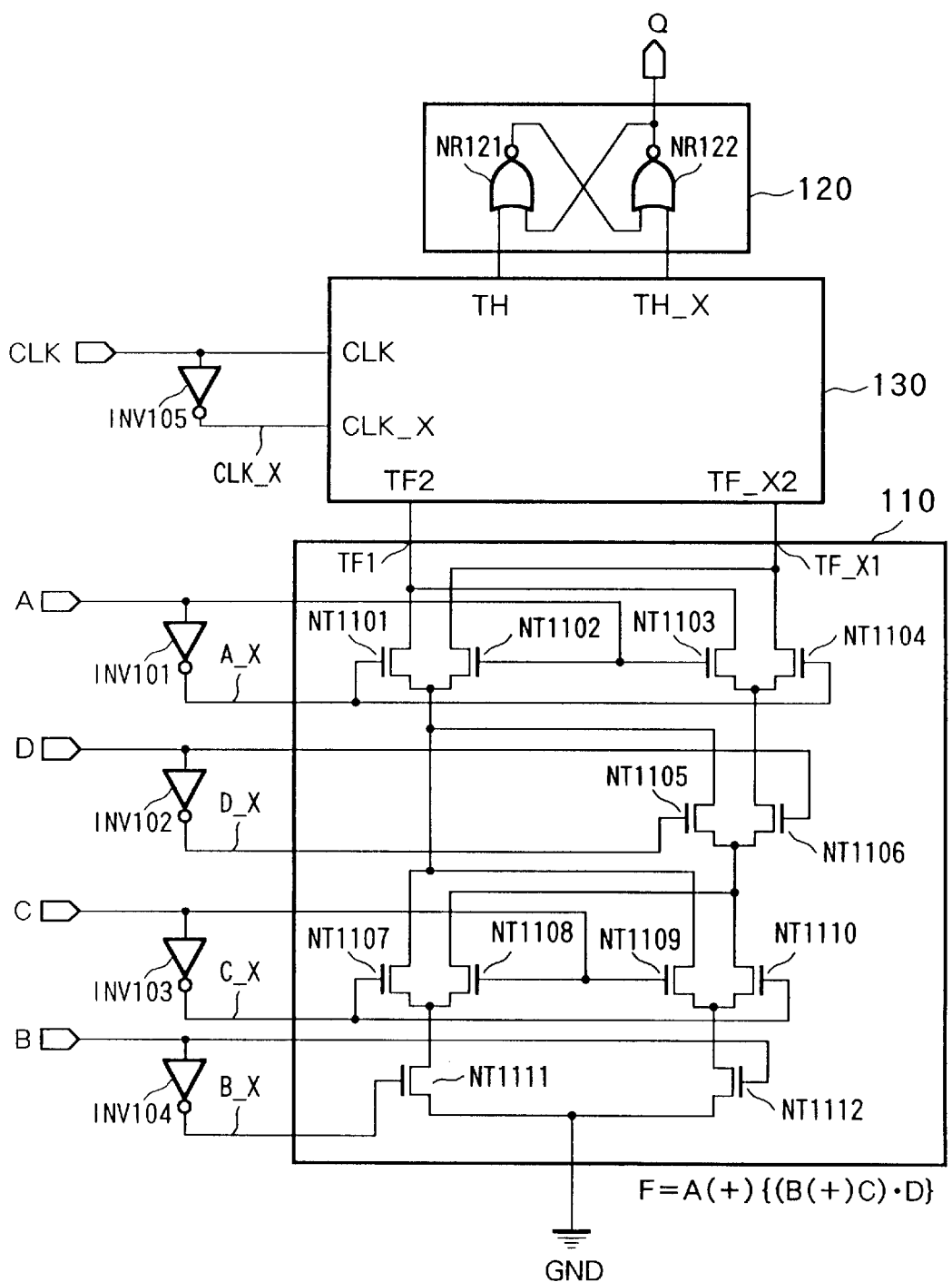
FIG. 11 is a circuit diagram of an example of concrete configurations of an NMOS dual-rail type logic tree portion and an SR latch unit in the logic circuit of FIG. 10.

So long as the NMOS dual-rail type logic tree portion 110 satisfies such a property, its method of realization is not critical, but it may be configured as shown in for example FIG. 11.

Specifically, the NMOS dual-rail type logic tree portion 110 of FIG. 11 shows the case of 4 inputs A, B, C, and D and has NMOS transistors NT1101 to NT1112.

In the NMOS dual-rail type logic tree portion 110, the NMOS transistors NT1101, NT1107, and NT1111 are connected in series between a logical function output node TF1 and the ground.

Further, the NMOS transistors NT1104, NT1106, NT1110, and NT1112 are connected in series between a logical function output node TF_X1 and the ground.

The NMOS transistor NT1102 is connected between the logic output node TF_X1 and the connection point of the NMOS transistors NT1101 and NT1107, and the NMOS transistor NT1103 is connected between the logic output node TF1 and the connection point of the NMOS transistors NT1104 and NT1106.

Further, an inverted signal A_X obtained by inverting the signal A at an inverter INV101 is supplied to the gates of the NMOS transistors NT1101 and NT1104, while the signal A is supplied to the gates of the NMOS transistors NT1102 and NT1103.

The NMOS transistor NT1105 is connected between the connection point of the NMOS transistors NT1101 and NT1107 and the connection point of the NMOS transistors NT1106 and NT1110.

Further, an inverted signal D_X obtained by inverting the signal D at an inverter INV102 is supplied to the gate of the NMOS transistor NT1105, while the signal D is supplied to the gate of the NMOS transistor NT1106.

The NMOS transistor NT1108 is connected between the connection point of the NMOS transistors NT1106 and NT1110 and the connection point of the NMOS transistors NT1107 and NT1111, while the NMOS transistor NT1109 is connected between the connection point of the NMOS transistors NT1101 and NT1107 and the connection point of the NMOS transistors NT1110 and NT1112.

Further, an inverted signal C_X obtained by inverting the signal C at an inverter INV103 is supplied to the gates of the NMOS transistors NT1107 and NT1110, While the signal C is supplied to the gates of the NMOS transistors NT1108 and NT1109.

Further, an inverted signal B_X obtained by inverting the signal B at an inverter INV104 is supplied to the gate of the NMOS transistor NT1111, while the signal B is supplied to the gate of the NMOS transistor NT1112.

The SR latch unit 120 receives the logic output H from the output node TH of the sensing latch unit 130 at its set (S) terminal, receives the logic output H_X from the output node TH_X of the sensing latch unit 130 at its reset (R) terminal, holds the logic output of the sensing latch unit 130, and outputs the data from the Q output.

So long as the SR latch unit 120 has the function of a set and reset latch such as realized generally by two NAND gates or two NOR gates, the method of realization is not critical.

There is a difference between the NAND type and the NOR type in the point of the case where the hold mode is the logic "1" for both of the S terminal and the R terminal (NAND type) and the case where the hold mode is the logic "0" for the two (NOR type).

For this reason, it is necessary to properly use them according to the polarities of the output nodes TH and TH_X of the sensing latch unit 130.

The polarity of the sensing latch unit 130 indicates the difference of whether the voltage output in the idle stage (flip-flop operation initial state) as will be mentioned later is the logic "1" or the logic "0" for both of the nodes TH and TH_X.

In the logic circuit 100 shown in FIG. 11, the SR latch 120 is realized by two NOR gates NR121 and NR122.

Further, in the logic circuit 100 of FIG. 11, the NMOS dual-rail type logic tree portion 110 realizes a logical function such as F=A(+){(B(+)C)D).

The existence of a path reaching the ground in one of the logic tree nodes TF1 and TF_X1 no matter what the combination of the logic values of the input signals A, B, C, and D contributes to the output nodes TH and TH_X of the sensing latch unit 130 being fixed to the potential of the complete logic "0" in the idle stage.

Figure 12:
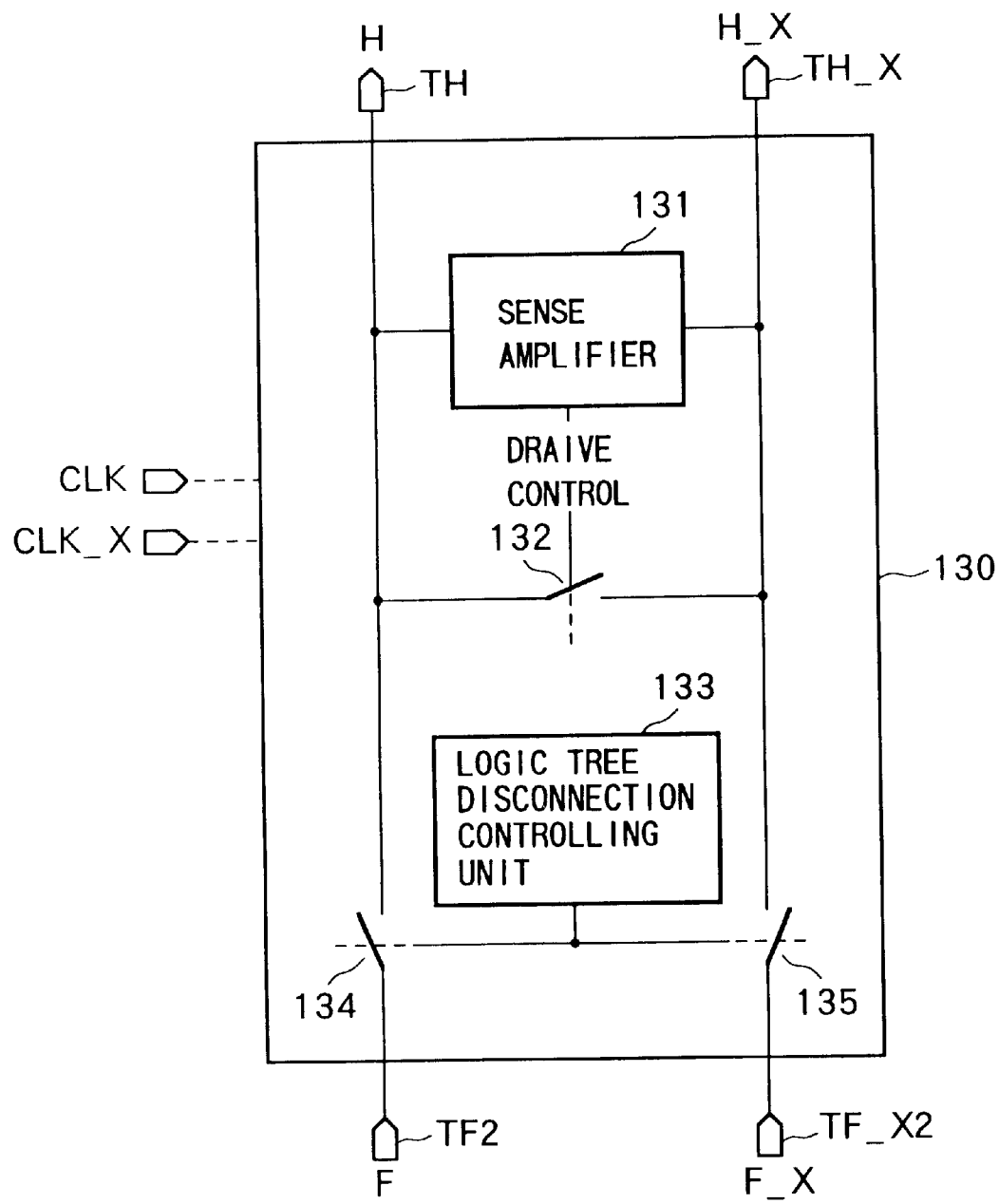
FIG. 12 is a view for explaining the fundamental configuration of a sensing latch unit according to the present invention.

The sensing latch unit 130 has, as shown in FIG. 12, a sense amplifier 131 operating under drive control, a switch 132 serving as the first switching means for short-circuiting the nodes TH and TH_X for the logic outputs H and H_X by this drive control, a logic tree disconnection controlling unit 133, a switch 134 serving as the second switching means for short-circuiting the node TH and the logic input use node TF2 and the node TH_X and the logic input use node TF_X under the control by the logic tree disconnection controlling unit 133, and a switch 135 serving as the third switching means as the main configuration elements.

The drive control referred to here indicates the clock signal (synchronization signal) CLK and the inverted signal CLK_X thereof.

As mentioned above, the method of realization of the NMOS dual-rail type logic tree portion 110 and the SR latch unit 120 is not defined very finely. The biggest characteristic feature of the present invention resides in the sensing latch unit 130.

Below, an explanation will be made of the definition of the operation of the sensing latch unit 130 and the concrete configuration and function in order with reference to the drawings.

Note that, for convenience of the explanation, it is assumed that the logical function is carried out in synchronization with the rising of the clock signal (synchronization signal) CLK.

Figure 13:
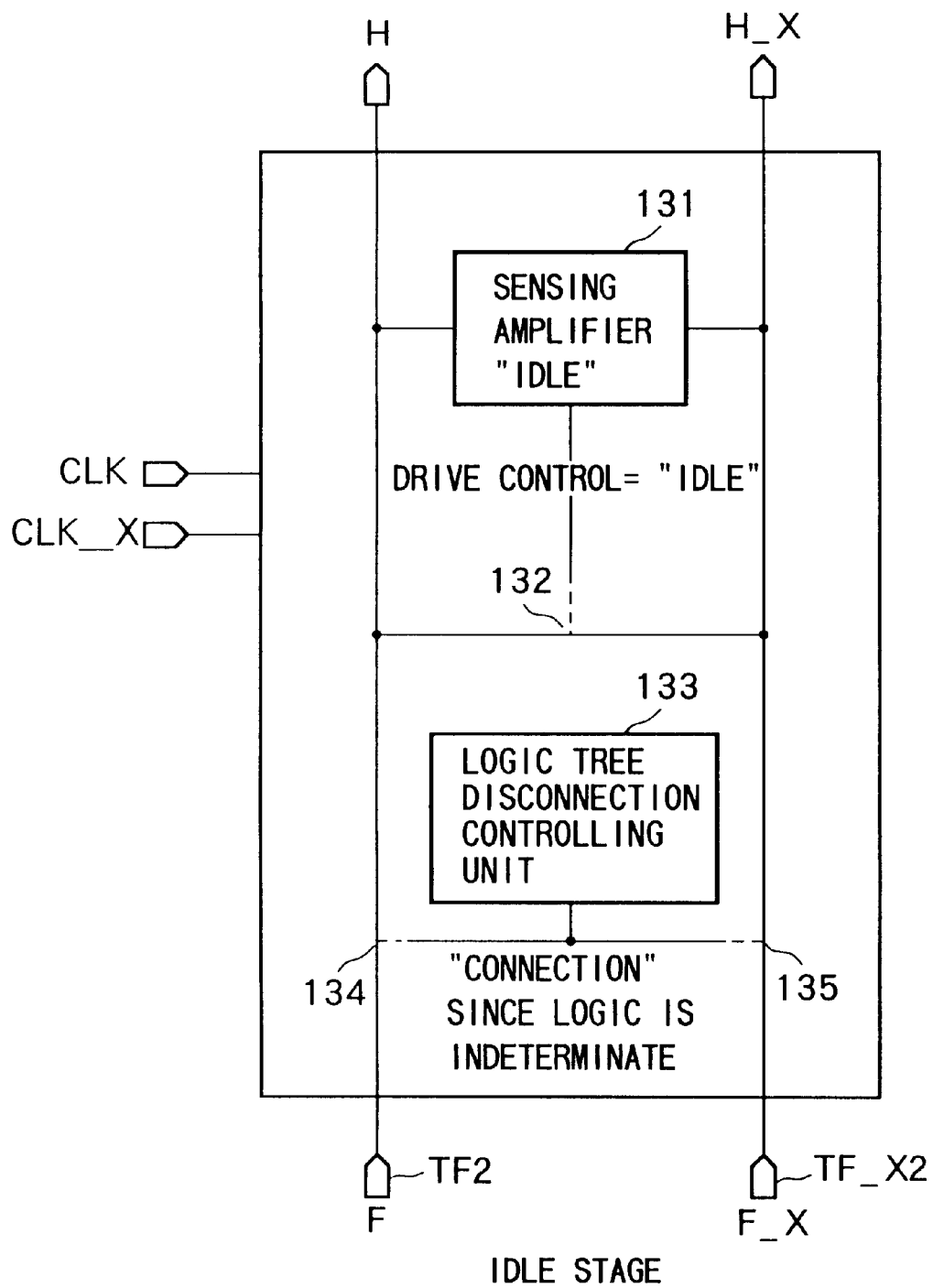
FIG. 13 is a view for explaining a basic operation of the sensing latch unit according to the present invention in an "idle stage"
Figure 14:
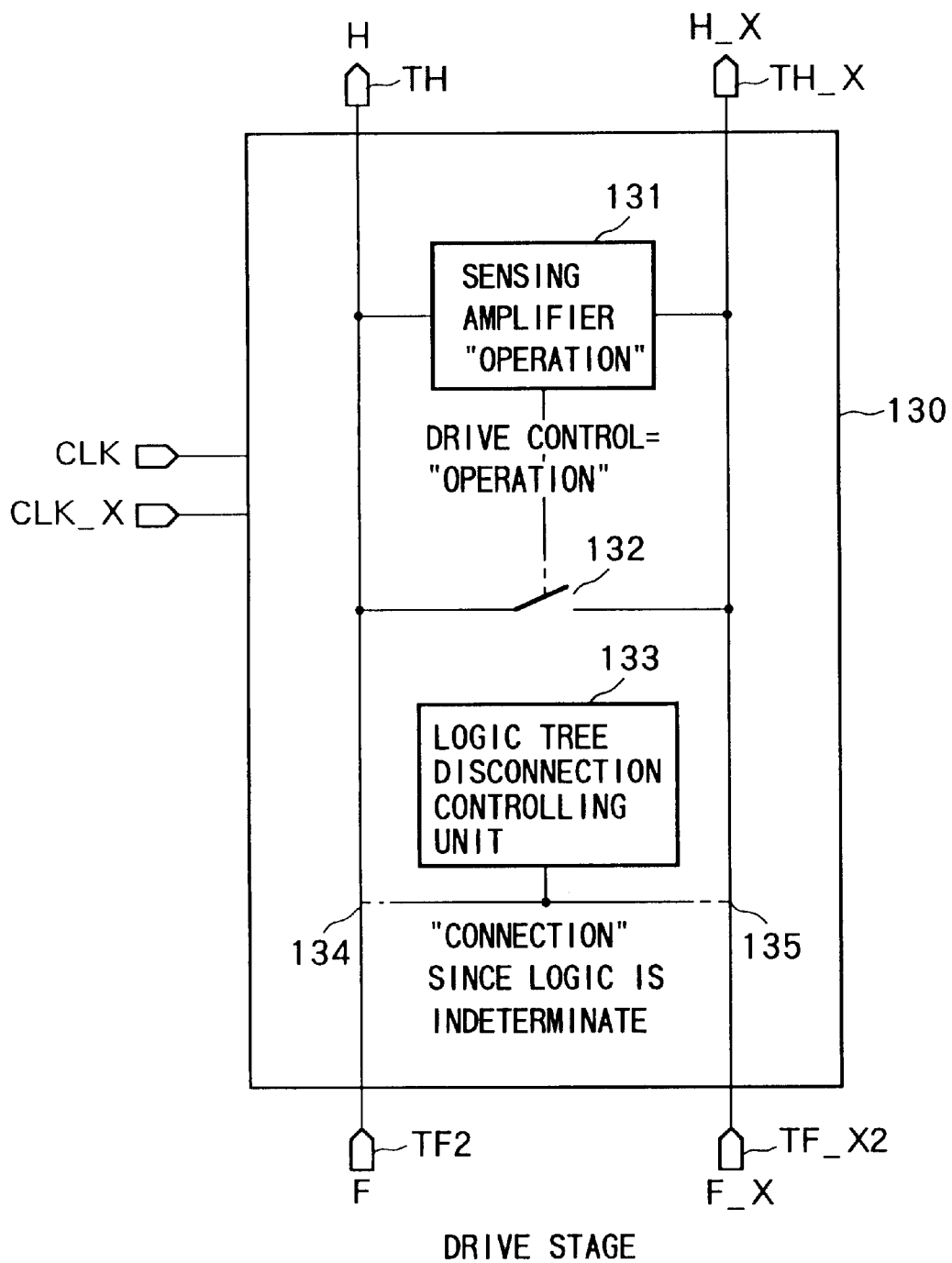
FIG. 14 is a view for explaining the basic operation of the sensing latch unit according to the present invention in a "drive stage"
Figure 15:
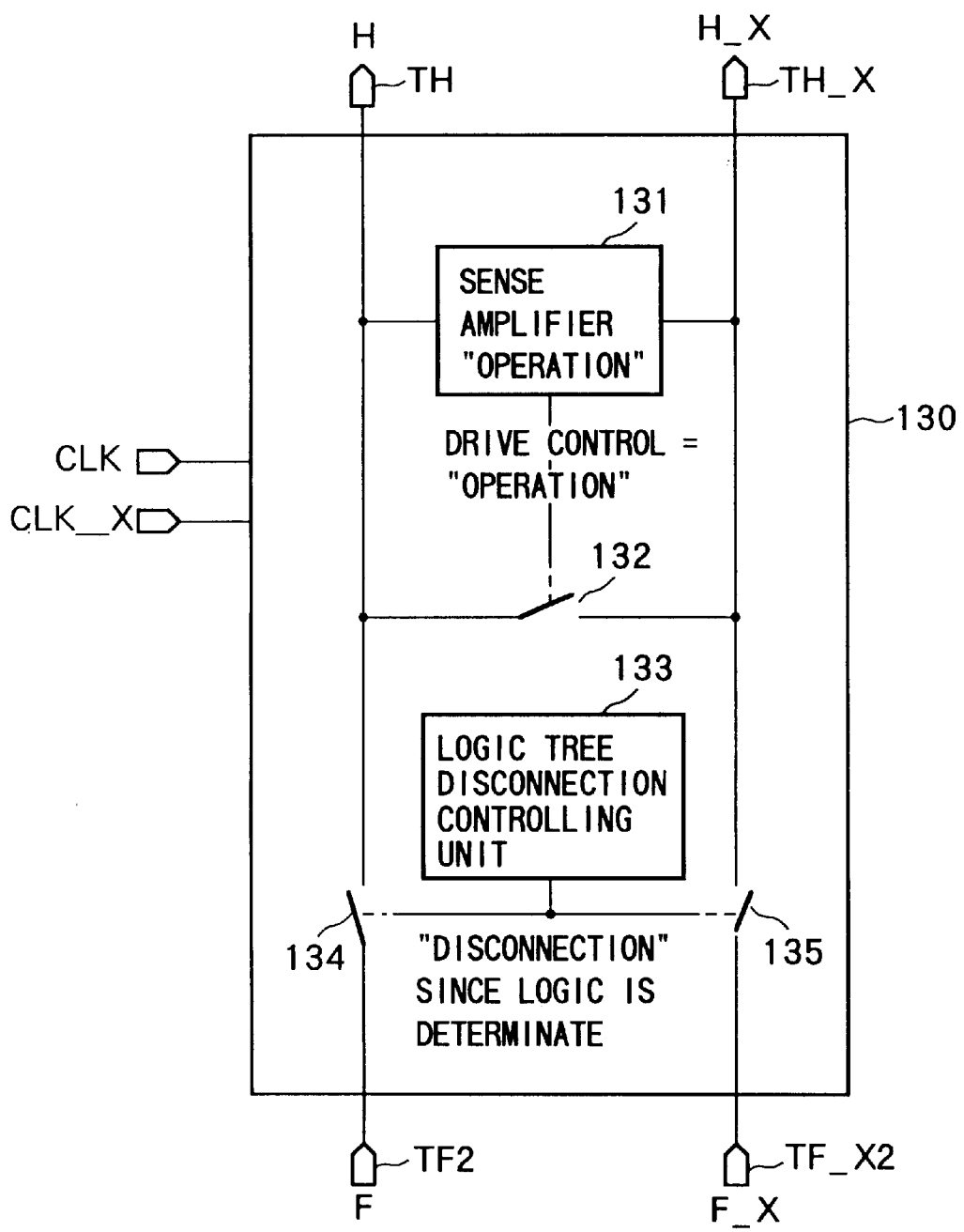
FIG. 15 is a view for explaining the basic operation of the sensing latch unit according to the present invention in a "final determination stage"

As shown in FIG. 13, FIG. 14, and FIG. 15, the operation of the sensing latch unit 130 can be divided into the three stages of the "idle stage", "drive stage", and the "final determination stage".

The period during which the clock signal CLK has the logic "0" will be referred to as the "idle stage" shown in FIG. 13. This corresponds to a so-called "initial state of the flip-flop operation".

In this idle stage, the idling of the operation is indicated by the clock signal CLK and the inverted signal CLK_X thereof, and the sense amplifier 131 does not have a driving capability and does not interfere with the potentials of the nodes TH and TH_X. The switch 132 short-circuits the nodes TH and TH_X.

When the logic values on the nodes TH and TH_X are not finally determined, the logic tree disconnection controlling unit 133 indicates connection to the switches 134 and 135.

By this, the nodes TH and TF2 and the nodes TH_X and TF_X2 are short-circuited.

Here, the time where the logic values on the nodes TH and TH_X are not finally determined means the state where the potentials of the nodes H and H_X are equal, or, even if they are different, the difference is small, so the logic values are not clear.

In this idle stage, a state where all of the nodes TH, TH_X, TF2, and TF_X2 are short-circuited by the switch is exhibited. The logic values of the nodes TH and TH_X at this time indicate the hold mode for the SR latch unit 120.

The period from the instant at which the clock signal CLK switches from the logic "0" to the logic "1" to the time when the logic values of the nodes TH and TH_X are finally determined will be referred to as the "drive stage".

In this case, as shown in FIG. 14, the switch 132 becomes OFF and cuts off the nodes TH and TH_X, while the sense amplifier 131 has a driving capability and interferes with the potentials of the nodes TH and TH_X to try to make one of them the logic "0" and make the other one the logic "1".

However, the logic values at the nodes TH and TH_X have not yet been determined. After the pre-stage, the logic tree disconnection controlling unit 133 indicates connection with respect to the switches 134 and 135 and short-circuits the nodes TH and TF2 and the nodes TH_X and TF_X2.

Accordingly, interference occurs between the sense amplifier 131 and the logic tree nodes TF1 and TF_X1. One of the logic tree nodes TF1 and TF_X1 always has a path reaching the ground and tries to pull down one of the nodes TH and TH_X to the logic 0. Upon receipt of such interference, the potentials of the nodes TH and TH_X, which had been the same, start to change in different directions.

The period from the instant at which the logic values of the nodes TH and TH_X which start to change in the pre-stage are finally determined to the time when the clock signal CLK returns from the logic "1" to the logic "0" will be referred to as the "final determination stage".

In this case, as shown in FIG. 15, the sense amplifier 131 has a driving capability, and the switch 132 has become OFF, so the potentials of the nodes TH and TH_X are stably maintained.

In the stage where the logic values of the nodes TH and TH_X become clear, the logic tree disconnection controlling unit 133 indicates disconnection to the switches 134 and 135.

By this, the switches 134 and 135 become OFF, and the sense amplifier 131 and the logic tree 110 are electrically cut off. For this reason, even if there is a change in the input signal after this and the path of the logic tree 110 reaching the ground changes, there is no influence upon the nodes TH and TH_X.

Accordingly, in this stage, even if the input signal changes, the potentials of the nodes TH and TH_X do not change and are stably maintained.

As described above, it is only in the drive stage that the input signal with respect to the logical function must be constant.

Even if the input signal changes in the idle stage, and the path to the ground changes from TF2 (TF1) to TF_X2 (TF_X1), the nodes TF2 and TF_X2 are short-circuited through the switches 132, 134, and 135, so this is irrelevant.

Further, as mentioned before, the logic tree 110 and the sense amplifier 131 are electrically cut off in the final determination stage, so are not affected. Further, the insertion to the SR latch is carried out at approximately the same timing as the time when the logic tree disconnection controlling unit 133 indicates disconnection.

As mentioned before, in the final determination stage, the logic values of the nodes TH and TH_X are stably maintained. Even if the circuit enters the idle stage thereafter, the SR latch unit 120 is in the hold mode, so continuously maintains that value.

Accordingly, it is guaranteed that the output of the SR latch unit 120 will become constant from the rising of the clock signal CLK to the next rising.

In this way, the operation of the flip-flop with an embedded logical function of sampling the input signal for exactly an extremely short period from the rising of the clock signal (synchronization signal), outputting that logic evaluation thereof, and holding this during one cycle of the clock signal (synchronization signal) is realized.

Next, a detailed explanation will be made of three concrete examples of the sensing latch unit 130 including the operation principle thereof with reference to FIG. 16 to FIG. 18.

Note that, in the following explanation, it is assumed that the nodes TH and TH_X output the logic "0" in the idle stage. Further, it Is assumed that the sensing latch unit is used in a manner by which the grounding of the logic tree is not suppressed as in FIG. 10.

Figure 16:
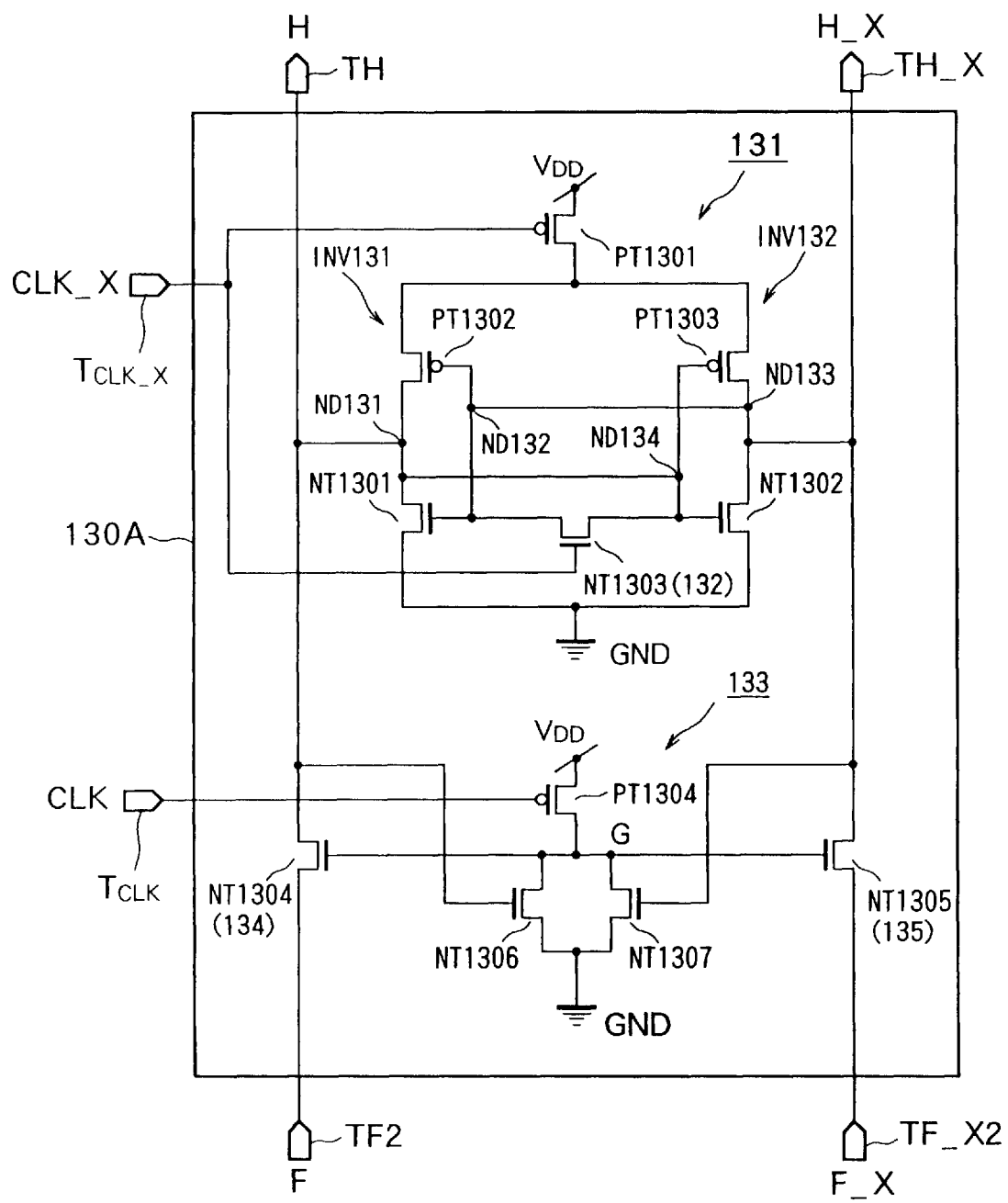
FIG. 16 is a circuit diagram of a first concrete example of the sensing latch unit according to the present invention.

First Concrete Example of Sensing Latch Unit FIG. 16 is a circuit diagram of a first concrete example of a sensing latch unit according to the present invention.

This sensing latch unit 130A has, as shown in FIG. 16, PMOS transistors PT1301 to PT1304, NMOS transistors NT1301 to NT1307, a first logic input node TF2, second logic input node TF_X2, a first logic output node TH, a second logic output node TH_X, and clock input terminals TCLK and TCLKX.

The source of the PMOS transistor PT1301 is connected to the supply line of the power source voltage $V_{DD}$, while the drain is connected to the sources of the PMOS transistors PT1302 and PT1303.

The drains and gates of the PMOS transistor PT1302 and the NMOS transistor NT1301 are connected to each other to configure an inverter INV131.

An output node ND131 of the inverter INV131 is configured by the connection point of the drains of the PMOS transistor PT1302 and the NMOS transistor NT1301, while an input node ND132 of the inverter INV131 is configured by the connection point of the gates.

Similarly, the drains and gates of the PMOS transistor PT1303 and the NMOS transistor NT1302 are connected to each other to configure an inverter INV132.

An output node ND133 of the inverter INV132 is configured by the connection point of the drains of the PMOS transistor PT1303 and the NMOS transistor NT1302, while an input node ND134 of the inverter INV132 is configured by the connection point of the gates.

Further, the sources of the NMOS transistors NT1301 and NT1302 are grounded.

The output node ND131 of the inverter INV131 is connected to the input node ND134 of the inverter INV132 and the logic output terminal TH, while the output node ND133 of the inverter INV132 is connected to the input node ND132 of the inverter INV131 and the logic output terminal TH_X.

The sense amplifier 131 is configured by the PMOS transistors PT1301 to PT1303 and NT1301 and NT1302 having the above connection relationships.

The input node ND132 of the Inverter INV131 and the input node ND134 of the inverter INV132 configuring the sense amplifier 131, in other words, the gate of the NMOS transistor NT1301 and the gate of the NMOS transistor NT1302, are connected by the NMOS transistor NT1303.

This NMOS transistor NT1303 acts as the switch 132.

The NMOS transistor NT1304 is connected between the logic output node TH and the logic input node TF2, and the NMOS transistor NT1305 is connected between the logic output node TH_X and the logic input node TF_X2.

Further, the NMOS transistor NT1304 acts as the switch 134, and the NMOS transistor NT1305 acts as the switch 135.

Further, the sources of the NMOS transistors NT1306 and NT1307 are grounded, while the drains of them are commonly connected to the gates of the NMOS transistors NT1304 and NT1305 and the drain of the PMOS transistor PT1304. Further, the source of the PMOS transistor PT1304 is connected to the supply line of the power source voltage $V_{DD}$.

The logic tree disconnection controlling unit 133 is configured by these PMOS transistor PT1304 and NMOS transistors NT1306 and NT1307.

Note that the first setting means is configured by the PMOS transistor PT1304, and the second setting means is configured by the NMOS transistors NT1306 and NT1307.

Further, the gate of the PMOS transistor PT1301, and the gate of the NMOS transistor NT1303 serving as the switch 132 are connected to the clock output terminal TCLKX, while the gate of the PMOS transistor PT1304 is connected to the clock output terminal TCLK.

The gate of the NMOS transistor NT1306 is connected to the connection point of the logic output terminal TH and the NMOS transistor NT1304, while the gate of the NMOS transistor NT1307 is connected to the connection point of the logic output terminal TH_X and the NMOS transistor NT1305.

In the sensing latch unit 130A having the configuration of FIG. 16, in the idle stage, the clock signal CLK has the logic "0", while the clock inverted signal CLK_X has the logic "1". Accordingly, the PMOS transistor PT1301 becomes cut off and shuts off the current with respect to the sense amplifier 131 part, so the sense amplifier 131 does not have any driving capability.

On the other hand, the PMOS transistor PT1304 of the logic tree disconnection controlling unit 133 becomes ON and supplies a charge to the control node G.

As the initial state, the logic potentials of the nodes TH and TH_X are "0", so the NMOS transistors NT1306 and NT1307 have become cut off.

Accordingly, the control node G is initialized to the potential of the logic "1".

This enables the logic tree disconnection controlling unit 133 to indicate connection to the NMOS transistor NT1304 serving as the switch 134 and the NMOS transistor NT1305 serving as the switch 135.

Further, the NMOS transistor NT1303 serving as the switch 132 becomes ON by the clock inverted signal CLK_X, while the NMOS transistor NT1304 serving as the switch 134 and the NMOS transistor NT1305 serving as the switch 135 are controlled by the potential of the control node G and become ON.

By this, the nodes TH, TH_X, TF2, and TF_X2 are all short-circuited.

At this time, one of the nodes TF1 and TF_X1 of the logic tree always has a path reaching the ground, so the potentials of these nodes TH, TH_X, TF2, and TF_X2 are fixed to the potential of the complete logic "0".

In the drive stage, the clock signal CLK becomes the logic "1", and the clock inverted signal CLK_X becomes the logic "0".

Due to this, the PMOS transistor PT1301 becomes ON, the NMOS transistor NT1303 becomes cut off, and the sense amplifier 131 has a driving capability.

On the other hand, the PMOS transistor PT1304 becomes cut off and the supply of the charge to the control node G is cut off.

In the initial state of the drive stage, however, the potentials of the nodes TH and TH_X are the complete logic "0", and the NMOS transistors NT1306 and NT1307 have become cut off.

For this reason, the charge on the control node G is preserved, and the potential of the control node G is held at the complete logic "1". This, looking at the state of indetermination of the logic, enables the logic tree disconnection controlling unit 133 to still indicate connection to the NMOS transistor NT1304 serving as the switch 134 and the NMOS transistor NT1305 serving as the switch 135.

Accordingly, interference occurs between the sense amplifier 131 and the logic, whereby the potentials of the nodes TH and TH_X start to change.

In the final determination stage, one of the nodes TH and TH_X becomes the logic "1". Here, it is assumed that it is the node TH_X.

In this case, the NMOS transistor NT1307 of the logic tree disconnection controlling unit 133 becomes ON and drains the charge on the control node G, whereby the potential of the control node G becomes the complete logic "0".

For this reason, the NMOS transistor NT1304 serving as the switch 134 and the NMOS transistor NT1305 serving as the switch 135 become cut off, and the sense amplifier 131 and the logic tree are cut off.

This, looking at the state of indetermination of the logic, enables the logic tree disconnection controlling unit 133 to indicate disconnection to the NMOS transistor NT1304 serving as the switch 134 and the NMOS transistor NT1305 serving as the switch 135.

Thereafter, the circuit enters the idle stage, the clock signal CLK becomes the logic "0", and the clock inverted signal CLK_X becomes the logic "1".

By this, the NMOS transistor NT1303 serving as the switch 132 becomes ON, and the charges on the nodes TH and TH_X are balanced in distribution.

Simultaneously, the gates and drains of the NMOS transistors NT1301 and NT1302 are short-circuited and these become equivalent to diodes.

Accordingly, the potentials of the nodes TH and TH_X are quickly pulled down to the vicinity of the threshold value of the NMOS transistor.

The potential in the vicinity of the threshold value of the NMOS transistor is substantially treated as the logic "0", therefore the NMOS transistors NT1306 and NT1307 become cut off.

Accordingly, a charge is supplied to the control node G by the PMOS transistor PT1304, and the potential of the control node G is initialized to the complete logic "1" again.

Upon receipt of this, the NMOS transistor NT1304 serving as the switch 134 and the NMOS transistor NT1305 serving as the switch 135 become ON, and the sense amplifier 131 and the logic tree are connected again.

The charges existing on the nodes TH and TH_X and setting the potentials in the vicinity of the NMOS threshold value are pulled out to the ground through the logic tree 110.

In this way, the potentials of the nodes TH, TH_X, TF2, and TF_X2 are fixed to the potential of the complete logic "0" again.

Second Concrete Example of Sensing Latch Unit

Figure 17:
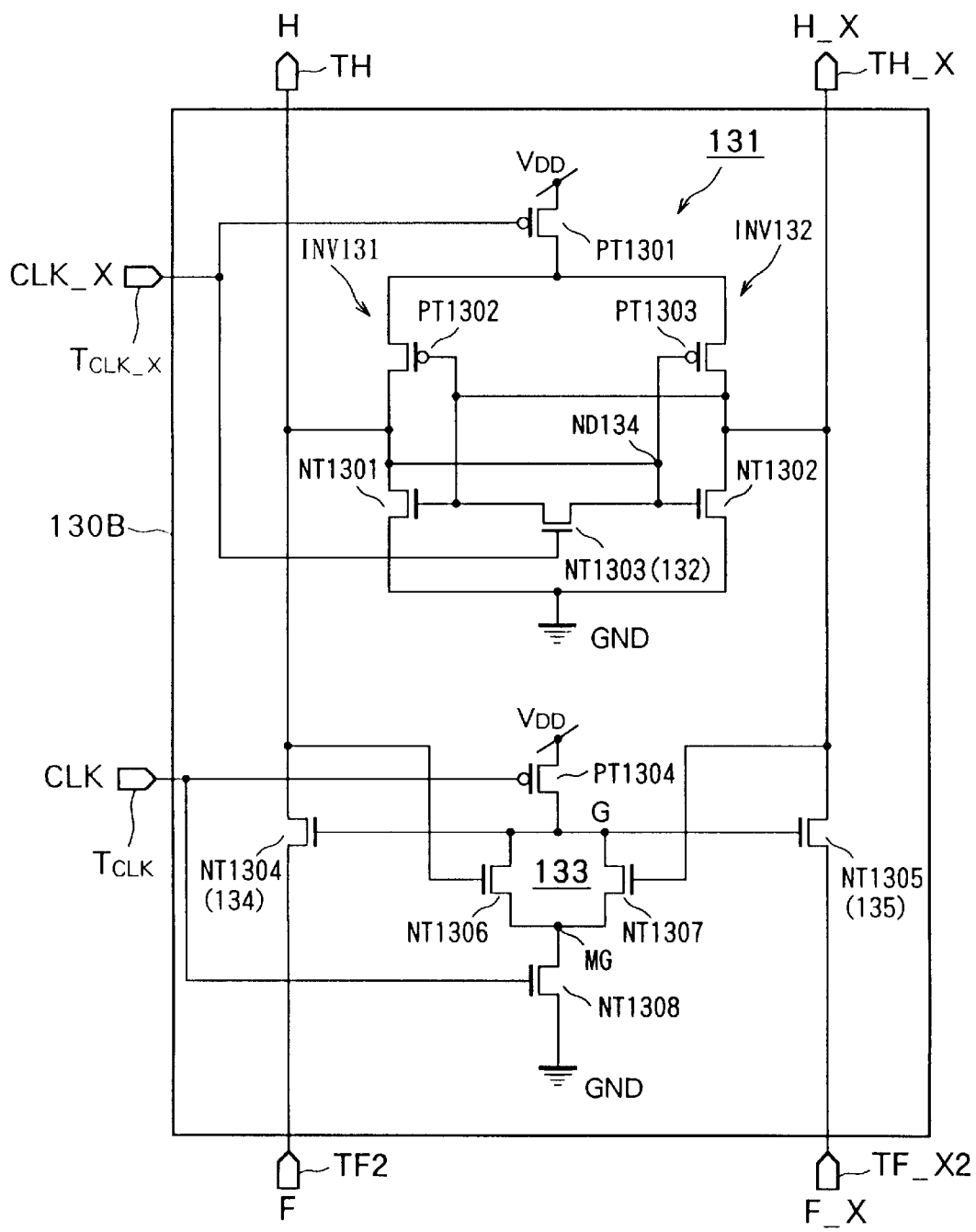
FIG. 17 is a circuit diagram of a second concrete example of the sensing latch unit according to the present invention.

FIG. 17 is a circuit diagram of a second concrete example of a sensing latch unit according to the present invention.

The difference of this sensing latch unit 130B from the sensing latch unit 130A of FIG. 16 resides in the fact that an NMOS transistor NT1308 is connected between the intermediate node MG serving as the connection point of the sources of the NMOS transistors NT1306 and NT1307 in the logic tree disconnection controlling unit and the ground, and the gate of this NMOS transistor NT1308 is connected to the clock input terminal TCLK.

The basic operation principle is the same as that of the first concrete example shown in FIG. 16. For this reason, a detailed explanation will be omitted.

The slight difference of the operation due to the addition of the NMOS transistor NT1308 resides in the process of the transition from the final determination stage to the idle stage.

In this transition step, the turning ON of the PMOS transistor PT1304 and the cut off of the NMOS transistors NT1306 and NT1307 do not simultaneously occur.

For the cutoff of the NMOS transistors NT1306 and NT1307, a step of balanced distribution of charges on the nodes TH and TH_X and the outflow of charge by the NMOS diode becomes necessary.

For this reason, in the first concrete example of FIG. 16, there is an instant at which a through current flows through either of the NMOS transistor NT1306 or NT1307 after the PMOS transistor PT1304 becomes ON.

Contrary to this, in the second concrete example shown in FIG. 17, the passing-through current described above is not generated.

This is because, simultaneously with the turning ON of the PMOS transistor PT1304, the NMOS transistor NT1308 becomes cut off in synchronization with the same clock signal CLK.

Third Concrete Example of Sensing Latch Unit

Figure 18:
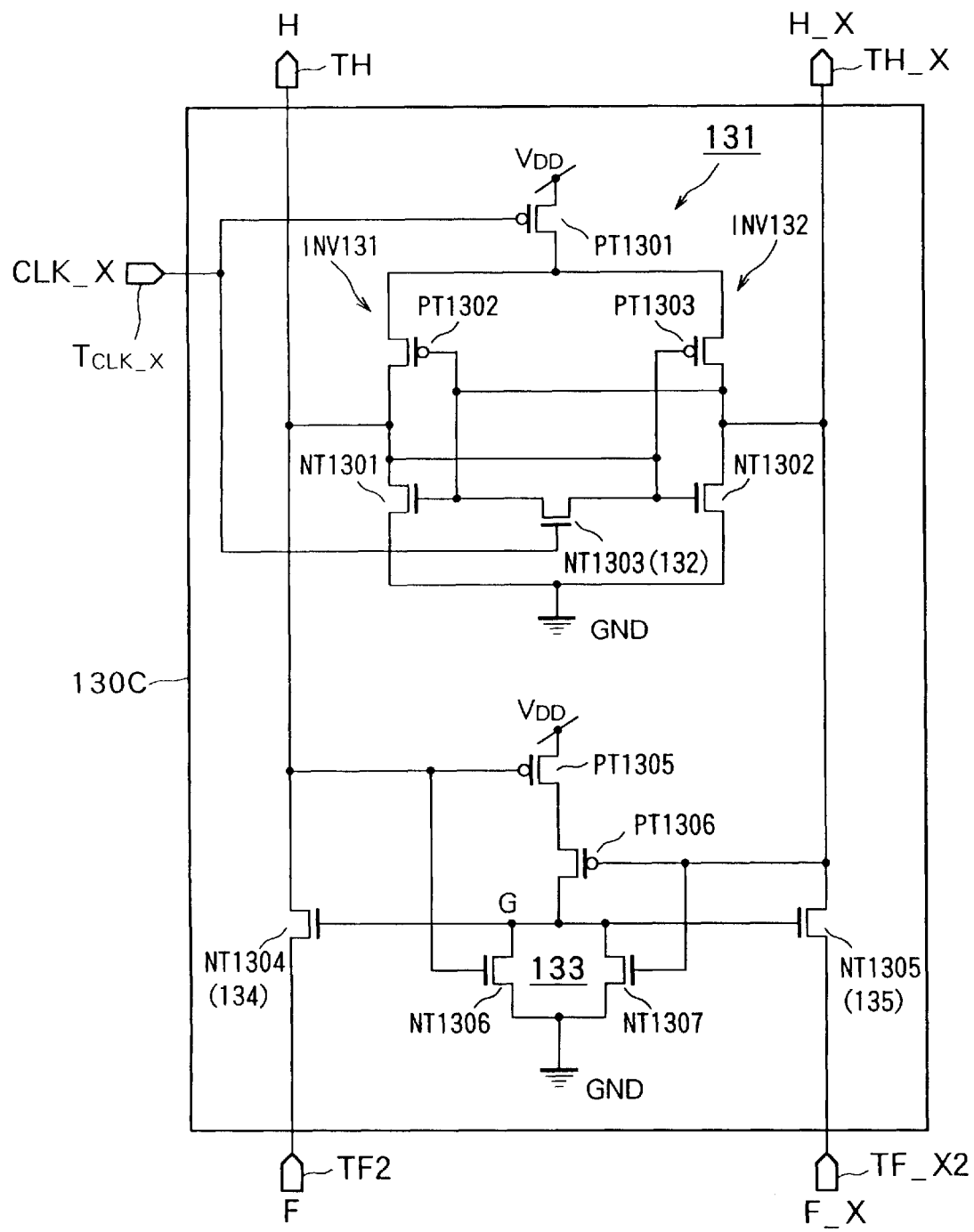
FIG. 18 is a circuit diagram of a third concrete example of the sensing latch unit according to the present invention.

FIG. 18 is a circuit diagram of a third concrete example of a sensing latch unit according to the present invention.

The difference of this sensing latch unit 130C from the sensing latch units 130A and 130B of FIG. 16 and FIG. 17 resides in the fact that the logic tree disconnection controlling unit has a static NOR logic circuit configuration in place of the dynamic NOR logic circuit configuration.

Specifically, the supply line of the power source voltage $V_{DD}$ and the control node G are connected by two serially connected PMOS transistors PT1305 and PT1306 in place of the precharge use PMOS transistor PT1304, the gate of the PMOS transistor PT1305 is connected to the logic output node TH, the gate of the PMOS transistor PT1306 is connected to the logic output node TH_X, and the logic tree disconnection controlling circuit is configured by the static NOR circuit S-NOR.

In this sensing latch unit 130C, the potential of the control node G is determined and the cut off of the logic tree is controlled not depending upon the clock signal (synchronization signal) CLK viewing the logic potentials of the nodes TH and TH_X.

Namely, in the idle stage, both of the nodes TH and TH_X have the logic "0", therefore the control node G is set to the logic "1". At the point of time when one of the nodes TH and TH_X becomes the logic "1" in the drive stage, the control node G is made the logic "0".

Since the PMOS transistors PT1305 and PT1306 are connected in series, current does not flow until both of the nodes TH and TH_X return to the logic "0", and the passing-through current is not generated.

Further, the advantage of the present third concrete example over the first and second concrete examples resides in the fact that the logic tree disconnection controlling unit does not need the clock signal (synchronization signal) CLK, so the additions for the clock signal (synchronization signal) CLK are reduced.

Next, an explanation will be given of results of a concrete comparison of the characteristics of a static CMOS logic circuit and a logic circuit according to the present invention by simulation.

The glitches in the static CMOS logic circuit were taken up as the problem of the conventional example. A SPICE simulation was carried out by using the logical function and input signal patterns (those in which A, B, C, and D change at a variety of timings) used as the example at this time.

Figure 1:
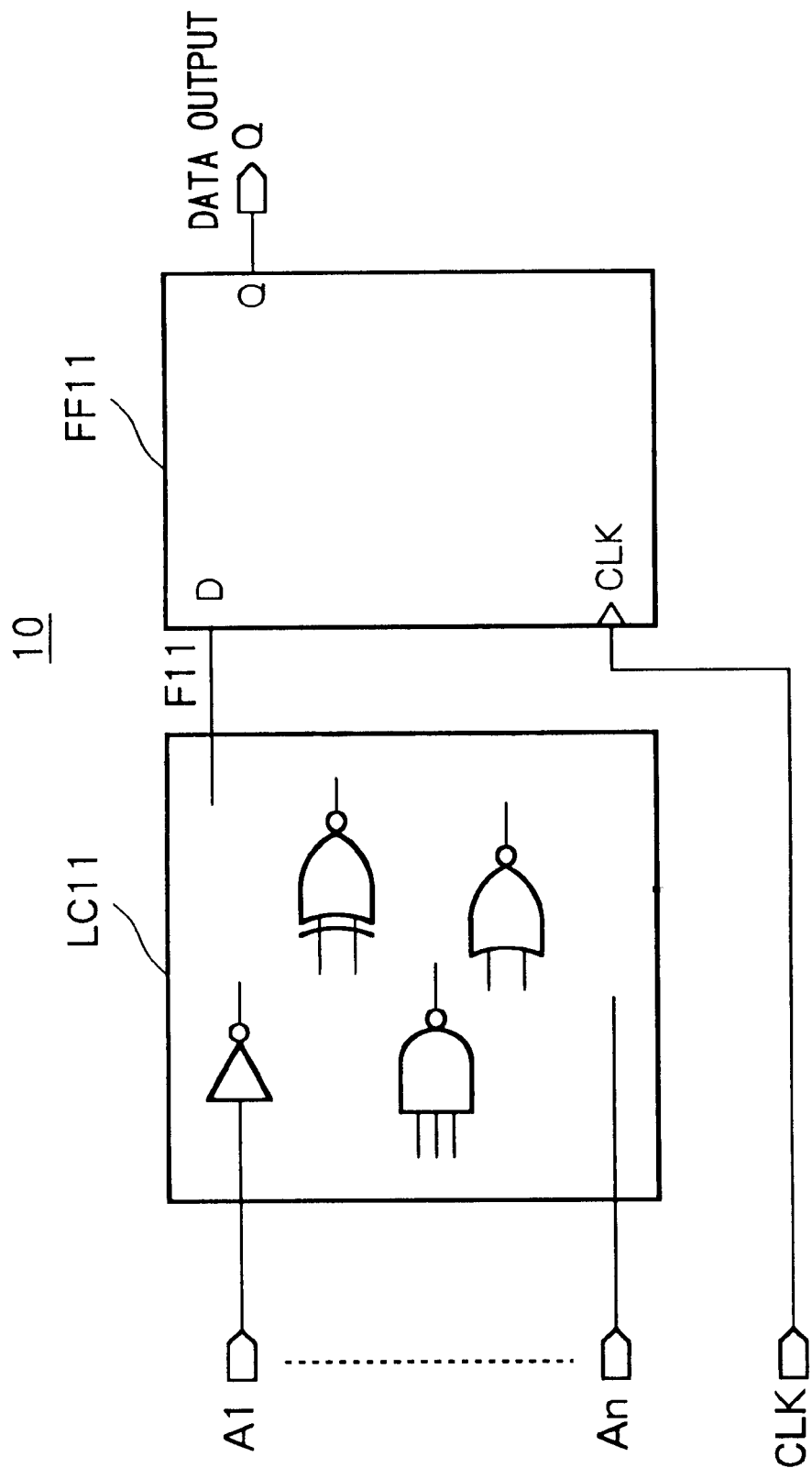
FIG. 1 is a view showing a first conventional example realized a general structure comprised of a flip-flop and logic gates at its data input by a static CMOS logic circuit.
Figure 2:
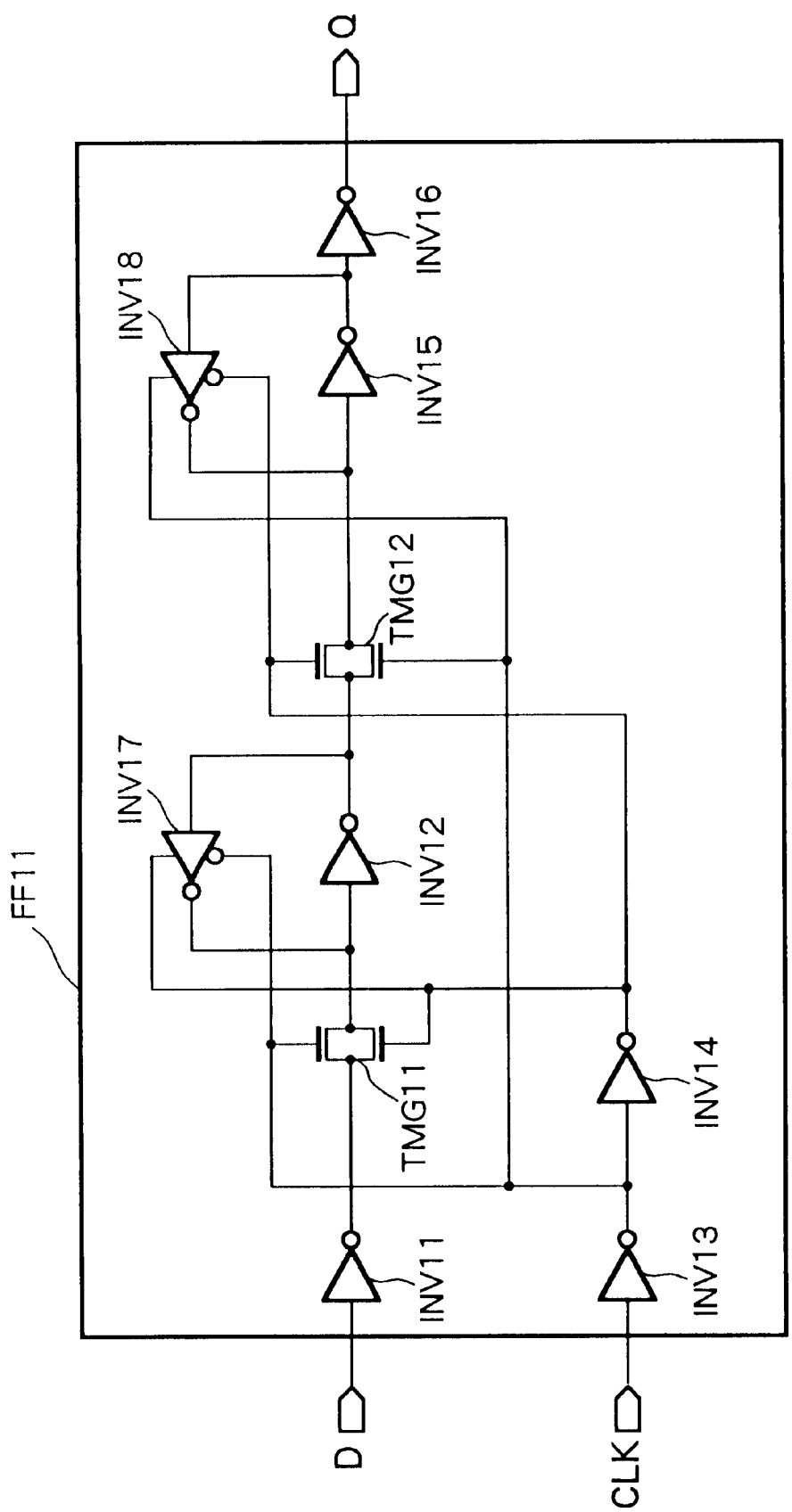
FIG. 2 is a circuit diagram of a transistor level of the flip-flop of FIG. 1.
Figure 3:
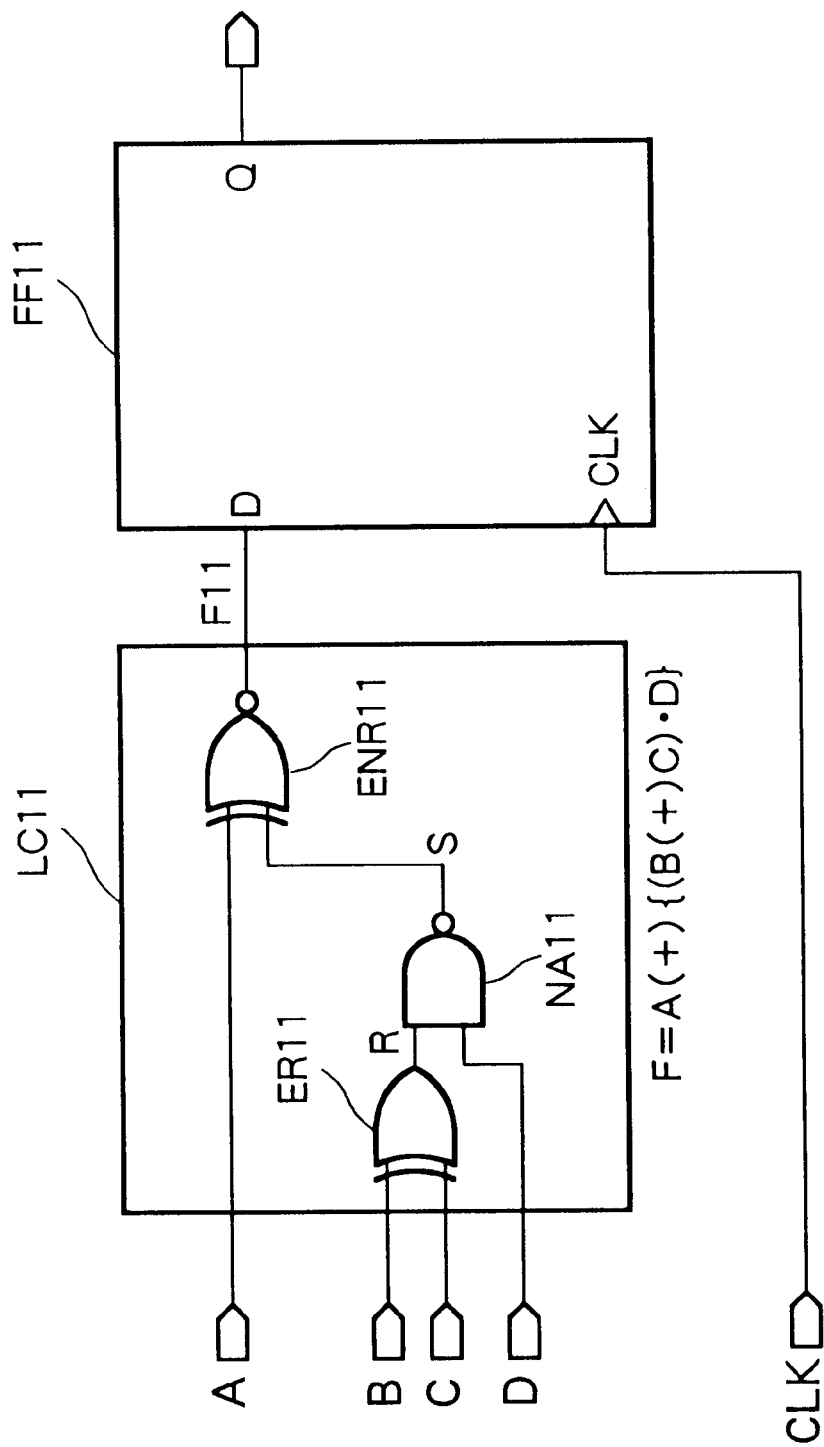
FIG. 3 is a circuit diagram of an example of the configuration of a combinational logic circuit of FIG. 1.
Figure 4:
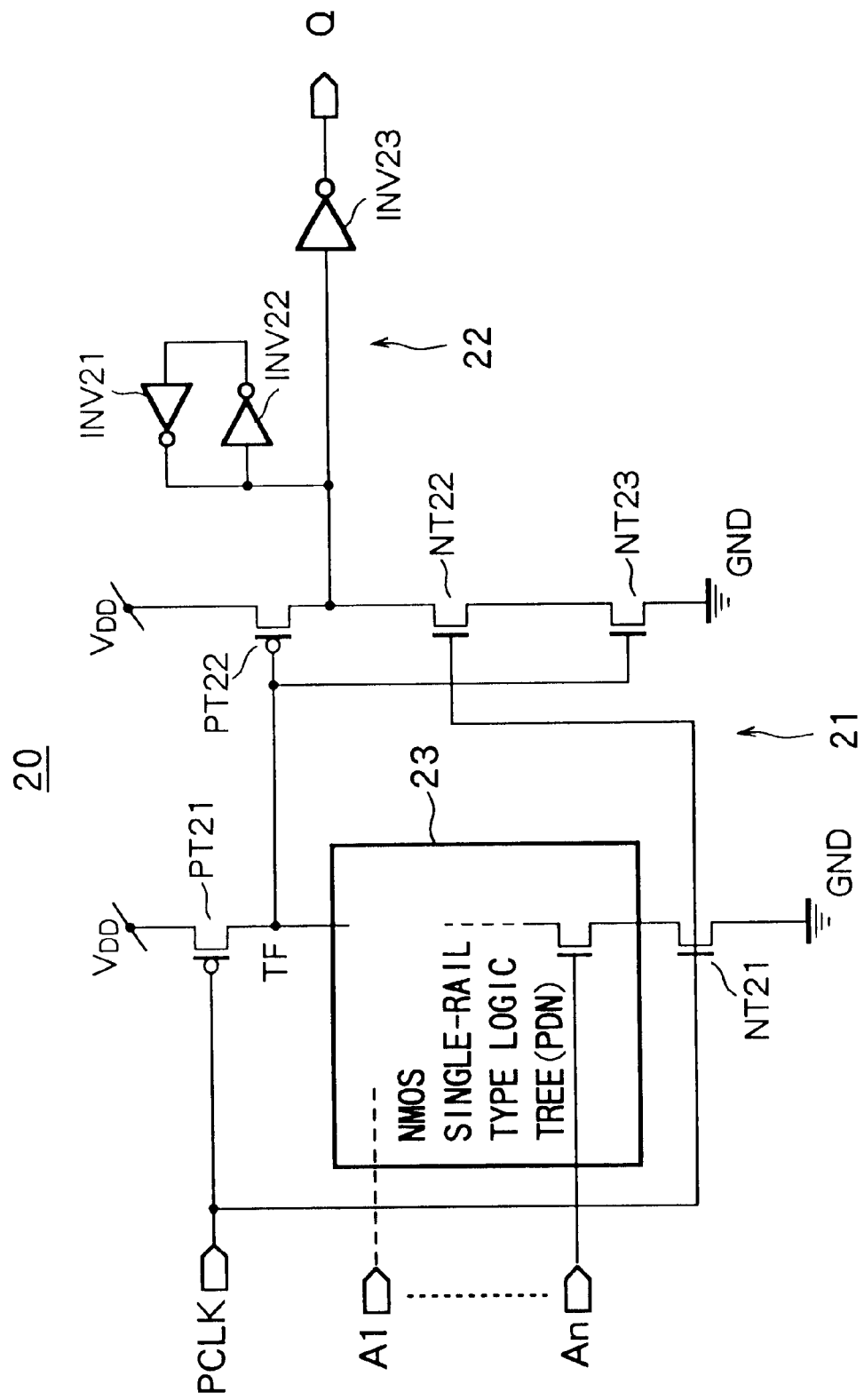
FIG. 4 is a circuit diagram of the general configuration of a PDN-F/F logic circuit.
Figure 5:
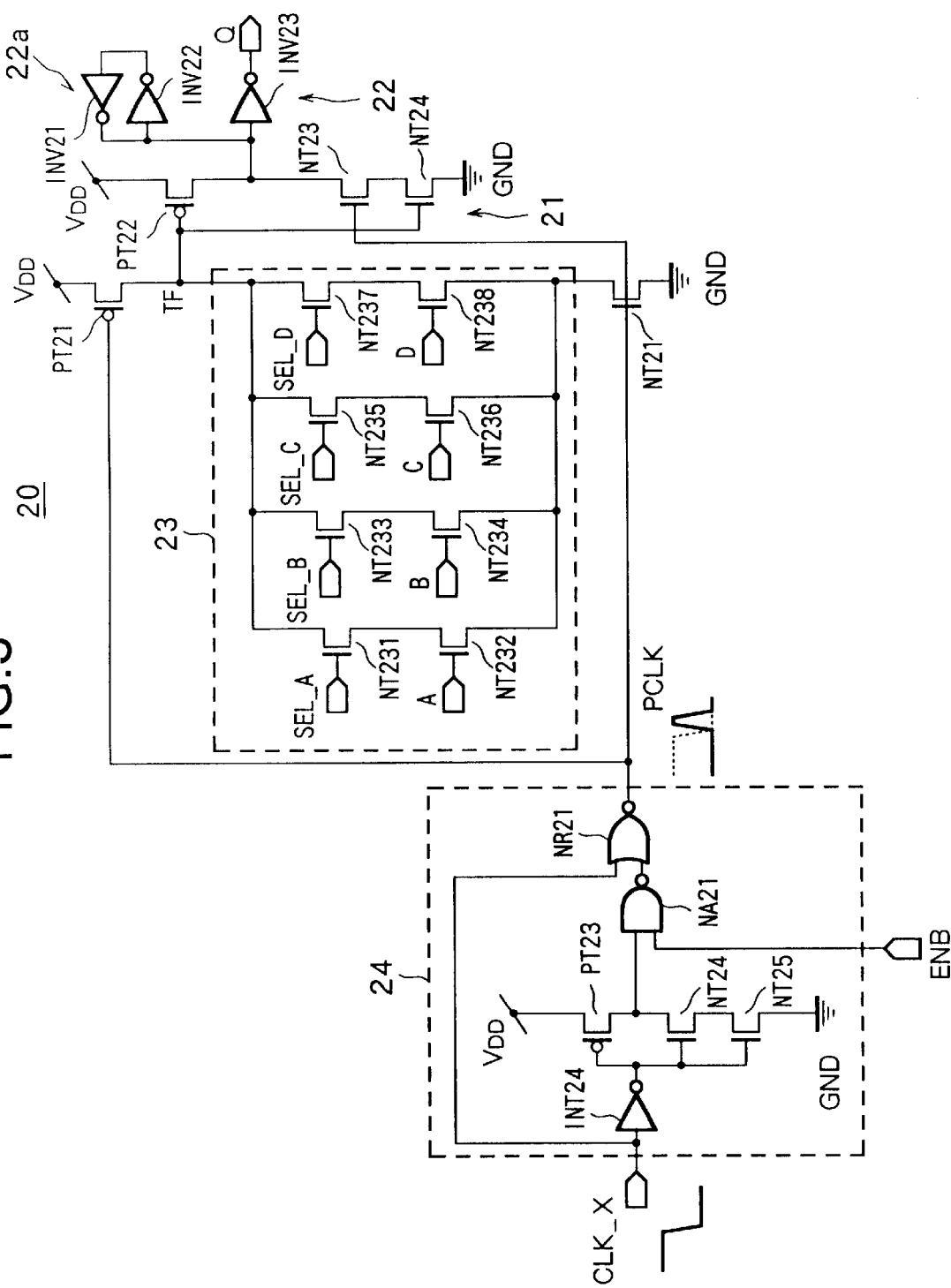
FIG. 5 is a circuit diagram of an example of the concrete configuration of a PDN-F/F logic circuit mounting the logical function of one multiplexer thereon.
Figure 6:
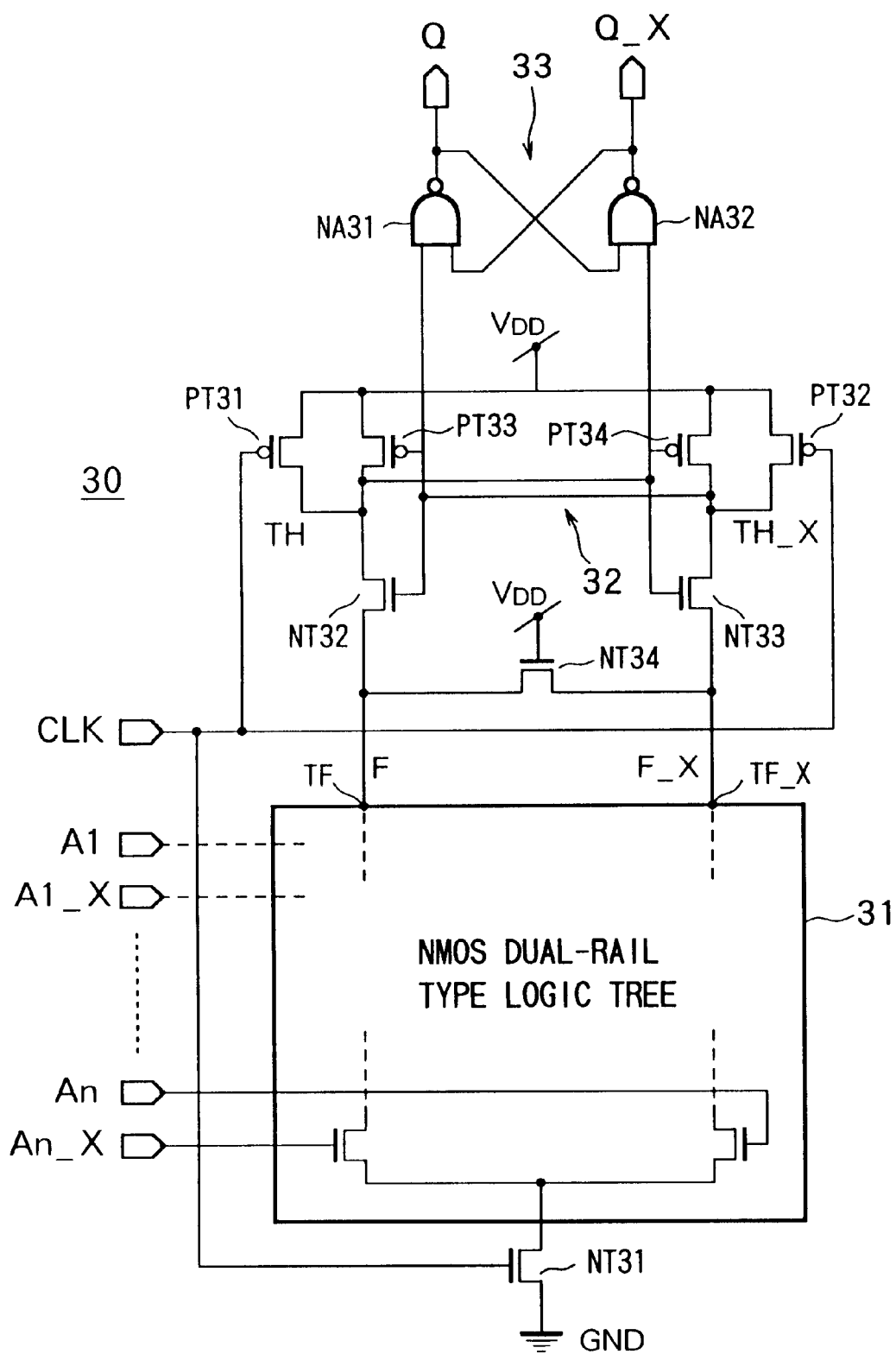
FIG. 6 is a circuit diagram of the general configuration of an SA-F/F logic circuit.
Figure 7:
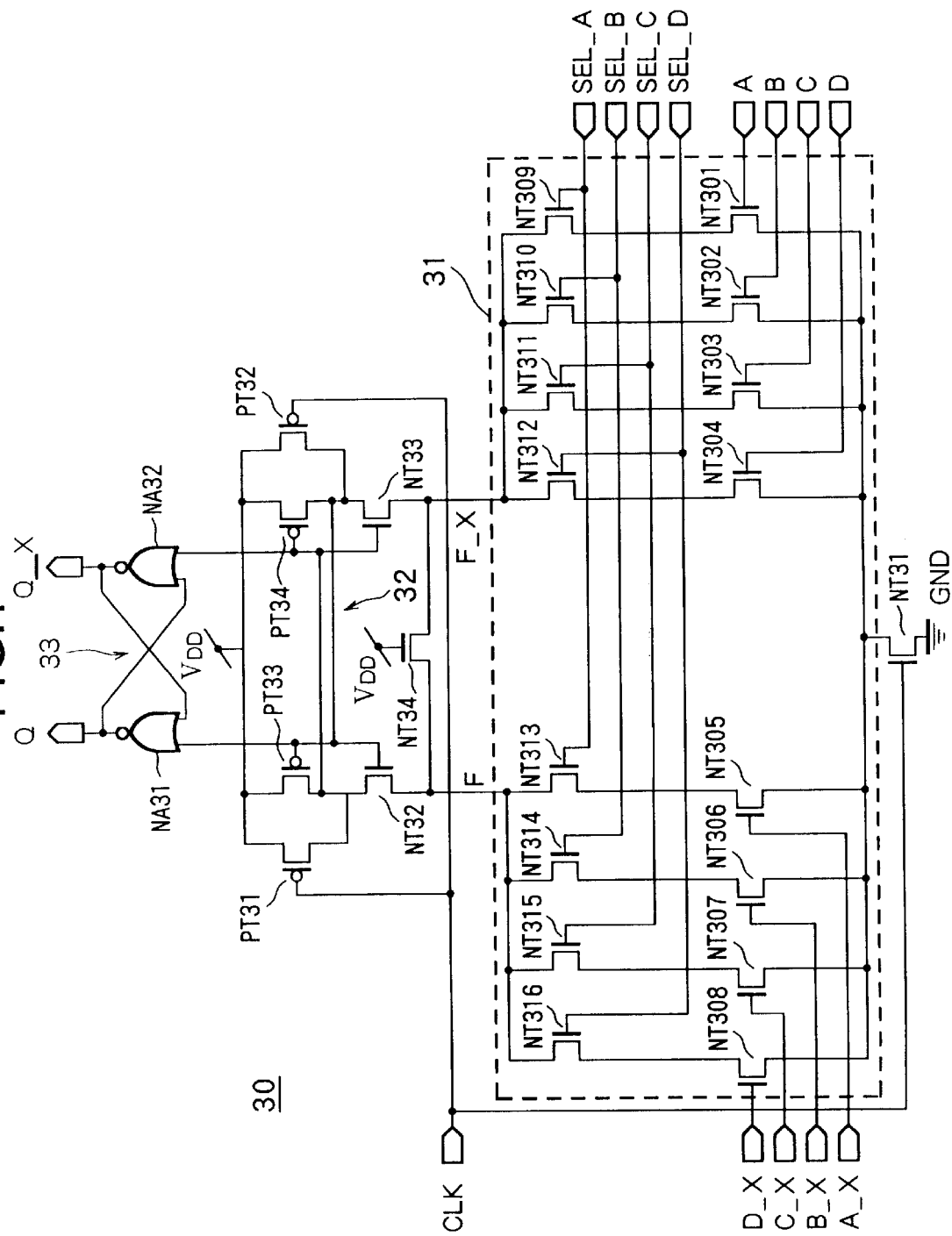
FIG. 7 is a circuit diagram of an example of the concrete configuration of a SA-F/F logic circuit mounting the logical function of one multiplexer thereon.
Figure 8:
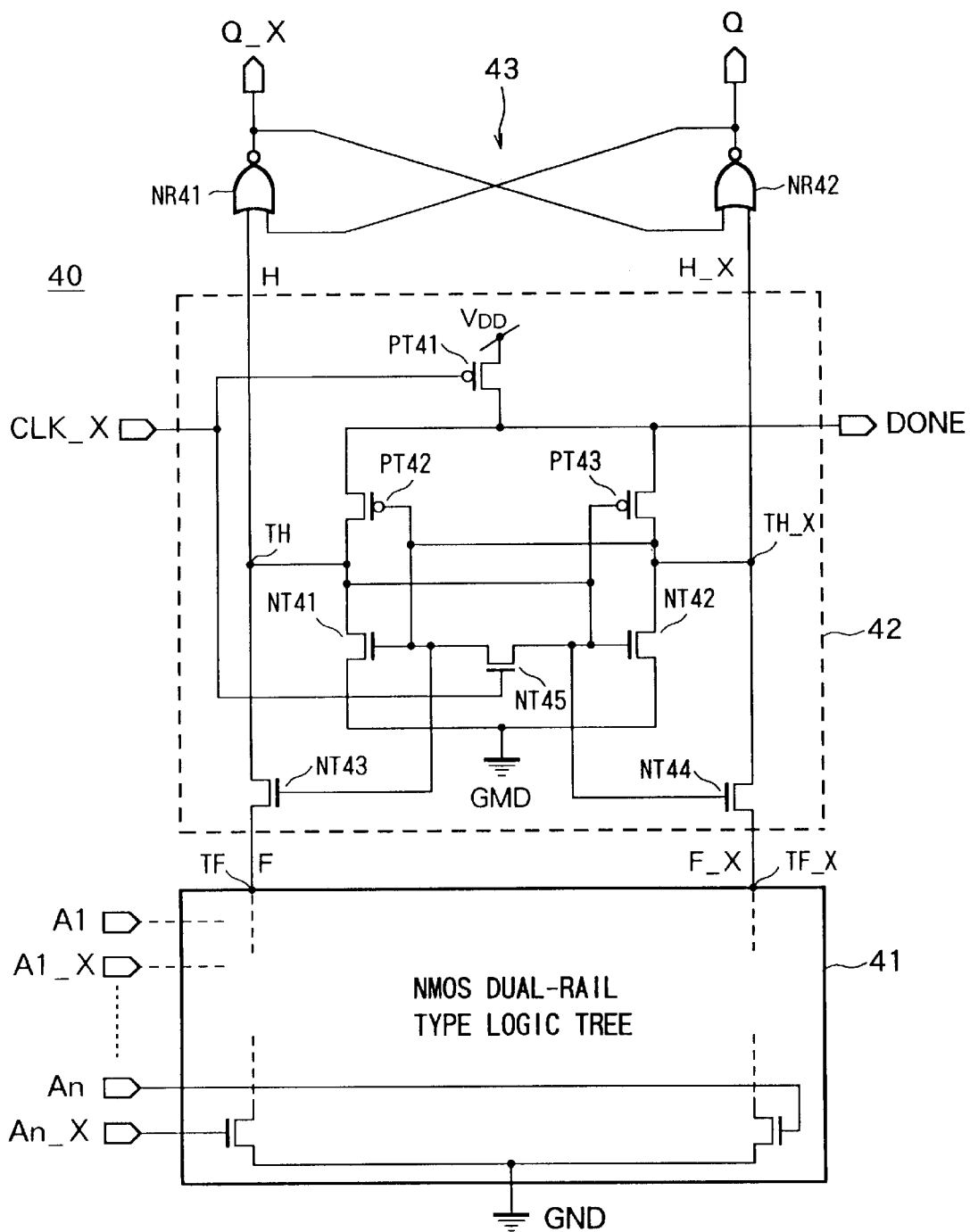
FIG. 8 is a circuit diagram of the general configuration of a DCSL circuit.
Figure 19:
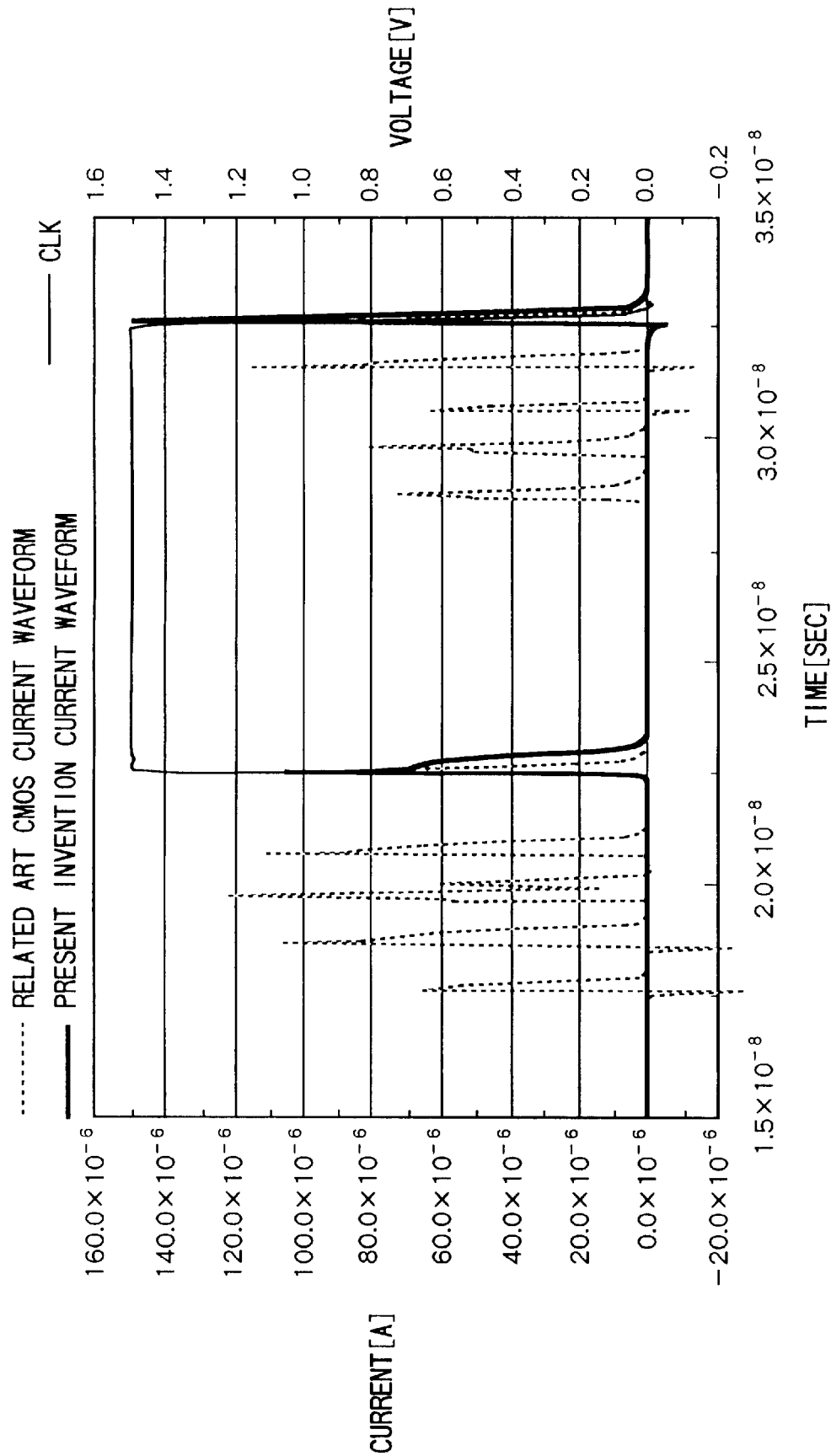
FIG. 19 is a view showing current waveforms in a conventional CMOS logic circuit shown in FIG. 4 and the logic circuit according to the present invention.

FIG. 19 is a view of current waveforms in the conventional CMOS logic circuit shown in FIG. 4 and the logic circuit according to the present invention.

In FIG. 19, an abscissa represents the time, and an ordinate represents the current and the voltage.

Further, in FIG. 19, the characteristic curve indicated by a solid line is the current waveform of the circuit of the present invention, while the characteristic curve indicated by a broken line is the current waveform of the conventional circuit.

As apparent from FIG. 19, in the static CMOS logic circuit, the logic circuit operates whenever a change occurs in the input signal and current is consumed.

Contrary to this, in the circuit of the present invention, current is consumed only at the point of time when the clock signal (synchronization signal) CLK changes.

Accordingly, it is obvious that the circuit of the present invention has realized a reduction of the power consumption in comparison with the conventional circuit.

Next, the delay characteristics of the static CMOS logic circuit and the logic circuit of the present invention will be compared.

Figure 20:
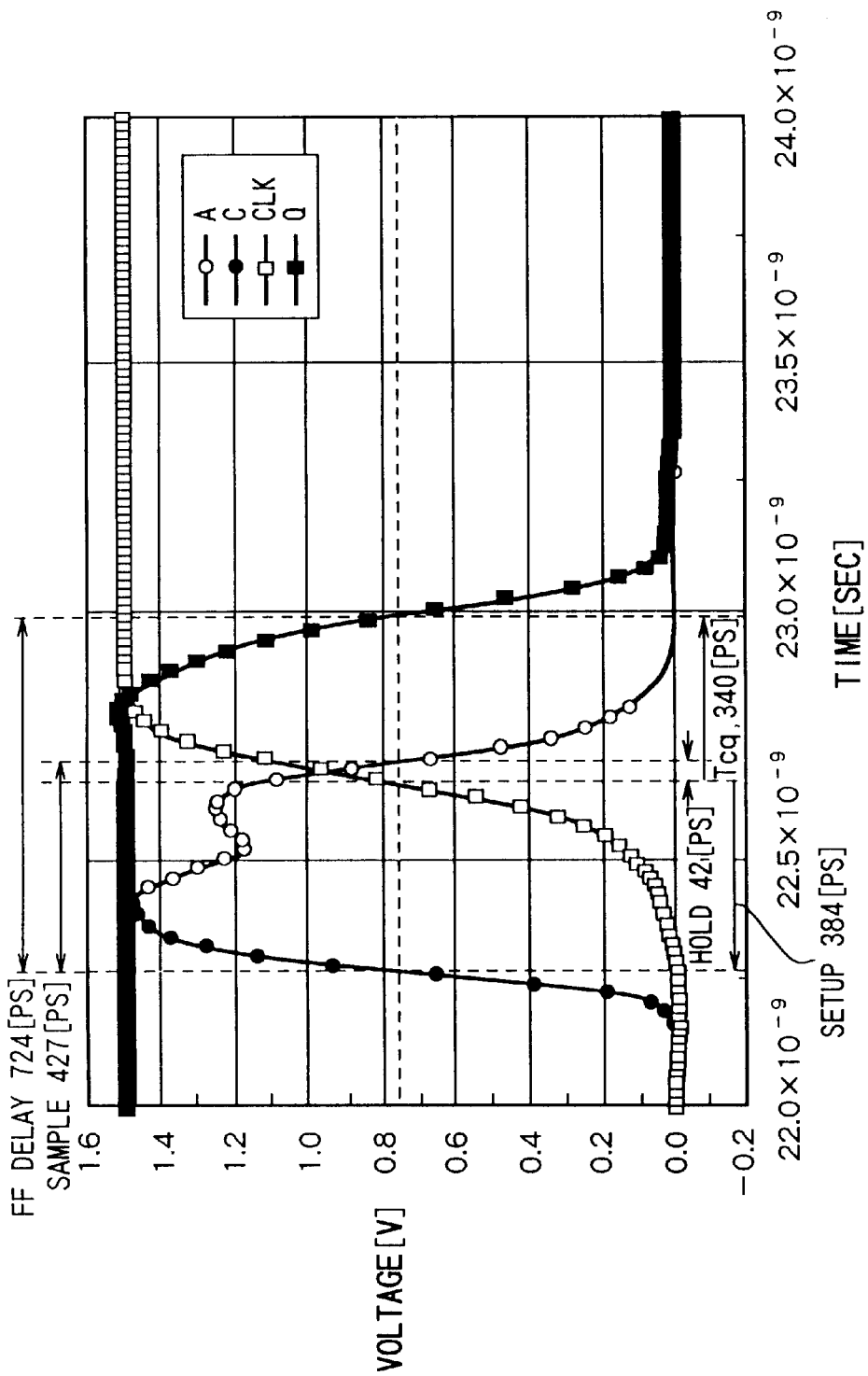
FIG. 20 is a view showing an operation delay characteristic of the static CMOS logic circuit.
Figure 21:
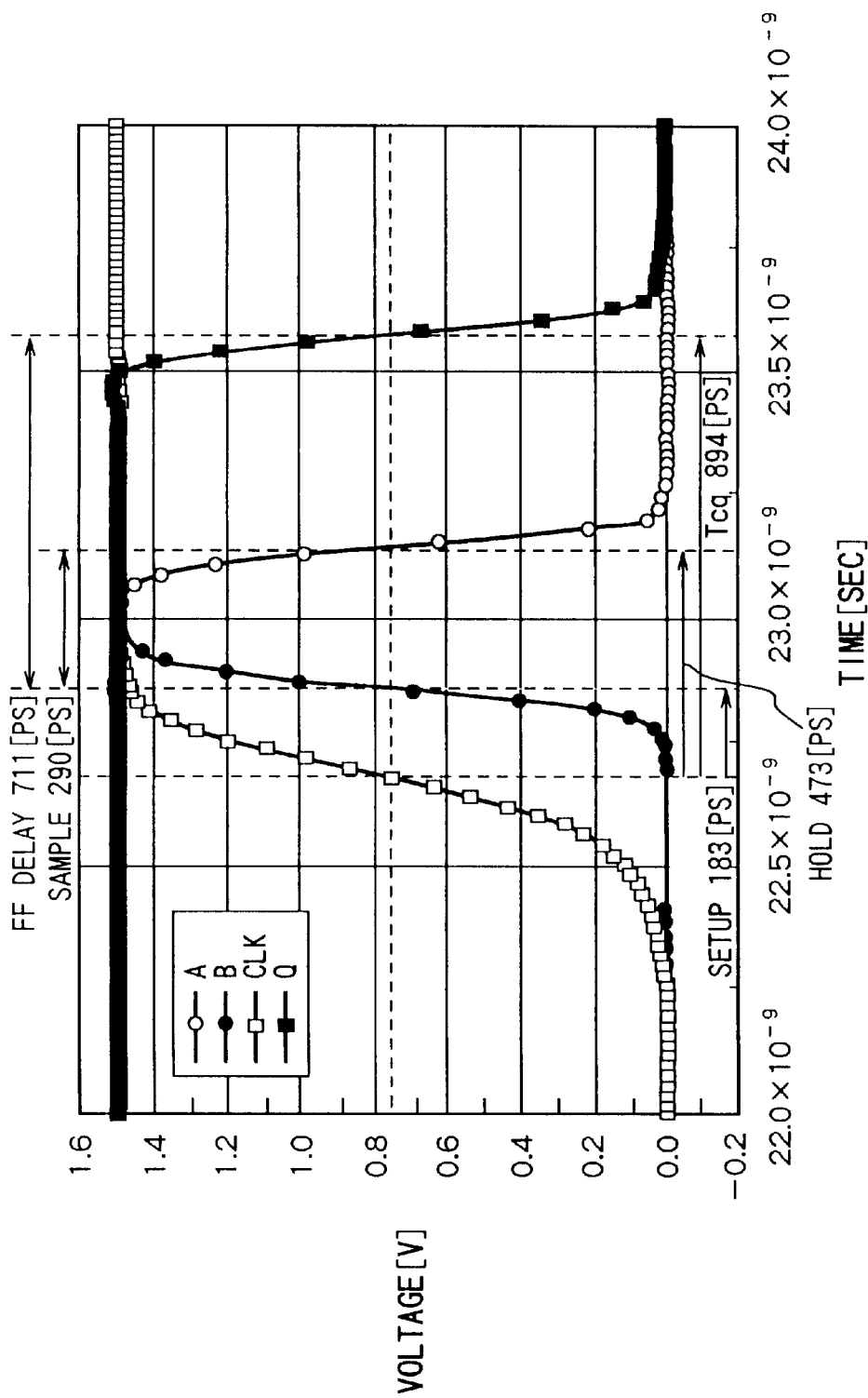
FIG. 21 is a view showing the operation delay characteristic of the logic circuit according to the present invention.

FIG. 20 is a view of an operation delay characteristic of the static CMOS logic circuit, and FIG. 21 is a view of the operation delay characteristic of the logic circuit of the present invention.

In FIG. 20 and FIG. 21, the abscissa represents the time, and the ordinate represents the voltage.

This investigates the set-up time relating to the input signal C and the clock signal (synchronization signal) CLK, the hold time relating to the input signal A and the clock signal (synchronization signal) CLK, and the delay relating to the output Q and the clock signal (synchronization signal) CLK (Clock to Q: simply Tcq)

Unlike an ordinary flip-flop, all of the input signals of the logical function have a set-up time and hold time with respect to the clock signal (synchronization signal) CLK. The particularly important signals are the signal which is transferred to the logical function output F fastest and the signal transferred slowest.

In the conventional circuit of FIG. 4, as seen from FIG. 20, the fastest transferred signal is "A", and the slowest transferred signal is "C".

There are three measurement values relating to the delay characteristic of the flip-flop: the set-up time, hold time, and Tcq mentioned above. These measurement values all use the clock signal (synchronization signal) CLK as a reference.

In the method of realization of the circuit of the present invention and the logic circuit using another flip-flop, in principle, the synchronization timings with respect to the clock signal (synchronization signal) CLK are different. For this reason, there are cases where the set-up time and the hold time become negative. This makes this unsuitable for comparison. Accordingly, it is better for the comparison if the sum of the set-up time and the hold time is defined as the sample time (Sample in the figure) and the sum of the set-up time and Tcq is defined as the delay time (FFDelay in the figure).

The "sample time" just means the time of sampling the input signals not permitting a change of the input signal.

The "delay time" means the time which is consumed by the flip-flop and the logical function part in one cycle. In both of them, the shorter the time, the better the performance.

When comparing the delay characteristics of the conventional CMOS logic circuit and the circuit of the present invention based on the above, the sample time becomes 427 ps in the conventional circuit as shown in FIG. 20, while becomes 711 ps in the circuit of the present invention as shown in FIG. 21.

At both times, the circuit of the present invention is superior.

Accordingly, according to the logic circuit of the present invention, the first object of the present invention, that is, the elimination of glitches to reduce the power consumption and the realization of high speed operation by making good use of the characteristics of the dynamic logic circuit, was achieved.

Further, the second object of the present invention was the eliminate the mechanism for generating a pulse having a short width as in the PDN-F/F logic circuit and facilitating design by the automatic placement and routing by CAD.

As already repeatedly mentioned, in the present invention, the sensing latch unit 130 and the NMOS dual-rail type logic tree portion 110 are employed.

By these two mechanisms, it is possible to autonomously detect the final determination of the logic and block the input signal. In principle, no pulse generation mechanism is needed.

Accordingly, the second object was achieved.

Next, the superiority of the circuit of the present invention over the SA-F/F logic circuit explained as the third conventional example will be mentioned.

The problem of the SA-F/F logic circuit resides in that the time required for the final determination of the logic definition closely depended upon the height of the logic tree and the size of the MOS transistors in the logic tree.

Since the height of the logic tree represents the number of input signals of the logical function, the more complex the logical function, the larger the time for final determination of the logic.

At the time of a complex logical function, it is possible to make the gate width of the transistor larger and make the conduction resistance thereof smaller to shorten the logic definition time. However, the size of the logic tree at that time becomes large.

The time for final determination of the logic directly appears in Tcq.

Accordingly, the change of the Tcq with respect to the height of the logic tree and the change of the Tcq with respect to the NMOS size in the logic tree were investigated.

Figure 22:
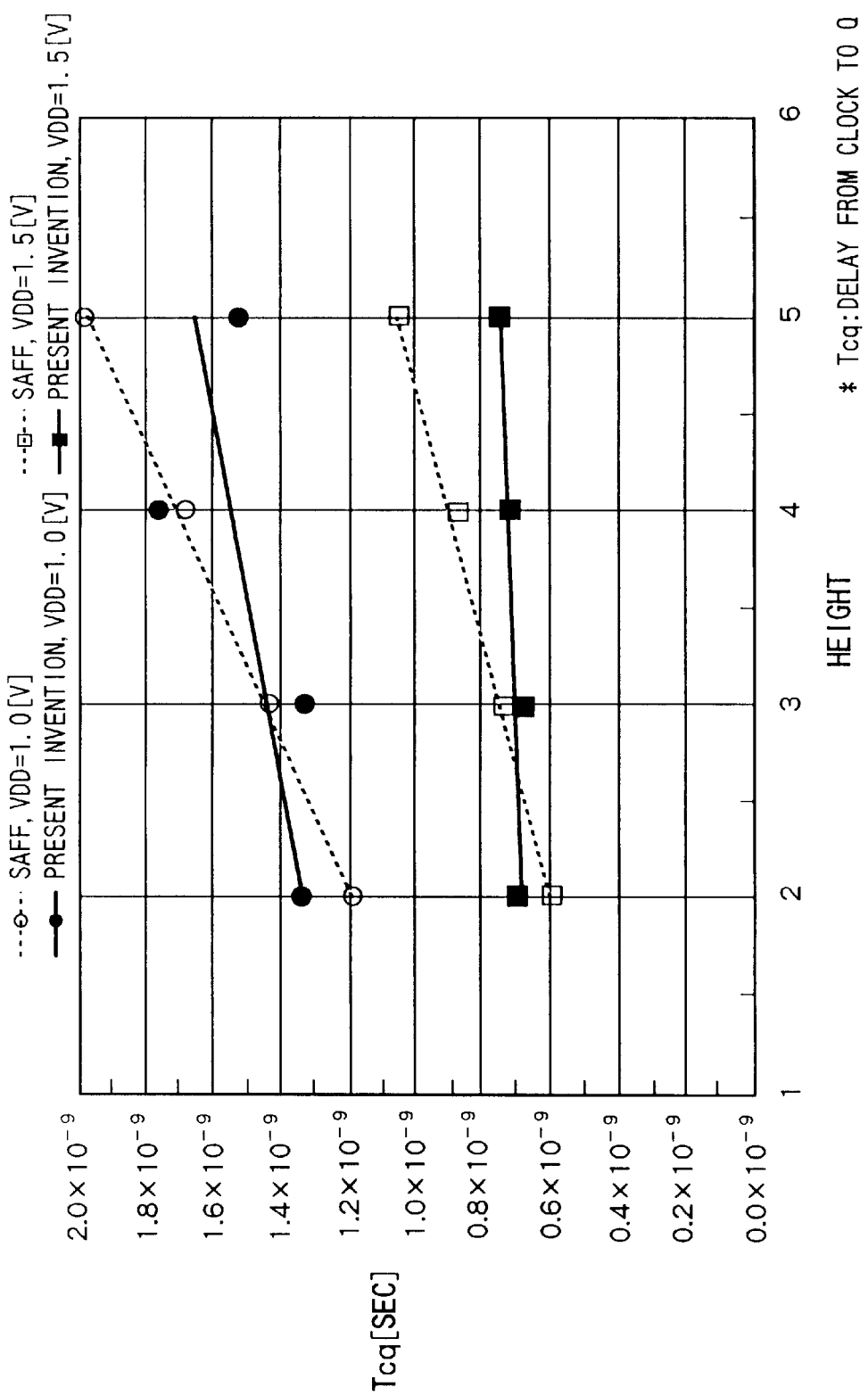
FIG. 22 is a view showing the characteristic of the Tcq versus the height of the logic tree in an SA-F/F logic circuit and the circuit of the present invention.
Figure 23:
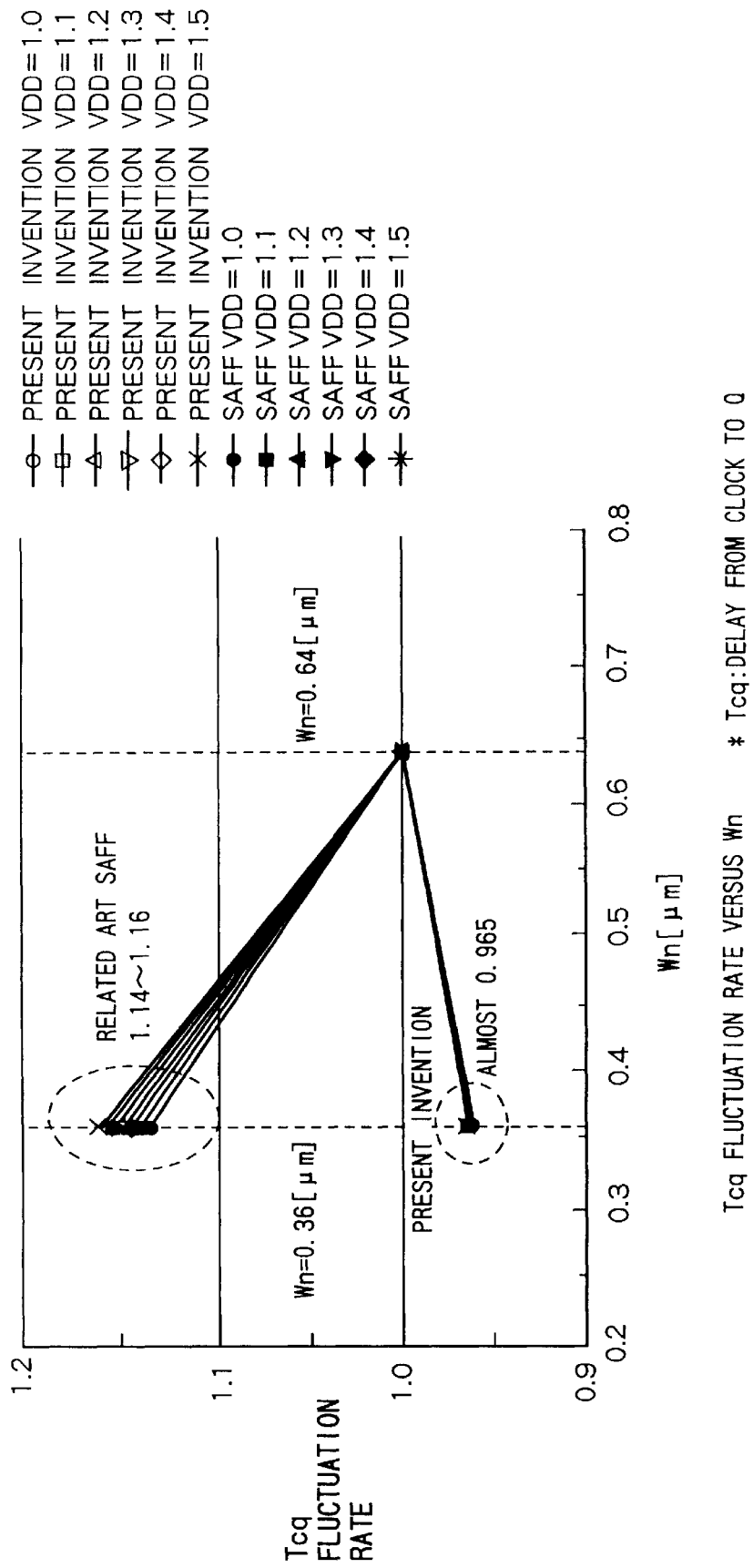
FIG. 23 is a view showing the characteristic of the Tcg versus the logic tree NMOS size (Wn) in the SA-F/F logic circuit and the circuit of the present invention.

FIG. 22 is a view of the characteristic of the Tcq versus the height of the logic tree in the SA-F/F logic circuit and the circuit of the present invention, while FIG. 23 is a view of the characteristic of the Tcq versus the logic tree NMOS size (Wn) in the SA-F/F logic circuit and the circuit of the present invention.

In FIG. 22, the abscissa represents the height of the logic tree, and the ordinate represents the Tcq, while in FIG. 23, the abscissa represents the NMOS size of the logic tree, and the ordinate represents the Tcq fluctuation rate.

Further, in the figure, the black marks indicate the characteristic of the SA-F/F logic circuit, while the white marks and x marks indicate the characteristics of the circuit of the present invention.

As apparent from FIG. 22, the dependency of the Tcq on the height of the logic tree is smaller in the circuit of the present invention. As the logic tree becomes higher, the circuit of the present invention operates at a higher speed.

Further, FIG. 23 specifically shows the rate of fluctuation of the Tcq when the size Wn of the NMOS transistor in the logic tree is changed from 0.64 μm to 0.36 μm. The height of the logic tree at this time is 5.

As apparent from the figure, the dependency of the size Wn is smaller in the circuit of the present invention. Not only this, there is the tendency that the smaller the size Wn, the higher the speed.

In the SA-F/F logic circuit, the potentials of the nodes in the sense amplifier and the nodes of the logic tree start from the potential of the logic "1" or the potential near this and are pulled down to the potential of the complete logic "0".

Contrary to this, in the circuit of the present invention, they are started from the potential of the logic "0" or the potential near this and are boosted up to the potential of the complete logic "1".

The potentials are pulled down through the logic tree, therefore the SA-F/F logic circuit naturally depends upon the height of the logic tree or Wn.

However, the height of the logic tree is not that relevant to the boosting of the potential. The smaller the size Wn, the smaller the capacity component possessed by the logic tree, therefore a smaller size Wn is rather advantageous for boosting the voltage.

Accordingly, the superiority of the circuit of the present invention over an SA-F/F logic circuit when realizing a complex logical function is clear. The object of the present invention, that is, the realization of high speed operation even in the case of realizing a complex logical function having many input signals, was achieved.

Further, the fourth object of the present invention was the realization of an operation resistant to variations of the circuit constant and coupling noise and stabler than that by a DCSL circuit.

One of the causes for the susceptibility of the DCSL circuit to incorrect potential fluctuations is the fact that the voltage applied to the gate terminal of the switch comprising the NMOS transistors performing the connection and disconnection of the logic tree and the sense amplifier is low, i.e., about the threshold value of the NMOS transistor.

Since these NMOS switches do not sufficiently become ON, the conduction resistance is high, so the incorrect potential fluctuation occurring due to the variation of the circuit constant and the coupling noise cannot be absorbed.

In the logic circuit according to the present invention, the connection and the disconnection of the logic tree 110 and the sense amplifier 131 are carried out by the control node G in the sensing latch unit 130.

In the control node G, the charge is supplied by the PMOS transistor, and the potential of the complete logic "1" is given. For this reason, the NMOS transistors NT1304 and NT1305 serving as the switches 134 and 135 become sufficiently ON, have small conduction resistances, and can easily absorb incorrect potential fluctuation.

Further, as another factor, it can be considered that the potentials added to the gate terminals of the NMOS transistors serving as the switches are different nodes.

Figures 9A, 9B:
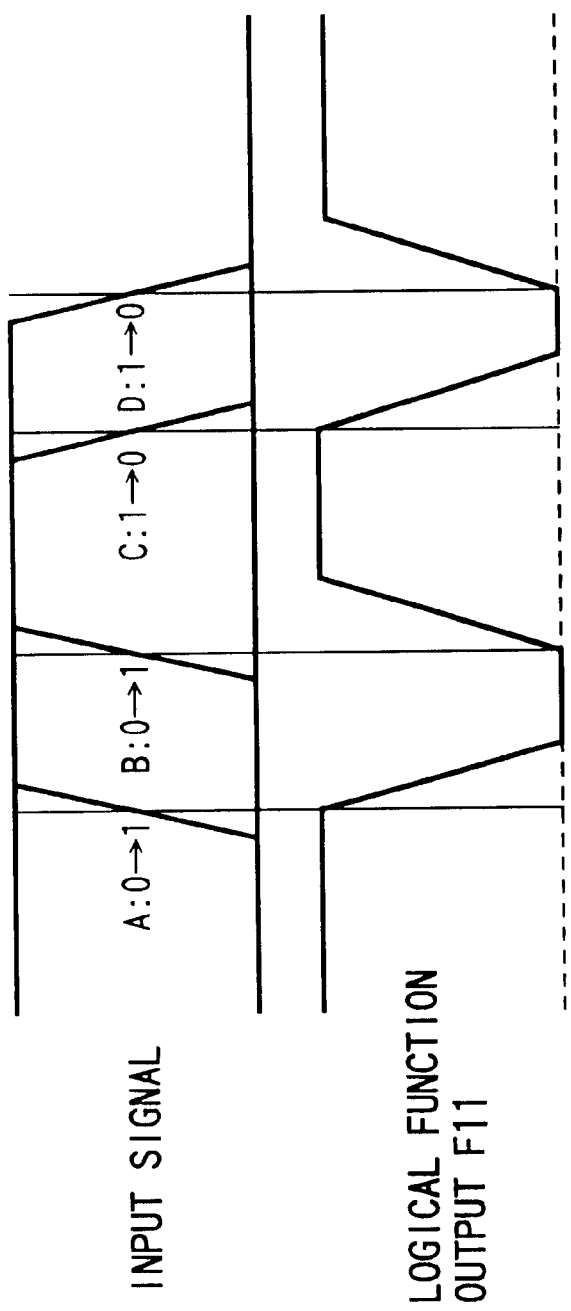
FIGS. 9A and 9B are views for explaining the problems of the first conventional example.

Namely, in the circuit of FIG. 9, the node TH_X is connected to the gate terminal of the NMOS transistor NT43, while the node TH is connected to the gate terminal of the NMOS transistor NT44.

When the sense amplifier is in the drive state (CLK_X= 0), the nodes TH and TH_X are cut off and do not become the same potential. The potential difference between the nodes TH and TH_X is immediately enlarged by the sense amplifier, and the logic tree and the sense amplifier are disconnected.

Accordingly, the incorrect potential difference produced between the nodes TH and TH_X is enlarged and ends up being finally determined as the erroneous logic value.

Contrary to this, in the sensing latch unit 130 of the present invention, the turning ON and OFF of the NMOS transistors NT1304 and NT1305 serving as the switches 134 and 135 are controlled by the common control node G.

Even if incorrect potential fluctuation occurs at the nodes TH and TH_X, so far as the potentials do not become high enough to be recognized as the logic "1", the potential of the control node G remains at the logic "1", and the sense amplifier 131 and the logic tree 110 are not disconnected.

During this period, interference occurs between the path of the logic tree 110 reaching the ground and the sense amplifier 131, the logic tree 110 absorbs the incorrect potential fluctuation, and the sense amplifier is guided to the correct logic value.

Figure 24:
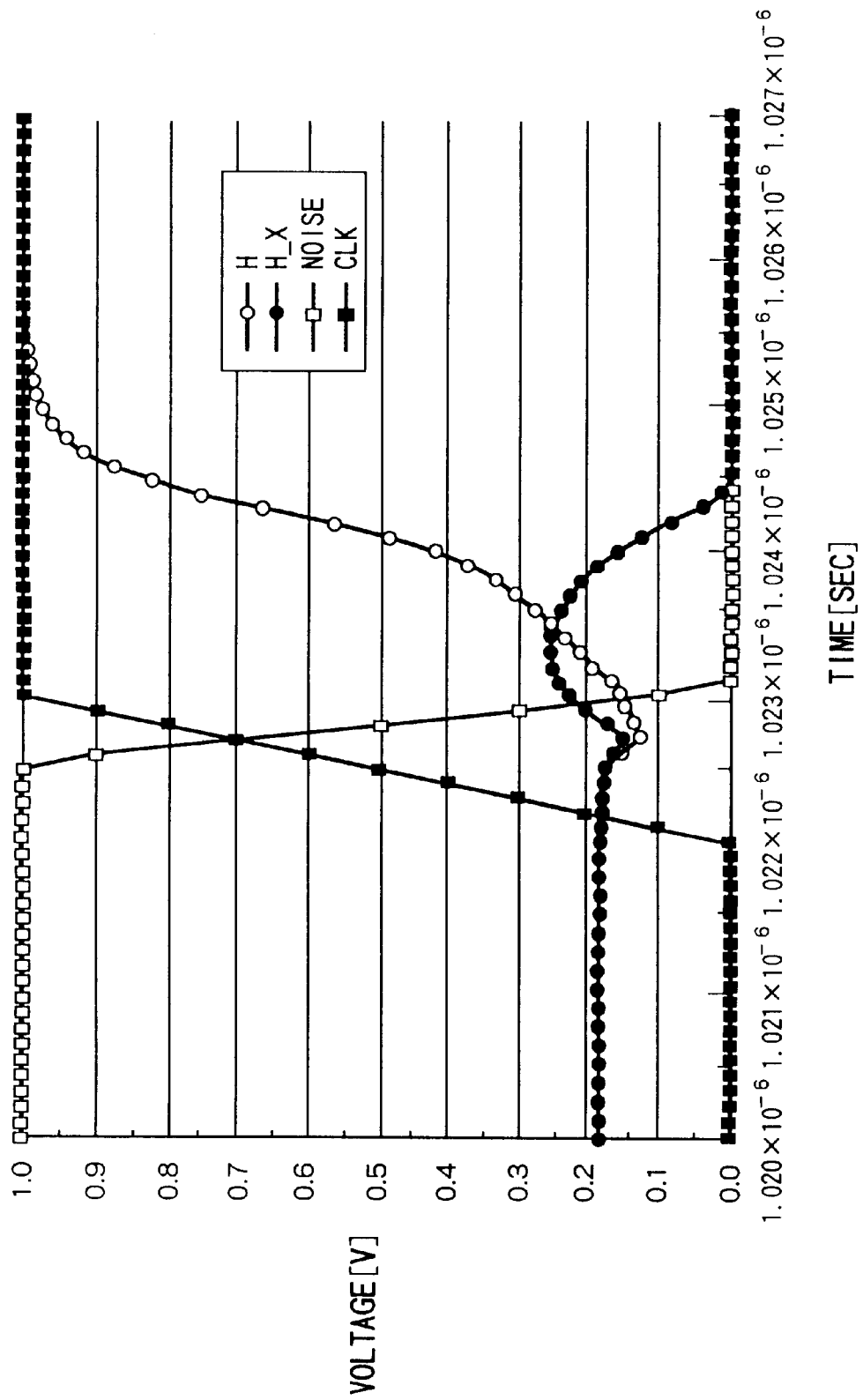
FIG. 24 is a view showing a process by which the sensing latch unit according to the present invention absorbs an incorrect potential fluctuation and finally sets potentials to correct logic values.

FIG. 24 is a view of the process by which the sensing latch unit according to the present invention absorbs the Incorrect potential fluctuation and the correct logic value is finally set to.

In FIG. 24, the abscissa represents the time, and the ordinate represents the voltage.

FIG. 24 concretely shows the situation where noise lowering the potential of the node TH is given in the process by which the node TH is finally determined as the original logic "1".

In FIG. 24, there is a period during which the potential of the node TH is lower than that of the node TH_X due to the effect of the noise at the start of the drive stage.

However, it then recovers and the potential of the node TH becomes higher than the node TH_X and is finally determined as the logic "1". Such an operation is impossible in a DCSL circuit.

Accordingly, the fourth object was achieved.

Further, in the logic circuit according to the present invention, in the idle stage, the sense amplifier and the logic tree are connected, and all of nodes in the sense amplifier and the nodes of the logic tree are short-circuited and initialized to the same potential.

Accordingly, according to the circuit of the present invention, there is also the advantage that a malfunction due to an imbalance of the parasitic capacitance in the logic tree can be prevented.

As explained above, since the first embodiment is configured provided with the NMOS dual-rail type logic tree portion 110 in which when the input signal of the logical function is given, one of the logic tree ends TF and TF_X always has a path reaching the ground and the other always becomes a high impedance state, the SR latch unit 120 which receives at its set (S) terminal the logic output H from the output node TH of the sensing latch unit 130 and receives at its reset (R) terminal the logic output H_X from the output node TH_X of the sensing latch unit 130, holds the logic output of the sensing latch unit 130, and outputs the data from the Q output, and the sensing latch unit 130 having the sense amplifier 131 operating by the drive control, the switch 132 for short-circuiting the nodes TH and TH_X for the logic outputs H and H_X by this drive control, the logic tree disconnection controlling unit 133, and the switches 134 and 135 which are controlled by the logic tree disconnection controlling unit 133 and short-circuit the node TH and node TF2 for the logic input and the node TH_X and node TF_X for the logic input, wherein, in the sensing latch unit 130, in the idle stage where the synchronization signal (CLK) has the logic "0", the sense amplifier 131 does not have a driving capability, the switches 132, 134, and 135 become ON, and the state where all of the internal nodes TH and TH_X of the sensing latch and the logic tree nodes TF and TF_X are short-circuited is exhibited, wherein, in the drive stage immediately after the transition of the synchronization signal (CLK) from the logic "0" to the logic "1", the sense amplifier 131 has a driving capability, the state where the switches 134 and 135 are ON as they are, the switch 132 becomes OFF, the nodes TH and TF are short-circuited, the nodes TH_X and TF_X are short-circuited, and the two are released is exhibited, and wherein in the period (final determination stage) during which the synchronization signal (CLK) after the final determination of the logic value has the logic "1", the sense amplifier 131 has a driving capability, the state where the switches 132, 134, and 135 become OFF, and all of the nodes TH, TH_X, TF, and TF_X are cut off is exhibited, the following effects are exhibited.

Namely, first, the glitches occurring in the static CMOS logic circuit are eliminated to reduce the power consumption and high speed operation can be realized by making good use of the characteristics of the dynamic logic circuit.

Second, the mechanism for generating a pulse having a short width such as a PDN-F/F logic circuit is eliminated and design by automatic placement and routing by CAD can be facilitated.

Third, the dependency of the operating speed on the height of the logic tree and the gate width of the MOS in the logic tree is made smaller than that of the SA-F/F logic circuit, and high speed operation can be realized even in the case of realizing a complex logical function having many input signals.

Fourth, an operation resistant to variations of the circuit constant and the coupling noise and stabler than that of a DCSL circuit can be realized.

Second Embodiment

Figure 25:
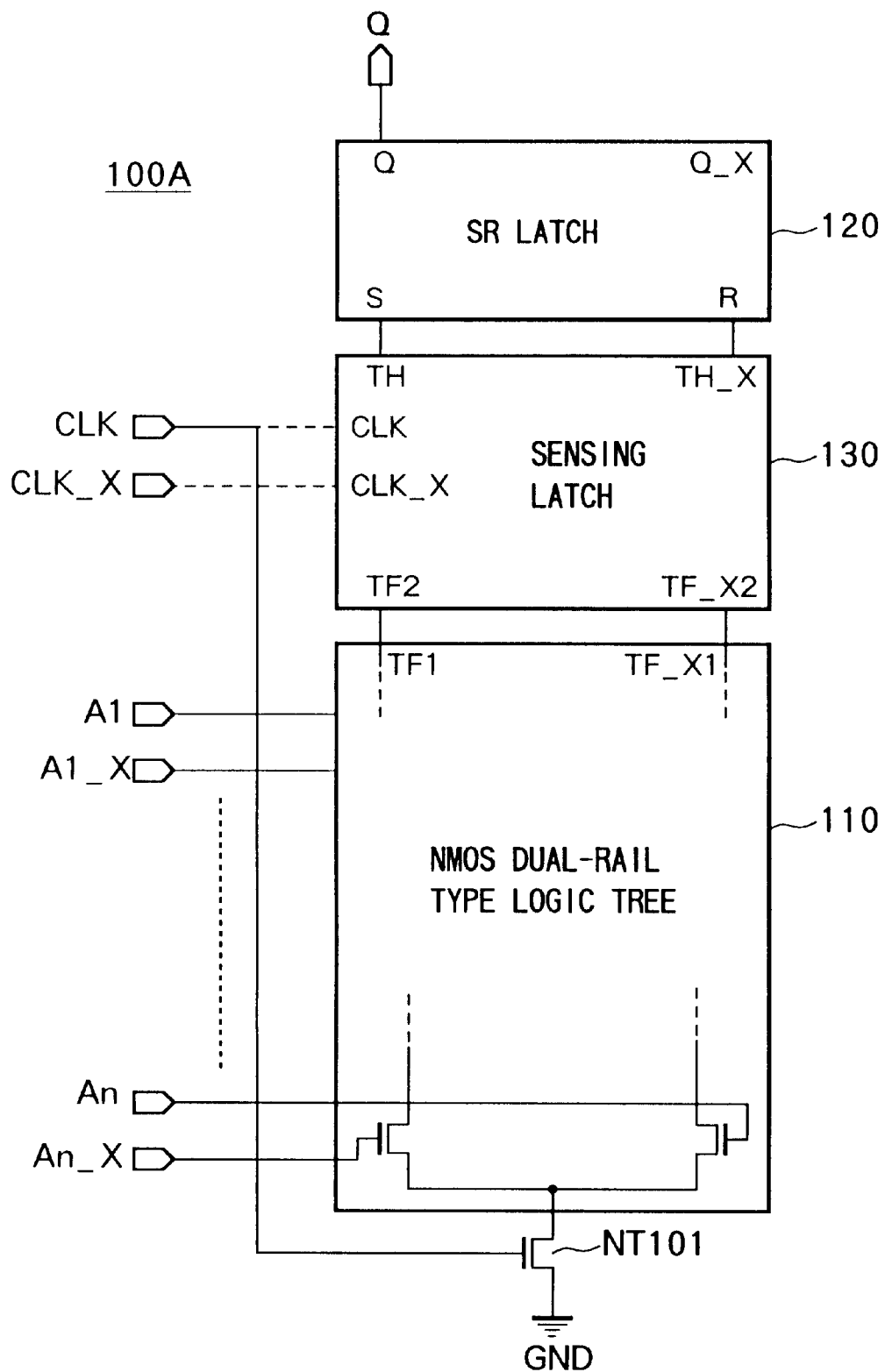
FIG. 25 is a block diagram of a second embodiment of the logic circuit according to the present invention.
Figure 26:
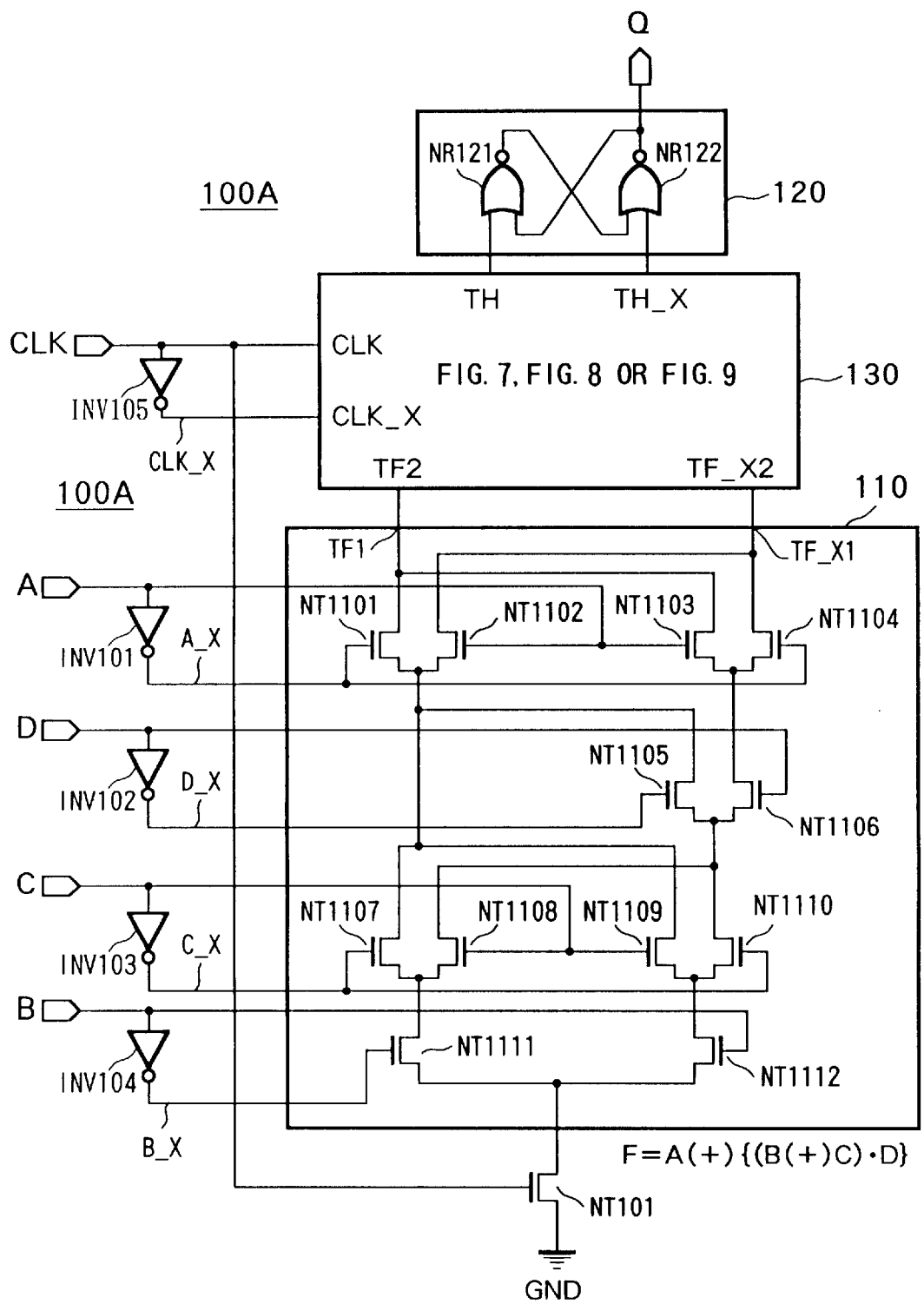
FIG. 26 is a circuit diagram of an example of concrete configurations of the NMOS dual-rail type logic tree portion and the SR latch unit in the logic circuit of FIG. 25.

FIG. 25 is a block diagram of a second embodiment of a logic circuit according to the present invention, while FIG. 26 is a circuit diagram of an example of the concrete configuration of an NMOS dual-rail type logic tree portion and an SR latch unit in the logic circuit of FIG. 25.

The difference of the second embodiment from the first embodiment resides in that an NMOS transistor NT101 controlling the grounding of the NMOS dual-rail type logic tree 110 in synchronization with the synchronization signal (clock signal) is added.

This NMOS transistor NT101 becomes cut off in the initial state of the operation of the flip-flop.

Note that the concrete configurations of the NMOS dual-rail type logic tree and the SR latch unit shown in FIG. 26 are similar to those of the circuit of FIG. 11, therefore explanations of details thereof are omitted here.

According to the second embodiment, the NMOS transistor NT101 becomes ON when the clock signal (synchronization signal) CLK has the logic "1".

For this reason, in the drive stage where the clock signal (synchronization signal) CLK becomes the logic "1", i.e., in the final determination stage, the operation thereof is the same as that of the view of the configuration based on FIG. 10, that is, FIG. 11.

The difference resides in the operation of the idle stage where the clock signal (synchronization signal) CLK becomes the logic "0".

When the clock signal (synchronization signal) CLK has the logic "0", no matter what the combination of the logic values of the input signals A, B, C, and D, there is no path reaching the ground in either of the logic tree nodes TF or TF_X.

In the first embodiment, the explanation was made of the case where the potentials of the nodes TH, TH_X, TF, and TF_X in the idle stage were fixed to the potential of the complete logic "0" by a logic tree having a path reaching the ground. However, such a state is not exhibited in the case of the configurations of FIG. 25 and FIG. 26.

Even if the logic tree 110 does not have a path reaching the ground, it is possible for the sensing latch unit 130 itself to have the function of pulling down the potentials of the nodes TH and TH_X to the vicinity of the threshold value of the NMOS transistor and turn ON the NMOS transistor NT1304 serving as the switch 134 and the NMOS transistor NT1305 serving as the switch 135 connecting the logic tree 110 and the sense amplifier 131.

When these switches 134 and 135 become ON and the nodes TH and TH_X are short-circuited to the nodes TF and TF_X, charges existing on the nodes TH and TH_X and setting the potentials thereof in the vicinity of the threshold value of the NMOS transistor are balanced in distribution with respect to the capacity component in the logic tree.

As a result of the balanced distribution, the potentials of the nodes TH, TH_X, TF, and TF_X become values a little smaller than the threshold value of the NMOS transistor, but a little larger than the potential of the complete logic "0".

Namely, in the cases of the configurations of FIG. 25 and FIG. 26, potentials of the complete logic "0" are not output from the nodes TH and TH_X in the idle stage (idle phase).

Potentials a little smaller than the threshold value of the NMOS transistor, but a little larger than the potential of the complete logic "0" are output. These potentials have values low enough to represent the logic "0", therefore there is no contradiction in the operating principle.

The advantage of the second embodiment over the first embodiment resides in the reduction of the power consumption and the increase of the speed.

In the first embodiment, in the idle stage, the charges in the sensing latch unit 130 and the logic tree 110 were all destroyed.

Contrary to this, in the second embodiment, part of the charge supplied in the drive stage is preserved and reused in the next drive stage. For this reason, the power consumption can be reduced more.

Further, in the drive stage, the potentials of the nodes TH and TH_X rise starting from the potential near the threshold value of the NMOS transistor, therefore the time required for the final determination of the logic becomes shorter than that of the configuration of FIG. 10 in which the potential starts to rise from the potential of the complete logic "0".

Third Embodiment

Figure 27:
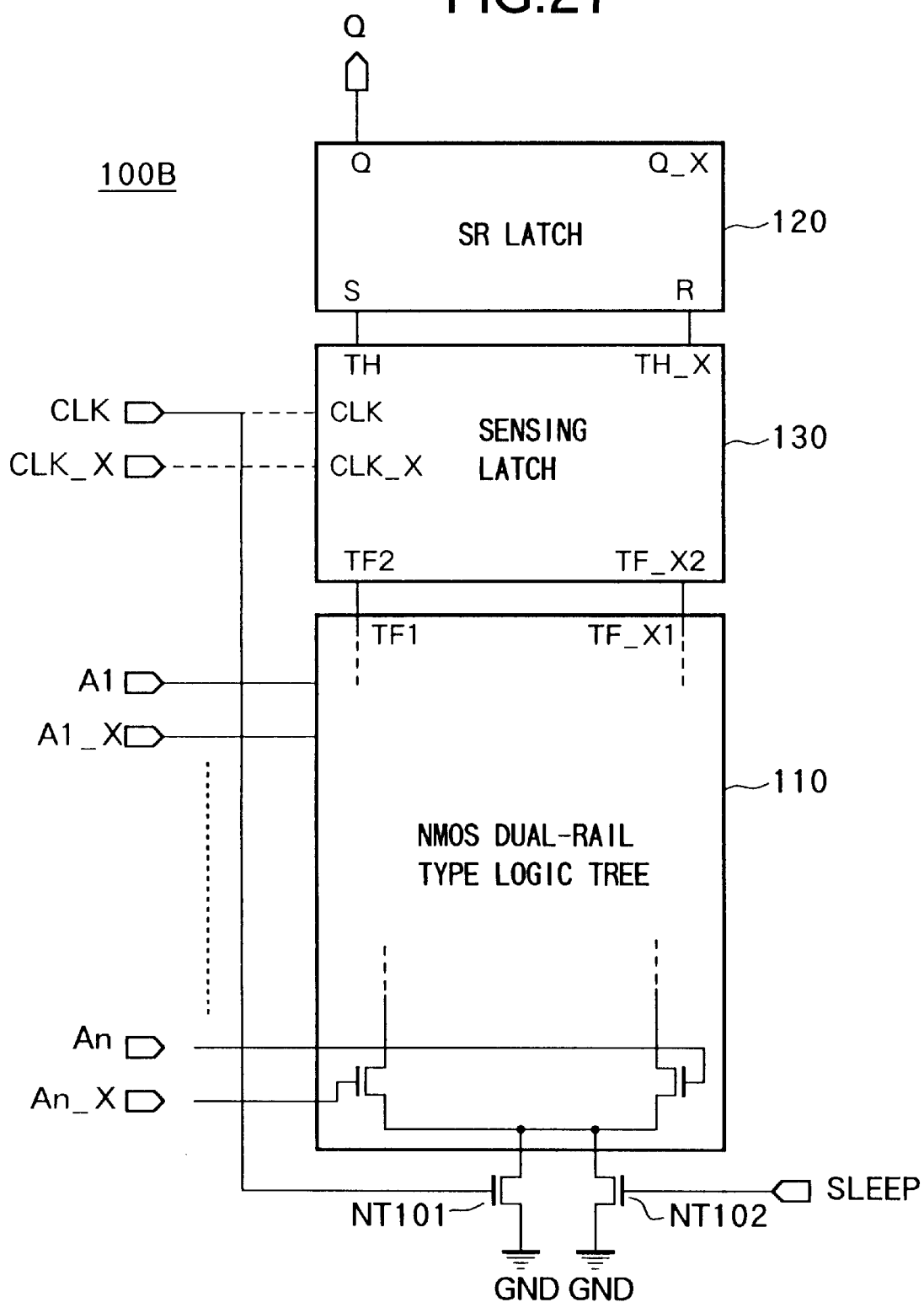
FIG. 27 is a block diagram of a third embodiment of the logic circuit according to the present invention.
Figure 28:
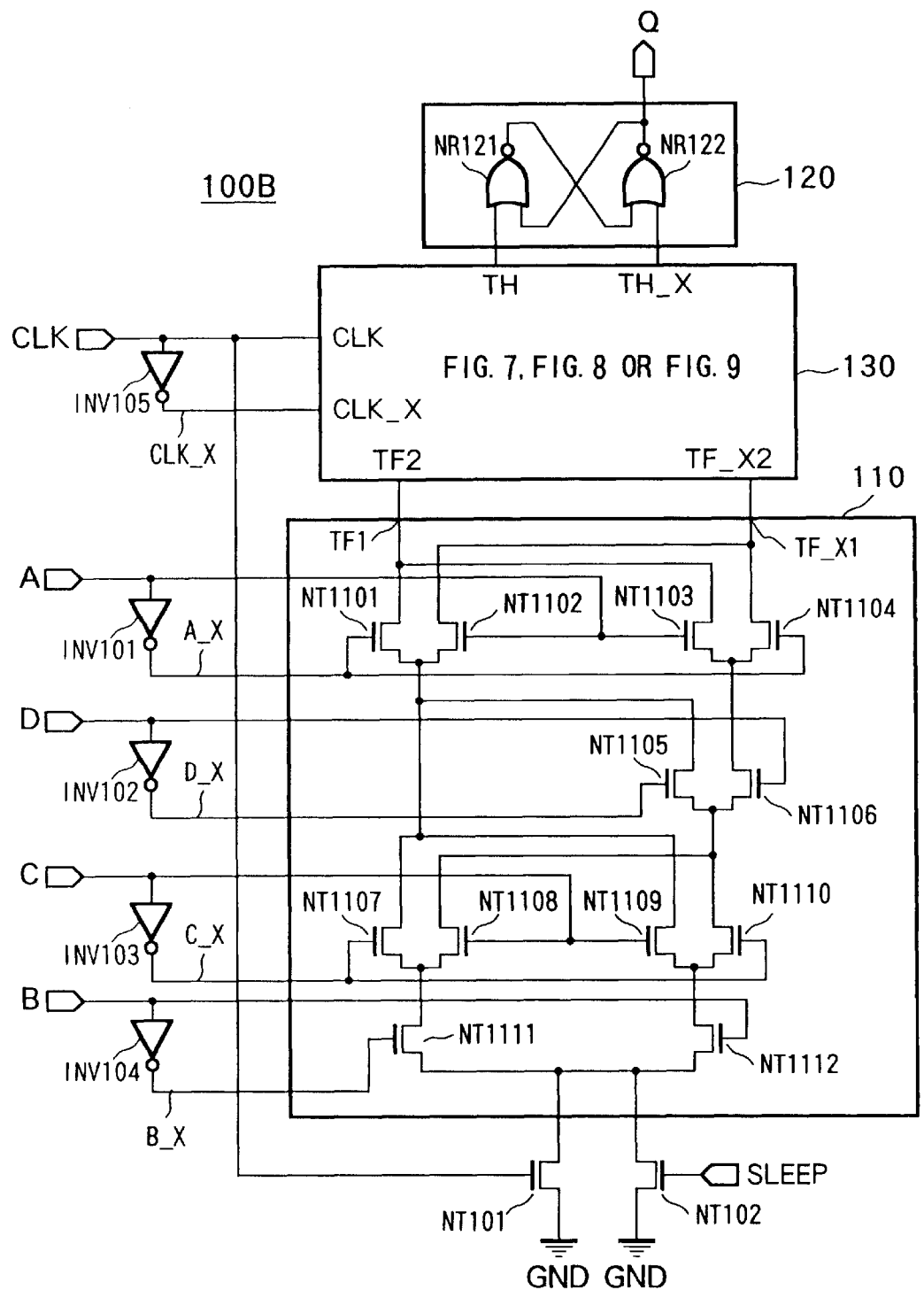
FIG. 28 is a circuit diagram of an example of concrete configurations of the NMOS dual-rail type logic tree portion and the SR latch unit in the logic circuit of FIG. 27.

FIG. 27 is a block diagram of a third embodiment of a logic circuit according to the present invention, while FIG. 28 is a circuit diagram of an example of the concrete configurations of the NMOS dual-rail type logic tree portion and the SR latch unit in the logic circuit of FIG. 27.

The difference of the third embodiment from the second embodiment resides in that an NMOS transistor NT102 for controlling the grounding of the NMOS dual-rail type logic tree in synchronization with the control signal SLEEP different from the clock signal (synchronization signal) is connected in parallel to the NMOS transistor NT101.

Note that the concrete configurations of the NMOS dual-rail type logic tree portion and the SR latch unit shown in FIG. 28 are similar to those of the circuit of FIG. 11, therefore the explanation of the details thereof are omitted here.

According to the third embodiment, the NMOS transistor NT102 becomes cut off when the control signal SLEEP has the logic "0". The operation at this time is the same as that of FIG. 26 according to the second embodiment.

On the other hand, during the period where the control signal SLEEP becomes the logic "1", regardless of the clock signal (synchronization signal) CLK, the path to the ground is secured in the logic tree 110.

That is, at this time, the charges are not preserved or reused.

In the idle stage where the control signal SLEEP is finally set to the logic "1", the potentials of the nodes TH and TH_X become the complete logic "0".

The necessity of making the control signal SLEEP the logic "1" occurs when the clock signal (synchronization signal) CLK stops at the logic "0".

At present, in order to reduce the power consumption, the method of stopping the supply of the clock to the circuit block which does not have to be operated becomes general.

The stopped clock becomes constant at the logic "0" or the logic "1". Which value it becomes constant at differs according to the design, but once designed, the clock always stops at the same logic value.

The problem in the configurations of FIG. 25 and FIG. 26 according to the second embodiment lies in the case where the clock signal (synchronization signal) CLK stops at the logic "0".

At this time, due to the idle stage, the nodes TH and TH_X become potentials a little lower than the threshold value of the NMOS transistor.

The SR latch unit 120 receives this as the logic "0" and operates as the hold mode. There is no logical problem.

However, the magnitude of the leakage current at the time of the cut off becomes a problem.

The NMOSs having the nodes TH and TH_X at their gate terminals in the SR latch unit 120 are in the cut off state at this time. In general, the MOS passes a current though the amount is extremely small even in the cut-off state. This will be referred to as the leakage current.

The magnitude of the leakage current is determined by an exponential function of the gate terminal potential. Accordingly, in the magnitude of the leakage current between the case where the potentials of the nodes TH and TH_X are complete 0V and the case where they have values near the threshold value of the NMOS transistor, there is a difference of about one order to two orders though the absolute value thereof is small.

For this reason, when the idle stage continues for a long time due to the stopping of the clock, the power consumption can be made smaller in the case where the charges for reuse are discarded and the potentials of the nodes TH and TH_X are dropped to the potential of the complete logic "0".

The configurations of FIG. 27 and FIG. 28 according to the third embodiment are just for realizing this function.

As described above, when the clock signal (synchronization signal) CLK is stopped at the logic "0", the leakage current becomes large in the configuration of FIG. 25 according to the second embodiment.

Contrary to this, in the configuration of FIG. 27 according to the third embodiment, by setting the control signal SLEEP at the logic "1", the potentials of the nodes TH and TH_X in the idle stage can be dropped to complete logic "0". For this reason, the leakage current can be made small.

FIG. 29 is a view of the potential waveforms of the internal nodes TH and TH_X at the time of the SLEEP mode operation and the simulation results of the leakage current value.

In FIG. 29, the abscissa represents the time, and the ordinate represents the voltage.

In the present simulation, use was made of the circuit of the configuration of FIG. 27, the pulse of the clock signal (synchronization signal) CLK was given, the operation for final determination of the logic was carried out, and the clock signal CLK was stopped at the logic "0".

At this time, the control signal SLEEP is still at the logic "0". Accordingly, the nodes TH and TH_X do not have potentials of the complete logic "0".

The leakage current during the illustrated period is 557.3 nA.

Then, when the control signal SLEEP is set at the logic "1", the potentials of the nodes TH and TH_X rapidly fall to 0V. The leakage current during the illustrated period is 24.6 nA.

In this way, the effect of the SLEEP control is large.

Summarizing the effects of the invention as explained above, according to the present invention, glitches occurring in the static CMOS logic circuit are eliminated to reduce the power consumption and high speed operation is realized by making good use of the characteristics of the dynamic logic circuit.

Further, according to the present invention, the mechanism for generating a pulse having a short width such as a PDN-F/F logic circuit is eliminated and design by automatic placement and routing by CAD can be facilitated.

Further, according to the present invention, the dependency of the operating speed on the height of the logic tree and the gate width of the MOS in the logic tree is made smaller than that of the SA-F/F logic circuit, and high speed operation can be realized even in the case of realizing a complex logical function having many input signals.

Further, according to the present invention, an operation resistant to variations of the circuit constant and coupling noise and stabler than that of a DCSL circuit can be realized.

Further, according to the present invention, by providing the SLEEP mode use switch and forcibly fixing the internal nodes in the logic tree at the potential of the complete logic "0" when the synchronization signal has the logic "0" and the ground path is continuously established in both rails of the logic tree, the leakage current can be reduced.

While the invention has been described with reference to specific embodiment chosen for purpose of illustration, it should be apparent that numerous modifications could be made thereto by those skilled in the art without departing from the basic concept and scope of the invention.

What is claimed is:

1. A logic circuit for outputting logical function evaluation results in synchronization with a synchronization signal, comprising:
   a dual-rail type logic tree forming a path through which only one rail reaches a reference potential according to an input signal and realizing a desired logical function;
   a sensing latch unit having
      a first logic input node and a second logic input node receiving a first logic output and a second logic output of the dual-rail type logic tree,
      a first logic output node,
      a second logic output node,
      a sense amplifier which operates upon receipt of the synchronization signal indicating drive and finally sets the logic potentials of the first logic output and the second logic output at different first level and second level according to a difference of conduction resistances possessed by the first logic input and the second logic input which are input to the first logic input node and the second logic input node,
      a first switching means for short-circuiting the first logic output node and the second logic output node when receiving a synchronization signal indicating an idle stage,
      a second switching means for electrically connecting or disconnecting the first logic input node and the first logic output node according to the potential of a control terminal,
      a third switching means for electrically connecting or disconnecting the second logic input node and the second logic output node according to the potential of the control terminal, and
      a logic tree disconnection controlling means having
         a first setting means for setting the potential of the control node connected to the control terminals of the second switching means and the third switching means to a potential that at least enables the connection between two terminals to which the second and third switching means are connected at a stage including the idle stage where the logic has not been finally determined in the sense amplifier, and
         a second setting means for setting the potential of the control node at a potential that at least enables the disconnection between two terminals to which the second and third switching means are connected according to the first logic output node or the second logic output node at a stage where the logic is finally determined in the sense amplifier; and
   a set and reset latch unit for receiving the first logic output of the sensing latch unit at its set terminal, receiving the second logic output of the sensing latch unit at its reset terminal, and holding the logic output of the sensing latch unit for a period of one cycle of the synchronization signal.

2. A logic circuit as set forth in claim 1, wherein the sense amplifier of the sensing latch unit has a first inverter and a second inverter, the output of the first inverter and the input of the second inverter are connected, the connection point thereof is connected to the first logic output node, the input of the first inverter and the output of the second inverter are connected, the connection point thereof is connected to the second logic output node, and
   wherein the first switching means is connected between the input of the first inverter and the input of the second inverter.

3. A logic circuit as set forth in claim 2, wherein the first setting means of the logic tree disconnection controlling means includes a fourth switching means which is connected between a first power source potential capable of placing the second switching means and the third switching means into a connection state and the control node and becomes conductive upon receipt of the synchronization signal indicating the idle stage at its control terminal, and
   wherein the second setting means of the logic tree disconnection controlling means includes a fifth switching means which is connected between a second power source potential capable of placing the second switching means and the third switching means into a disconnection state and the control node, has a control terminal connected to the first logic output node, and becomes conductive when the first logic output potential is at a first level and a sixth switching means which is connected between the second power source potential and the control node, has a control terminal connected to the second logic output node, and becomes conductive when the second logic output potential is at the first level.

4. A logic circuit as set forth in claim 2, wherein the first setting means of the logic tree disconnection controlling means includes a fourth switching means which is connected between the first power source potential capable of placing the second switching means and the third switching means into a connection state and the control node and becomes conductive upon receipt of a synchronization signal indicating an idle stage at its control terminal, and
   wherein the second setting means of the logic tree disconnection controlling means includes a fifth switching means which is connected between an intermediate node and the control node, has a control terminal connected to the first logic output node, and becomes conductive when the first logic output potential is at the first level, a sixth switching means which is connected between the intermediate node and the control node, has a control terminal connected to the second logic output node, and becomes conductive when the second logic output potential is at the first level, and a seventh switching means which is connected between the second power source potential capable of placing the second switching means and the third switching means into the disconnection state and the intermediate node, is held in a non-conductive state when the fourth switching means is conductive, and becomes conductive when the fourth switching means is held in the non-conductive state.

5. A logic circuit as set forth in claim 2, wherein the first setting means of the logic tree disconnection controlling means includes a fourth switching means and a fifth switching means which are connected in series between a first power source potential capable of placing the second switching means and the third switching means into the connection state and a control node and becomes conductive upon receipt of the potential of the first logic output node and the potential of the second logic output node at their control terminals in the idle stage, and wherein the second setting means of the logic tree disconnection controlling means includes a sixth switching means which is connected between a second power source potential capable of placing the second switching means and the third switching means into the disconnection state and the control node, has a control terminal connected to the first logic output node, and becomes conductive when the first logic output potential is at the first level, and a seventh switching means which is connected between the second power source potential and the control node, has a control terminal connected to the second logic output node, and becomes conductive when the second logic output potential is at the first level.

6. A logic circuit as set forth in claim 1, wherein the first setting means of the logic tree disconnection controlling means includes a fourth switching means which is connected between a first power source potential capable of placing the second switching means and the third switching means into a connection state and the control node and becomes conductive upon receipt of the synchronization signal indicating the idle stage at its control terminal, and wherein the second setting means of the logic tree disconnection controlling means includes a fifth switching means which is connected between a second power source potential capable of placing the second switching means and the third switching means into a disconnection state and the control node, has a control terminal connected to the first logic output node, and becomes conductive when the first logic output potential is at a first level and a sixth switching means which is connected between the second power source potential and the control node, has a control terminal connected to the second logic output node, and becomes conductive when the second logic output potential is at the first level.

7. A logic circuit as set forth in claim 1, wherein the first setting means of the logic tree disconnection controlling means includes a fourth switching means which is connected between the first power source potential capable of placing the second switching means and the third switching means into a connection state and the control node and becomes conductive upon receipt of a synchronization signal indicating an idle stage at its control terminal, and wherein the second setting means of the logic tree disconnection controlling means includes a fifth switching means which is connected between an intermediate node and the control node, has a control terminal connected to the first logic output node, and becomes conductive when the first logic output potential is at the first level, a sixth switching means which is connected between the intermediate node and the control node, has a control terminal connected to the second logic output node, and becomes conductive when the second logic output potential is at the first level, and a seventh switching means which is connected between the second power source potential capable of placing the second switching means and the third switching means into the disconnection state and the intermediate node, is held in a non-conductive state when the fourth switching means is conductive, and becomes conductive when the fourth switching means is held in the non-conductive state.

8. A logic circuit as set forth in claim 1, wherein the first setting means of the logic tree disconnection controlling means includes a fourth switching means and a fifth switching means which are connected in series between a first power source potential capable of placing the second switching means and the third switching means into the connection state and a control node and becomes conductive upon receipt of the potential of the first logic output node and the potential of the second logic output node at their control terminals in the idle stage, and wherein the second setting means of the logic tree disconnection controlling means includes a sixth switching means which is connected between a second power source potential capable of placing the second switching means and the third switching means into the disconnection state and the control node, has a control terminal connected to the first logic output node, and becomes conductive when the first logic output potential is at the first level, and a seventh switching means which is connected between the second power source potential and the control node, has a control terminal connected to the second logic output node, and becomes conductive when the second logic output potential is at the first level.

9. A logic circuit for outputting logical function evaluation results in synchronization with a synchronization signal, comprising:

a dual-rail type logic tree for forming a path through which only one rail reaches the reference potential according to the input signal and realizing a desired logical function;

a sensing latch unit having a first logic input node and a second logic input node receiving a first logic output and a second logic output of the dual-rail type logic tree, a first logic output node, a second logic output node, a sense amplifier which operates upon receipt of a synchronization signal indicating drive and finally sets logic potentials of the first logic output and the second logic output at a different first level and second level according to the difference of conduction resistances possessed by the first logic input and the second logic input which are input to the first logic input node and the second logic input node, a first switching means for short-circuiting the first logic output node and the second logic output node when receiving a synchronization signal indicating an idle stage, a second switching means for electrically connecting or disconnecting the first logic input node and the first logic output node according to the potential of the control terminal, a third switching means for electrically connecting or disconnecting the second logic input node and the second logic output node according to the potential of the control terminal, and a logic tree disconnection controlling means having a first setting means for setting the potential of the control node connected to the control terminals of the second switching means and the third switching means to a potential that at least enables the connection between two terminals to which the second and third switching means are connected at a stage including the idle stage where the logic has not been finally determined in the sense amplifier, and a second setting means for setting the potential of the control node to a potential that at least enables the disconnection between the two terminals to which the second and third switching means are connected according to the first logic output node or the second logic output node at a stage where the logic is finally determined in the sense amplifier;

a set and reset latch unit for receiving a first logic output of the sensing latch unit at its set terminal, receiving a second logic output of the sensing latch unit at its reset terminal, and holding the logic output of the sensing latch unit for a period of one cycle of the synchronization signal; and a fourth switching means which electrically disconnects the path reaching the reference potential of the dual-rail type logic tree and the reference potential in the idle stage and connects them at times other than the idle stage.

10. A logic circuit as set forth in claim 9, wherein the sense amplifier of the sensing latch unit has a first inverter and a second inverter, the output of the first inverter and the input of the second inverter are connected, the connection point thereof is connected to the first logic output node, the input of the first inverter and the output of the second inverter are connected, the connection point thereof is connected to the second logic output node, and wherein the first switching means is connected between the input of the first inverter and the input of the second inverter.

11. A logic circuit as set forth in claim 10, wherein the first setting means of the logic tree disconnection controlling means includes a fifth switching means which is connected between the first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a sixth switching means which is connected between a second power source potential capable of placing the second switching means and the third switching means into a disconnection state and the control node, has a control terminal connected to the first logic output node, and becomes conductive when the first logic output potential is at the first level, and a seventh switching means which is connected between the second power source potential and the control node, has a control terminal connected to the second logic output node, and becomes conductive when the second logic output potential is at the first level.

12. A logic circuit as set forth in claim 10, wherein the first setting means of the logic tree disconnection controlling means includes a fifth switching means which is connected between a first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a sixth switching means which is connected between an intermediate node and the control node, has a control terminal connected to the first logic output node, and becomes conductive when the first logic output potential is at the first level, a seventh switching means which is connected between the intermediate node and the control node, has a control terminal connected to the second logic output node, and becomes conductive when the second logic output potential is at the first level, and an eighth switching means which is connected between a second power source potential capable of placing the second switching means and the third switching means into a disconnection state and the intermediate node, is held in the non-conductive state when the fifth switching means is conductive, and becomes conductive when the fifth switching means is held in the non-conductive state.

13. A logic circuit as set forth in claim 10, wherein the first setting means of the logic tree disconnection controlling means includes a fifth switching means and a sixth switching means which are connected in series between a first power source potential capable of placing the second switching means and the third switching means into the connection state and the control node and become conductive upon receipt of the potential of the first logic output node and the potential of the second logic output node at their control terminals in the idle stage, and wherein the second setting means of the logic tree disconnection controlling means includes a seventh switching means which is connected between a second power source potential capable of placing the second switching means and the third switching means into the disconnection state and the control node, has a control terminal connected to the first logic output node, and becomes conductive when the first logic output potential is at the first level, and an eighth switching means which is connected between the second power source potential and the control node, has a control terminal connected to the second logic output node, and becomes conductive when the second logic output potential is at the first level.

14. A logic circuit as set forth in claim 9, wherein the first setting means of the logic tree. disconnection controlling means includes a fifth switching means which is connected between the first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a sixth switching means which is connected between a second power source potential capable of placing the second switching means and the third switching means into a disconnection state and the control node, has a control terminal connected to the first logic output node, and becomes conductive when the first logic output potential is at the first level, and a seventh switching means which is connected between the second power source potential and the control node, has a control terminal connected to the second logic output node, and becomes conductive when the second logic output potential is at the first level.

15. A logic circuit as set forth in claim 9, wherein the first setting means of the logic tree disconnection controlling means includes a fifth switching means which is connected between a first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a sixth switching means which is connected between an intermediate node and the control node, has a control terminal connected to the first logic output node, and becomes conductive when the first logic output potential is at the first level, a seventh switching means which is connected between-the intermediate node and the control node, has a control terminal connected to the second logic output node, and becomes conductive when the second logic output potential is at the first level, and an eighth switching means which is connected between a second power source potential capable of placing the second switching means and the third switching means into a disconnection state and the intermediate node, is held in the non-conductive state when the fifth switching means is conductive, and becomes conductive when the fifth switching means is held in the non-conductive state.

16. A logic circuit as set forth in claim 9, wherein the first setting means of the logic tree disconnection controlling means includes a fifth switching means and a sixth switching means which are connected in series between a first power source potential capable of placing the second switching means and the third switching means into the connection state and the control node and become conductive upon receipt of the potential of the first logic output node and the potential of the second logic output node at their control terminals in the idle stage, and wherein the second setting means of the logic tree disconnection controlling means includes a seventh switching means which is connected between a second power source potential capable of placing the second switching means and the third switching means into the disconnection state and the control node, has a control terminal connected to the first logic output node, and becomes conductive when the first logic output potential is at the first level, and an eighth switching means which is connected between the second power source potential and the control node, has a control terminal connected to the second logic output node, and becomes conductive when the second logic output potential is at the first level.

17. A logic circuit for outputting logical function evaluation results in synchronization with a synchronization signal, comprising:

a dual-rail type logic tree forming a path through which only one rail reaches the reference potential according to an input signal and realizing the desired logical function;

a sensing latch unit having a first logic input node and a second logic input node receiving a first logic output and a second logic output of the dual-rail type logic tree, a first logic output node, a second logic output node, a sense amplifier which operates upon receipt of a synchronization signal indicating drive and finally determines the logic potentials of the first logic output and the second logic output at a different first level and second level according to the difference of conduction resistances possessed by the first logic input and the second logic input which are input to the first logic input node and the second logic input node, a first switching means for short-circuiting the first logic output node and the second logic output node when receiving a synchronization signal indicating an idle stage, a second switching means for electrically connecting or disconnecting the first logic input node and the first logic output node according to the potential of the control terminal, a third switching means for electrically connecting or disconnecting the second logic input node and the second logic output node according to the potential of the control terminal, and a logic tree disconnection controlling means having a first setting means for setting the potential of the control node connected to the control terminals of the second switching means and the third switching means to a potential that at least enables the connection between two terminals to which the second and third switching means are connected at a stage including the idle stage where the logic has not been finally determined in the sense amplifier, and a second setting means for setting the potential of the control node to a potential that at least enables the disconnection between two terminals to which the second and third switching means are connected according to the potential of the first logic output node or the second logic output node at a stage where the logic is finally determined in the sense amplifier;

a set and reset latch unit for receiving a first logic output of the sensing latch unit at its set terminal, receiving a second logic output of the sensing latch unit at its reset terminal, and holding the logic output of the sensing latch unit for a period of one cycle of the synchronization signal;

a fourth switching means which electrically disconnects the path reaching the reference potential of the dual-rail type logic tree and the reference potential in the idle stage and connects them at times other than the idle stage; and a fifth switching means which forcibly connects the path reaching the reference potential of the dual-rail type logic tree and the reference potential for a period during which the path reaching the reference potential of the dual-rail type logic tree and the reference potential are disconnected by the fourth switching means in the idle stage and when the synchronization signal is stopped while indicating the idle stage as it is.

18. A logic circuit as set forth in claim 17, wherein the sense amplifier of the sensing latch unit has a first inverter and a second inverter, the output of the first inverter and the input of the second inverter are connected, the connection point thereof is connected to the first logic output node, the input of the first inverter and the output of the second inverter are connected, the connection point thereof is connected to the second logic output node, and wherein the first switching means is connected between the input of the first inverter and the input of the second inverter.

19. A logic circuit as set forth in claim 18, wherein the first setting means of the logic tree disconnection controlling means includes a sixth switching means which is connected between a first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a seventh switching means which is connected between a second power source potential capable of placing the second switching means and the third switching means into the disconnection state and the control node, has a control terminal connected to the first logic output node, and becomes conductive when the first logic output potential is at the first level, and an eighth switching means which is connected between the second power source potential and the control node, has a control terminal connected to the second logic output node, and becomes conductive when the second logic output potential is at the first level.

20. A logic circuit as set forth in claim 18, wherein the first setting means of the logic tree disconnection controlling means includes a sixth switching means which is connected between a first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a seventh switching means which is connected between an intermediate node and the control node, has a control terminal connected to the first logic output node, and becomes conductive when the first logic output potential is at the first level, an eighth switching means which is connected between the intermediate node and the control node, has a control terminal connected to the second logic output node, and becomes conductive when the second logic output potential is at the first level, and a ninth switching means which is connected between a second power source potential capable of placing the second switching means and the third switching means into the disconnection state and the intermediate node, is held in the non-conductive state when the sixth switching means is conductive, and becomes conductive when the sixth switching means is held in the non-conductive state.

21. A logic circuit as set forth in claim 18, wherein the first setting means of the logic tree disconnection controlling means includes a sixth switching means and a seventh switching means which are connected in series between a first power source potential capable of placing the second switching means and the third switching means into the connection state and the control node and become conductive upon receipt of the potential of the first logic output node and the potential of the second logic output node at their control terminals in the idle stage, and wherein the second setting means of the logic tree disconnection controlling means includes an eighth switching means which is connected between a second power source potential capable of placing the second switching means and the third switching means into the disconnection state and the control node, has a control terminal connected to the first logic output node, and becomes conductive when the first logic output potential is at the first level, and a ninth switching means which is connected between the second power source potential and the control node, has a control terminal connected to the second logic output node, and becomes conductive when the second logic output potential is at the first level.

22. A logic circuit as set forth in claim 17, wherein the first setting means of the logic tree disconnection controlling means includes a sixth switching means which is connected between a first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a seventh switching means which is connected between a second power source potential capable of placing the second switching means and the third switching means into the disconnection state and the control node, has a control terminal connected to the first logic output node, and becomes conductive when the first logic output potential is at the first level, and an eighth switching means which is connected between the second power source potential and the control node, has a control terminal connected to the second logic output node, and becomes conductive when the second logic output potential is at the first level.

23. A logic circuit as set forth in claim 17, wherein the first setting means of the logic tree disconnection controlling means includes a sixth switching means which is connected between a first power source potential capable of placing the second switching means and the third switching means into the connection state and the control node and becomes conductive upon receipt of a synchronization signal indicating the idle stage at its control terminal, and wherein the second setting means of the logic tree disconnection controlling means includes a seventh switching means which is connected between an intermediate node and the control node, has a control terminal connected to the first logic output node, and becomes conductive when the first logic output potential is at the first level, an eighth switching means which is connected between the intermediate node and the control node, has a control terminal connected to the second logic output node, and becomes conductive when the second logic output potential is at the first level, and a ninth switching means which is connected between a second power source potential capable of placing the second switching means and the third switching means into the disconnection state and the intermediate node, is held in the non-conductive state when the sixth switching means is conductive, and becomes conductive when the sixth switching means is held in the non-conductive state.

24. A logic circuit as set forth in claim 17, wherein the first setting means of the logic tree disconnection controlling means includes a sixth switching means and a seventh switching means which are connected in series between a first power source potential capable of placing the second switching means and the third switching means into the connection state and the control node and become conductive upon receipt of the potential of the first logic output node and the potential of the second logic output node at their control terminals in the idle stage, and wherein the second setting means of the logic tree disconnection controlling means includes an eighth switching means which is connected between a second power source potential capable of placing the second switching means and the third switching means into the disconnection state and the control node, has a control terminal connected to the first logic output node, and becomes conductive when the first logic output potential is at the first level, and a ninth switching means which is connected between the second power source potential and the control node, has a control terminal connected to the second logic output node, and becomes conductive when the second logic output potential is at the first level.

\* \* \* \* \*

UNITED STATES PATENT AND TRADEMARK OFFICE
CERTIFICATE OF CORRECTION

PATENT NO.    : 6,374,393 B1
DATED         : April 16, 2002
INVENTOR(S)   : Koji Hirairi It is certified that error appears in the above-identified patent and that said Letters Patent is hereby corrected as shown below:

<u>Column 40,</u>
Line 55, replace "logic tree." with -- logic tree --.

<u>Column 41,</u>
Line 24, replace "between-the" with -- between the --

Signed and Sealed this

Seventh Day of October, 2003

JAMES E. ROGAN
*Director of the United States Patent and Trademark Office*